(12) United States Patent
Hosaka et al.

(10) Patent No.: US 12,713,767 B2
(45) Date of Patent: Aug. 18, 2026

(54) SEMICONDUCTOR DEVICE

(71) Applicant: Semiconductor Energy Laboratory Co., Ltd., Kanagawa-ken (JP)

(72) Inventors: Yasuharu Hosaka, Tochigi (JP); Masami Jintyou, Shimotsuga (JP); Takahiro Iguchi, Nikko (JP); Chieko Misawa, Utsunomiya (JP); Ami Sato, Tochigi (JP); Masayoshi Dobashi, Shimotsuga (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 549 days.

(21) Appl. No.: 18/127,198

(22) Filed: Mar. 28, 2023

(65) Prior Publication Data

US 2023/0320135 A1 Oct. 5, 2023

(30) Foreign Application Priority Data

Mar. 31, 2022 (JP) ................................ 2022-057853

(51) Int. Cl.
*H10K 59/121* (2023.01)
*H10K 59/12* (2023.01)

(52) U.S. Cl.
CPC ..... *H10K 59/1213* (2023.02); *H10K 59/1201* (2023.02)

(58) Field of Classification Search
CPC .... H10D 86/441; H10D 86/423; H10D 86/60; H10D 86/021; H10D 86/471;
(Continued)

(56) References Cited

U.S. PATENT DOCUMENTS 9,059,029 B2 6/2015 Arai
9,312,257 B2 4/2016 Yamazaki et al.
(Continued)

FOREIGN PATENT DOCUMENTS

WO WO 2018/087625 A1 5/2018

OTHER PUBLICATIONS

Fujiwara.H et al., “Surrounding Gate Vertical-Channel FET with Gate Length of 40 nm Using BEOL Compatible High-Thermal-Tolerance In—Al—Zn Oxide Channel”, 2020 Symposium on VLSI Technology : Digest of Technical Papers, Jun. 16, 2020, pp. 1-2.
(Continued)

*Primary Examiner* — Jacob Y Choi
*Assistant Examiner* — Grace Cha
(74) *Attorney, Agent, or Firm* — Husch Blackwell LLP

(57) ABSTRACT

Provided is a semiconductor device having a high degree of integration, which includes first and second transistors and a first insulating layer. The first transistor includes a first semiconductor layer, a second insulating layer, and first to third conductive layers. The second transistor includes a second semiconductor layer, a third insulating layer, and fourth to sixth conductive layers. The first insulating layer includes a region in contact with the first semiconductor layer and the first conductive layer and includes an opening reaching the first conductive layer. The first semiconductor layer is in contact with a top surface of the first conductive layer, an inner wall of the opening, and the second conductive layer. The second conductive layer is positioned over the first insulating layer. The third conductive layer is positioned over the first semiconductor layer and includes a region overlapping with the inner wall of the opening with the second insulating layer positioned therebetween. The second semiconductor layer is positioned over the first insulating layer and in contact with side and top surfaces of
(Continued)

a side end portion of the fourth conductive layer and side and top surfaces of a side end portion of the fifth conductive layer; the side end portions face each other. The sixth conductive layer is positioned over the second semiconductor layer with the third insulating layer positioned therebetween. The first transistor is electrically connected to the second transistor.

16 Claims, 33 Drawing Sheets

(58) Field of Classification Search
CPC ............... H10D 86/40; H10D 30/6704; H10D 30/6755; H10D 99/00; H10K 59/1213; H10K 59/1201; H10K 59/12; H10K 59/131
See application file for complete search history.

(56) References Cited

U.S. PATENT DOCUMENTS 9,831,309 B2 11/2017 Miyairi
11,335,812 B2 5/2022 Yamazaki et al.
2015/0214376 A1* 7/2015 Koezuka ............ H10D 30/6755 257/43
2020/0006554 A1 1/2020 Cheng et al.
2020/0279858 A1 9/2020 Xie et al.
2021/0376126 A1 12/2021 Sohn et al.
2022/0190125 A1 6/2022 Wu et al.
2022/0406347 A1 12/2022 Yamazaki et al.
2023/0072305 A1 3/2023 Cheng et al.
2023/0126578 A1 4/2023 Reznicek et al.
2023/0178558 A1 6/2023 Do

OTHER PUBLICATIONS

Yeom.H et al., "Oxide Vertical TFTs for the Application to the Ultra High Resolution Display", SID Digest '16 : SID International Symposium Digest of Technical Papers, May 22, 2016, pp. 820-822.

* cited by examiner

200E
140
162
164
118R
119R
G
130G
113B
111G
119G
118G
119S
117
118S
128
150
113S
111S
Lin
115
114
125
127
113R
152
131
142
242
204
166
172
123
151
205G
129G
126G
124G
129S
126S
124S
116b
206S
109
107
116a
112b
205S
106
104
108
112a
235
239
218
201
165
110c
110a
110b
110

11a 11b 11c 11d
210

11a 11b 11c 11d
210

11a 11b 11c 11d
210

11a 11b 11c 11d
210

11a 11b 11c 11d
210

11a 11b 11c 11d
210

11a 11b 11c 11d
210

11a 11b 11c 11d 11d 11d
210

11a 11b 11c 11d
210

11a 11b 11c 11d 11e
210

11a 11b 11c 11d 11e
210

FIG. 25A
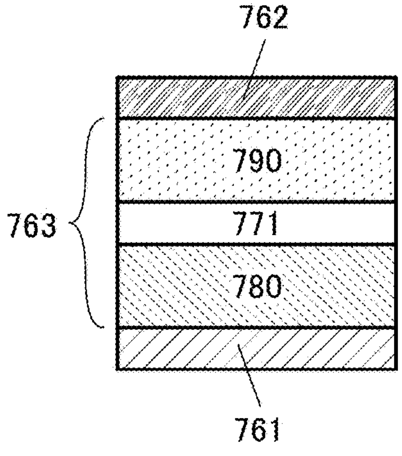
FIG. 25B
762
763
792
791
771
782
781
761
FIG. 25C
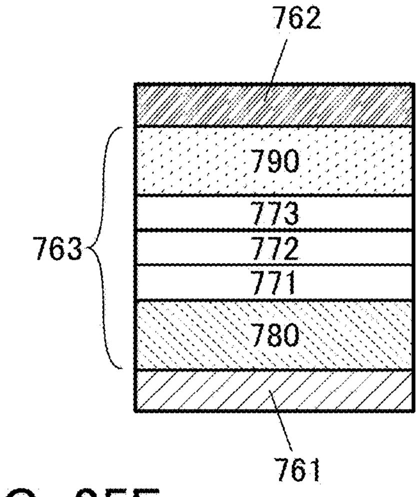
FIG. 25D
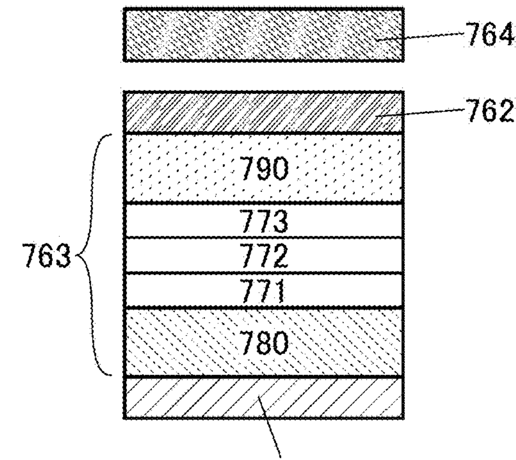
FIG. 25E
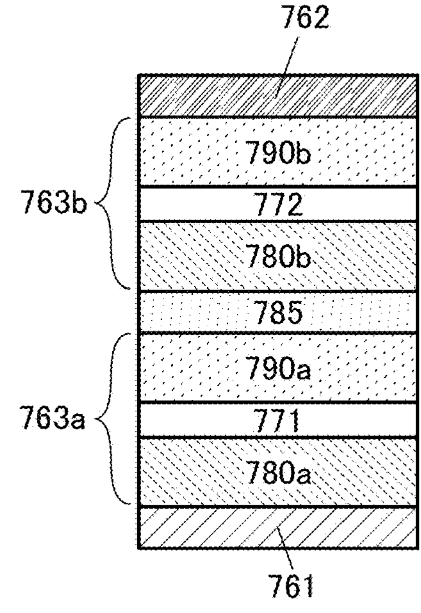
FIG. 25F
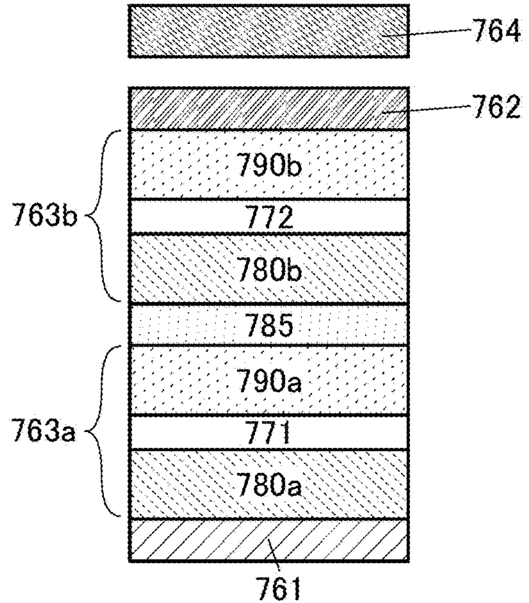

FIG. 26A
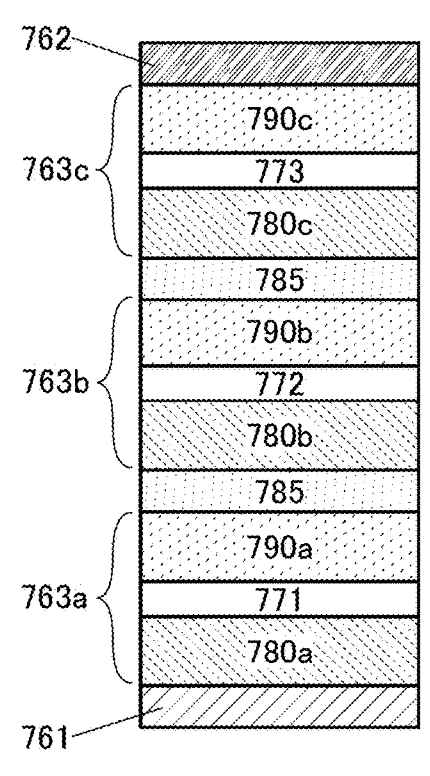
FIG. 26B
764
762
790b
772c
772b
763b
772a
780b
785
790a
771c
763a
771b
771a
780a
761
FIG. 26C
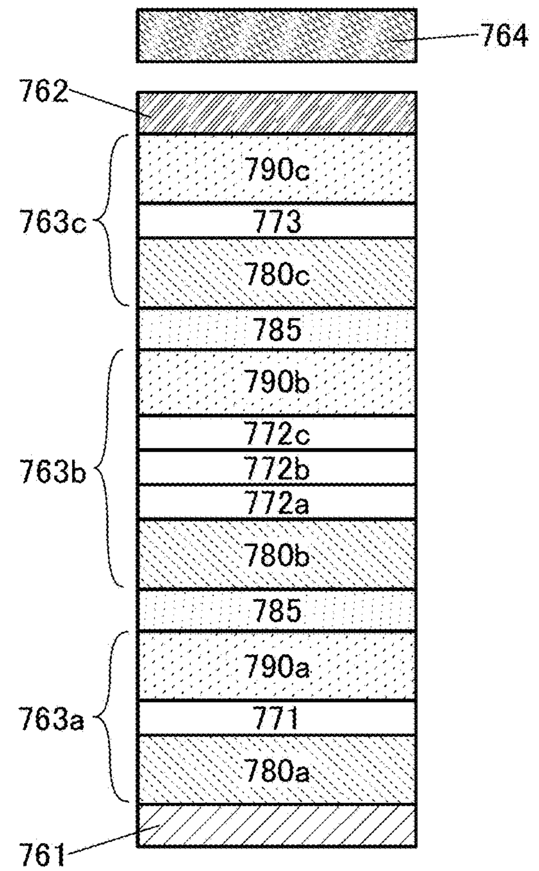

FIG. 29A
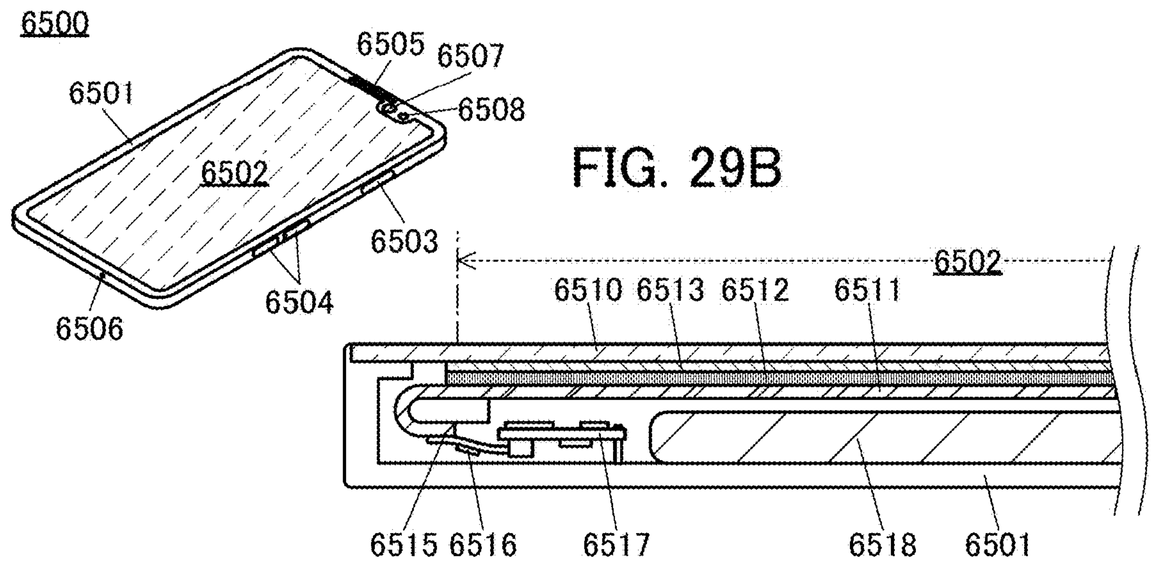
FIG. 29C
7100
7101
7000
7103
FIG. 29D
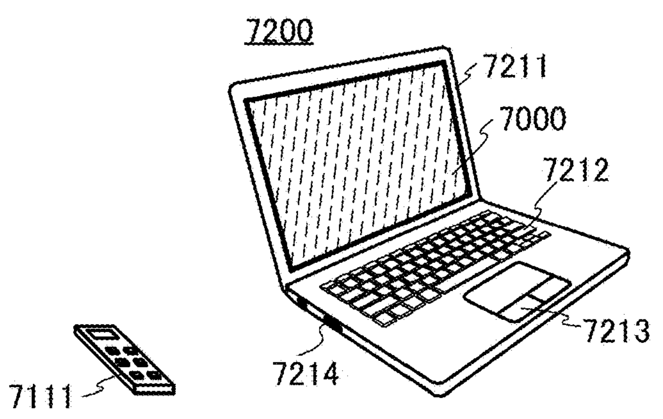
FIG. 29E
FIG. 29F
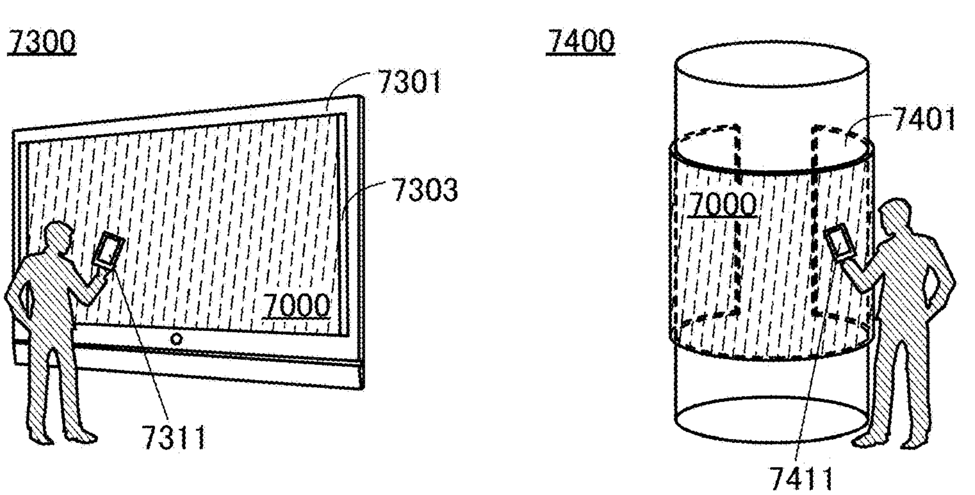

FIG. 30A
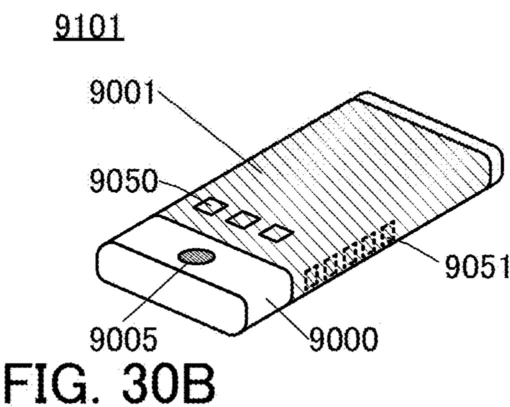
FIG. 30D
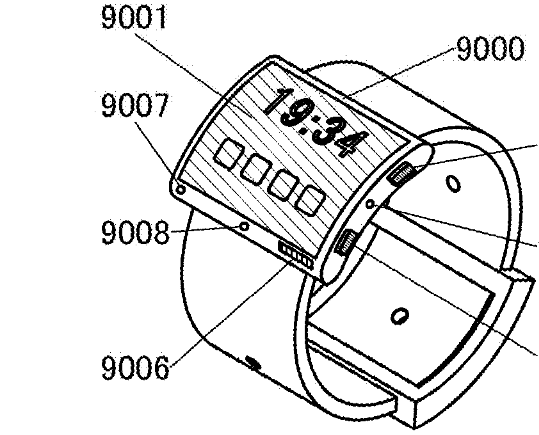
FIG. 30B
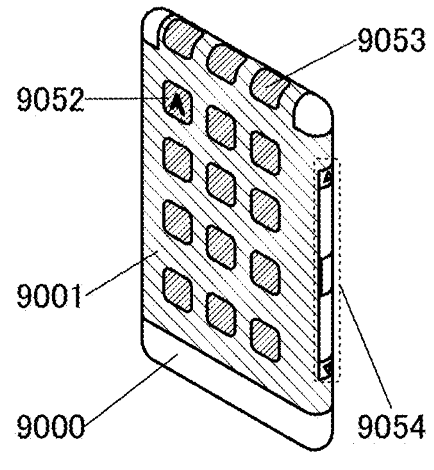
FIG. 30E
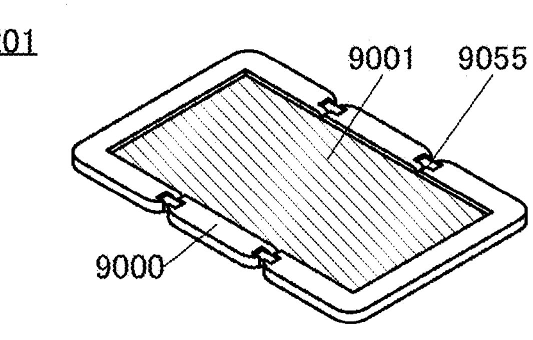
FIG. 30F
9201 9001 9055 9000
FIG. 30C
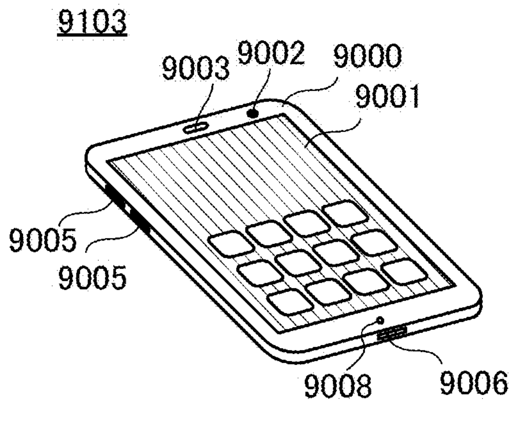
FIG. 30G
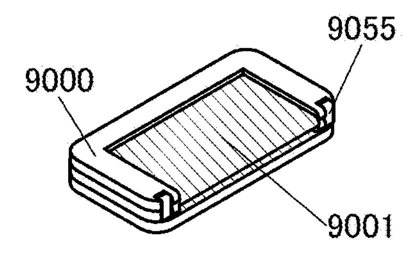

SEMICONDUCTOR DEVICE

BACKGROUND OF THE INVENTION

1. Field of the Invention

One embodiment of the present invention relates to a semiconductor device, a display apparatus, a display module, and an electronic device. One embodiment of the present invention relates to a manufacturing method of a semiconductor device and a manufacturing method of a display apparatus.

Note that one embodiment of the present invention is not limited to the above technical field. Examples of the technical field of one embodiment of the present invention include a semiconductor device, a display apparatus, a light-emitting apparatus, a power storage device, a memory device, an electronic device, a lighting device, an input device (e.g., a touch sensor), and an input/output device (e.g., a touch panel), an electronic device including any of them, a driving method of any of them, and a manufacturing method of any of them.

2. Description of the Related Art

Semiconductor devices including transistors have been widely used in display apparatuses and electronic devices, and required to achieve increasingly high integration and high-speed operation. Highly integrated semiconductor devices are required for application to high-resolution display apparatuses, for example. One way of increasing the degree of integration of transistors is the recent development of miniaturized transistors.

In recent years, there has been a need for display apparatuses applicable to virtual reality (VR), augmented reality (AR), substitutional reality (SR), or mixed reality (MR). VR, AR, SR, and MR are collectively referred to as extended reality (XR). Display apparatuses for XR have been expected to have higher resolution and higher color reproducibility such that realistic feeling and the sense of immersion can be enhanced. Examples of the apparatuses that can be used as such display apparatuses include a liquid crystal display apparatus and a light-emitting apparatus including a light-emitting device (also referred to as a light-emitting element) such as an organic electroluminescent (EL) element or a light-emitting diode (LED).

Patent Document 1 discloses a display apparatus using an organic EL device (also referred to as organic EL element) for VR.

REFERENCE

Patent Document

[Patent Document 1] International Publication No. WO2018/087625

SUMMARY OF THE INVENTION

An object of one embodiment of the present invention is to provide a semiconductor device including a miniaturized transistor and a manufacturing method of the semiconductor device. Another object is to provide a semiconductor device in which transistors are arranged with high density and a manufacturing method of the semiconductor device. Another object is to provide a semiconductor device including a transistor with high on-state current and a manufacturing method of the semiconductor device. Another object is to provide a semiconductor device having a high degree of integration and a manufacturing method of the semiconductor device. Another object is to provide a semiconductor device having favorable electrical characteristics and a manufacturing method of the semiconductor device. Another object is to provide a semiconductor device with high reliability and a manufacturing method of the semiconductor device. An object is to provide a manufacturing method of a semiconductor device with high productivity. Another object is to provide a novel semiconductor device and a manufacturing method of the semiconductor device.

Note that the description of these objects does not preclude the existence of other objects. One embodiment of the present invention does not necessarily achieve all the objects listed above. Other objects will be apparent from and can be derived from the description of the specification, the drawings, the claims, and the like.

One embodiment of the present invention is a semiconductor device including a first transistor, a second transistor, and a first insulating layer. The first transistor includes a first semiconductor layer, a second insulating layer, a first conductive layer, a second conductive layer, a third conductive layer. The second transistor includes a second semiconductor layer, a third insulating layer, a fourth conductive layer, a fifth conductive layer, a sixth conductive layer. The first insulating layer includes a region in contact with the first semiconductor layer and the first conductive layer and an opening reaching the first conductive layer. The first semiconductor layer is in contact with a top surface of the first conductive layer, an inner wall of the opening, the second conductive layer. The second conductive layer is positioned over the first insulating layer. The third conductive layer is positioned over the first semiconductor layer and includes a region overlapping with the inner wall of the opening with the second insulating layer positioned between the third conductive layer and the first semiconductor layer. The second semiconductor layer is positioned over the first insulating layer, in contact with a side surface and a top surface of a side end portion of the fourth conductive layer and a side surface and a top surface of a side end portion of the fifth conductive layer; the side end portions face each other. The sixth conductive layer is positioned over the second semiconductor layer with the third insulating layer positioned between the sixth conductive layer and the second semiconductor layer. The first transistor is electrically connected to the second transistor.

In the semiconductor device of the above embodiment, preferably, the first semiconductor layer and the second semiconductor layer each include an oxide semiconductor.

In the semiconductor device of the above embodiment, preferably, the second conductive layer and the sixth conductive layer share one conductive layer.

In the semiconductor device of the above embodiment, preferably, the third conductive layer and the fourth conductive layer share one conductive layer.

In the semiconductor device of the above embodiment, preferably, the second conductive layer and the fourth conductive layer share one conductive layer.

Another embodiment of the present invention is a semiconductor device including a first transistor, a second transistor, and a first insulating layer. The first transistor includes a first semiconductor layer, a second insulating layer, a first conductive layer, a second conductive layer, a third conductive layer. The second transistor includes a second semiconductor layer, a third insulating layer, a fourth conductive layer, a fifth conductive layer, a sixth conductive layer. The first insulating layer includes a region in contact with the first semiconductor layer and the sixth conductive layer and an opening reaching the first conductive layer. The first semiconductor layer is in contact with a top surface of the first conductive layer, an inner wall of the opening, the second conductive layer. The second conductive layer is positioned over the first insulating layer. The third conductive layer is positioned over the first semiconductor layer and includes a region overlapping with the inner wall of the opening with the second insulating layer positioned between the third conductive layer and the first semiconductor layer. The second semiconductor layer is positioned below the first insulating layer, in contact with a side surface and a top surface of a side end portion of the fourth conductive layer and a side surface and a top surface of a side end portion of the fifth conductive layer; the side end portions face each other. The sixth conductive layer is positioned over the second semiconductor layer with the third insulating layer positioned between the sixth conductive layer and the second semiconductor layer. The first transistor is electrically connected to the second transistor.

In the semiconductor device of the above embodiment, preferably, the first semiconductor layer and the second semiconductor layer each include an oxide semiconductor.

In the semiconductor device of the above embodiment, preferably, the first conductive layer and the sixth conductive layer share one conductive layer.

In the semiconductor device of the above embodiment, preferably, the first conductive layer and the fourth conductive layer share one conductive layer.

Another embodiment of the present invention is a method of manufacturing a semiconductor device, including the steps of: forming a first conductive film; forming a first conductive layer by processing the first conductive film; forming a first insulating layer over the first conductive layer; forming a second conductive film over the first insulating layer; forming a second conductive layer and a third conductive layer by processing the second conductive film; forming a first metal oxide film over the second conductive layer, the third conductive layer, the first insulating layer; forming a first semiconductor layer by processing the first metal oxide film to be in contact with a side surface and a top surface of a side end portion of the second conductive layer, a side surface and a top surface of a side end portion of the third conductive layer, a top surface of the first insulating layer in a region positioned between the second conductive layer and the third conductive layer, in which the side end portions face each other; forming a second insulating layer over the first semiconductor layer, the second conductive layer, the third conductive layer, the first insulating layer; forming a third conductive film over the second insulating layer; forming an opening in the third conductive film, the second insulating layer, the first insulating layer by processing the third conductive film, the second insulating layer, the first insulating layer; forming a fourth conductive layer by processing the third conductive film; forming a second metal oxide film to cover a top surface of the first conductive layer, an inner wall of the opening, a top surface of the fourth conductive layer, part of a top surface of the second insulating layer; forming a second semiconductor layer by processing the second metal oxide film so that the second metal oxide film includes a region overlapping with the inner wall of the opening; forming a third insulating layer over the second semiconductor layer, the fourth conductive layer, the second insulating layer; forming a fourth conductive film over the third insulating layer; and forming a fifth conductive layer by processing the fourth conductive film so that the fourth conductive film includes a region overlapping with the opening.

In the method of manufacturing a semiconductor device of the above embodiment, preferably, treatment of supplying oxygen to the first insulating layer is performed after the step of forming the first insulating layer.

An embodiment of the present invention can provide a semiconductor device including a miniaturized transistor and a manufacturing method of the semiconductor device. Another embodiment can provide a semiconductor device in which transistors are arranged with high density and a manufacturing method of the semiconductor device. Another embodiment can provide a semiconductor device including a transistor with high on-state current and a manufacturing method of the semiconductor device. Another embodiment can provide a semiconductor device having a high degree of integration and a manufacturing method of the semiconductor device. Another embodiment can provide a semiconductor device having favorable electrical characteristics and a manufacturing method of the semiconductor device. Another embodiment can provide a semiconductor device with high reliability and a manufacturing method of the semiconductor device. An embodiment can provide a manufacturing method of a semiconductor device with high productivity. Another embodiment can provide a novel semiconductor device and a manufacturing method of the semiconductor device.

Note that the description of these effects does not preclude the existence of other effects. One embodiment of the present invention does not necessarily have all these effects. Other effects will be apparent from and can be derived from the description of the specification, the drawings, the claims, and the like.

BRIEF DESCRIPTION OF THE DRAWINGS

FIG. 17 is a cross-sectional view illustrating an example of a display apparatus.

FIG. 18 is a cross-sectional view illustrating an example of a display apparatus.

FIG. 19 is a cross-sectional view illustrating an example of a display apparatus.

FIG. 20 is a cross-sectional view illustrating an example of a display apparatus.

FIGS. 25A to 25F illustrate structure examples of light-emitting devices.

FIGS. 26A to 26C illustrate structure examples of light-emitting devices.

FIGS. 29A to 29F illustrate examples of electronic devices.

FIGS. 30A to 30G illustrate examples of electronic devices.

FIG. 31 is a cross-sectional view illustrating an example of a semiconductor device.

FIG. 32 is a cross-sectional STEM image of a semiconductor device.

DETAILED DESCRIPTION OF THE INVENTION

Figure 1A:
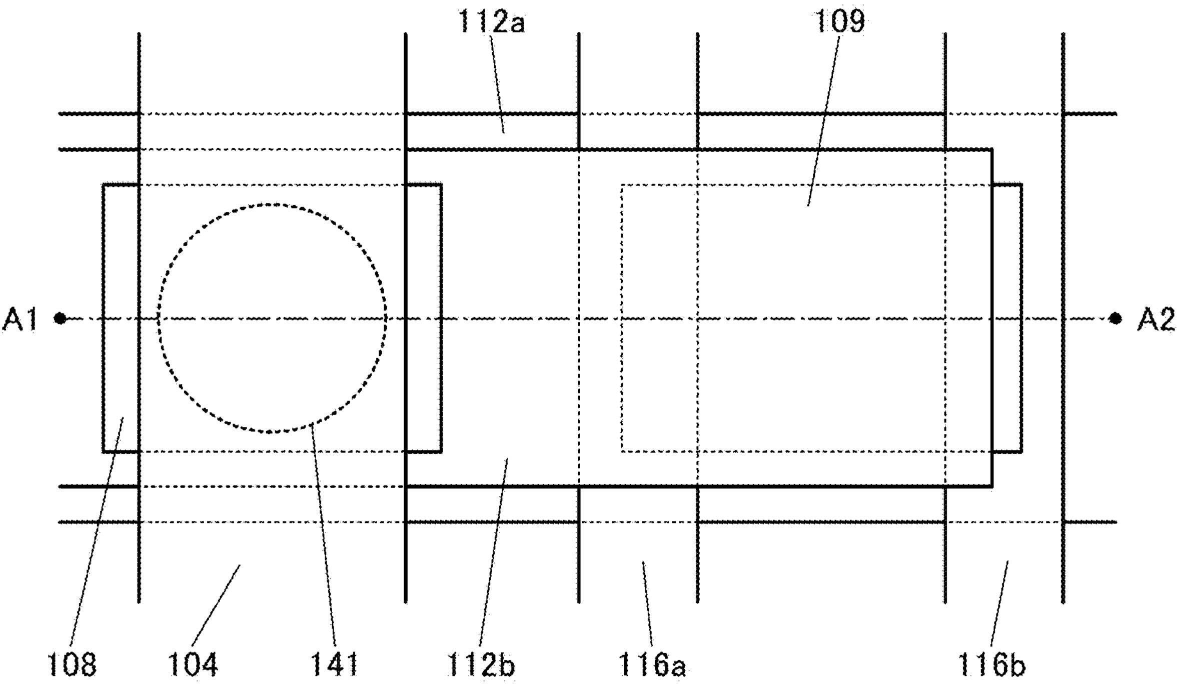
FIG. 1A is a plan view illustrating an example of a semiconductor device.
Figure 1A:
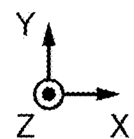

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Note that in structures of the invention described below, the same portions or portions having similar functions are denoted by the same reference numerals in different drawings, and the description thereof is not repeated. The same hatching pattern is used for portions having similar functions, and the portions are not especially denoted by reference numerals in some cases.

The position, size, range, or the like of each component illustrated in drawings does not represent the actual position, size, range, or the like in some cases for easy understanding. Therefore, the disclosed invention is not necessarily limited to the position, size, range, or the like disclosed in the drawings.

Note that the terms "film" and "layer" can be used interchangeably depending on the case or the circumstances. For example, the term "conductive layer" can be replaced with the term "conductive film". As another example, the term "insulating film" can be replaced with the term "insulating layer".

In this specification and the like, a device formed using a metal mask or a fine metal mask (FMM) may be referred to as a device having a metal mask (MM) structure. In this specification and the like, a device formed without using a metal mask or an FMM may be referred to as a device having a metal maskless (MML) structure.

In this specification and the like, a structure in which at least light-emitting layers of light-emitting devices having different emission wavelengths are separately formed may be referred to as a side-by-side (SBS) structure. The SBS structure can optimize materials and structures of light-emitting devices and thus can extend freedom of choice of materials and structures, whereby the luminance and the reliability can be easily improved.

In this specification and the like, a hole or an electron is sometimes referred to as a carrier. Specifically, a hole-injection layer or an electron-injection layer may be referred to as a carrier-injection layer, a hole-transport layer or an electron-transport layer may be referred to as a carrier-transport layer, and a hole-blocking layer or an electron-blocking layer may be referred to as a carrier-blocking layer. Note that the above-described carrier-injection layer, carrier-transport layer, and carrier-blocking layer cannot be distinguished from each other depending on the cross-sectional shape or properties in some cases. One layer may have two or three functions of the carrier-injection layer, the carrier-transport layer, and the carrier-blocking layer in some cases.

In this specification and the like, a light-emitting device includes an EL layer between a pair of electrodes. The EL layer includes at least a light-emitting layer. Examples of layers (also referred to as functional layers) in the EL layer include a light-emitting layer, carrier-injection layers (a hole-injection layer and an electron-injection layer), carrier-transport layers (a hole-transport layer and an electron-transport layer), and carrier-blocking layers (a hole-blocking layer and an electron-blocking layer).

In this specification and the like, a light-receiving device (also referred to as a light-receiving element) includes at least an active layer functioning as a photoelectric conversion layer between a pair of electrodes.

In this specification and the like, the term "island shape" refers to a state where two or more layers formed using the same material in the same step are physically separated from each other. For example, "island-shaped light-emitting layer" means a state where the light-emitting layer and its adjacent light-emitting layer are physically separated from each other.

In this specification and the like, a tapered shape refers to a shape such that at least part of a side surface of a component is inclined with respect to a substrate surface or a formation surface of the component. For example, a tapered shape refers to a shape including a region where the angle between the inclined side surface and the substrate surface or the formation surface of the component (such an angle is also referred to as a taper angle) is less than 90°. Note that the side surface of the component, the substrate plane, and the formation surface are not necessarily completely flat and may be substantially flat with a slight curvature or with slight unevenness.

In this specification and the like, a mask layer (also referred to as a sacrificial layer) refers to a layer that is positioned above at least a light-emitting layer (specifically, a layer processed into an island shape among layers included in an EL layer) and has a function of protecting the light-emitting layer in the manufacturing process.

In this specification and the like, step disconnection refers to a phenomenon in which a layer, a film, or an electrode is split because of the shape of the formation surface (e.g., a step).

In this specification and the like, the expression "having substantially the same planar shape" means that at least outlines of stacked layers partly overlap each other. For example, the case of patterning or partly patterning an upper layer and a lower layer with the use of the same mask pattern is included. The expression "having substantially the same planar shape" also includes the case where the outlines do not completely overlap each other; for instance, the edge of the upper layer may be positioned on the inner side or the outer side of the edge of the lower layer.

Embodiment 1

One embodiment of the present invention is a semiconductor device including one lateral channel transistor (described later) and one vertical channel transistor (described later). Any one of a source electrode, a drain electrode, and a gate electrode of the lateral channel transistor is electrically connected to any one of a source electrode, a drain electrode, and a gate electrode of the vertical channel transistor. The area in a substrate plane occupied by the semiconductor device can be smaller than that occupied by a semiconductor device including two lateral channel transistors. In this embodiment, a semiconductor device of one embodiment of the present invention, a manufacturing method thereof, and the like are described with reference to FIGS. 1A and 1, FIGS. 2A and 2B, FIGS. 3A and 3B, FIGS. 4A and 4B, FIGS. 5A and 5B, FIGS. 6A and 6B, FIGS. 7A to 7C, FIGS. 8A to 8C, FIGS. 9A to 9C, FIGS. 10A to 10C, FIGS. 11A to 11C, FIGS. 12A to 12C, FIGS. 13A to 13C, FIGS. 14A to 14D, and FIGS. 15A to 15D.

<Structure Example>

Figure 1B:
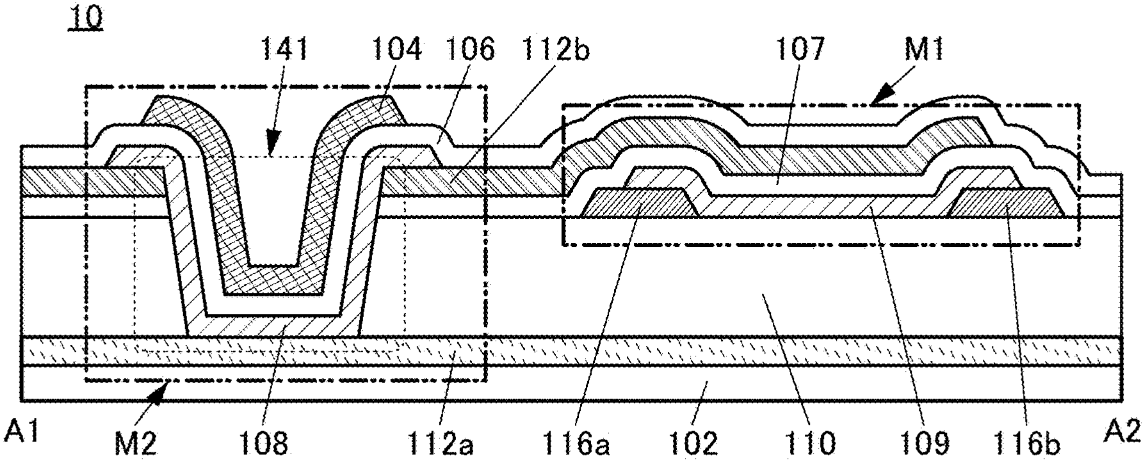
FIG. 1B is a cross-sectional view illustrating an example of a semiconductor device.
Figure 1B:
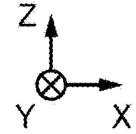

A structure of a semiconductor device 10 of one embodiment of the present invention is described. FIG. 1A is a plan view (also referred to as a top view) of the semiconductor device 10. FIG. 1B is a cross-sectional view taken along the dashed-dotted line A1-A2 in FIG. 1A. Note that in FIG. 1A, some components of the semiconductor device 10 are not illustrated. As in FIG. 1A, some components are not illustrated in plan views of semiconductor devices described below.

The semiconductor device 10 includes a transistor M1 and a transistor M2 over a substrate 102.

The transistor M1 includes the following components: a conductive layer **116*a* and a conductive layer 116*b*, which are provided over a conductive layer 112*a* and an insulating layer 110 stacked over the substrate 102; a semiconductor layer 109, which is in contact with a side surface and a top surface of one side end portion of the conductive layer 116*a* (the side end portion facing the conductive layer 116*b*), a side surface and a top surface of one side end portion of the conductive layer 116*b* (the side end portion facing the conductive layer 116*a*), and a top surface of the insulating layer 110 in a region between the conductive layers 116*a* and 116*b*; an insulating layer 107, which includes a region in contact with a top surface and a side surface of the semiconductor layer 109, a side surface and a top surface of the region of the conductive layer 116*a* other than the one side end portion of the conductive layer 116*a*, a side surface and a top surface of the region of the conductive layer 116*b* other than the one side end portion of the conductive layer 116*b*, and part of the top surface of the insulating layer 110; and a conductive layer 112*b* over the insulating layer 107**.

In the transistor M1, the conductive layer **116*a* functions as one of a source electrode and a drain electrode, while the conductive layer 116*b* functions as the other of the source electrode and the drain electrode. The semiconductor layer 109 functions as a semiconductor layer where a channel is formed. The insulating layer 107 functions as a gate insulating layer. The conductive layer 112*b*** functions as a gate electrode.

The transistor M2 includes the following components: the conductive layer **112*a* over the substrate 102; the conductive layer 112*b*, which is provided over the insulating layers 110 and 107 stacked over the conductive layer 112*a*; a semiconductor layer 108, which is in contact with part of a top surface of the conductive layer 112*b* and an inner wall (part of a top surface of the conductive layer 112*a*, a side surface of the insulating layer 110, a side surface of the insulating layer 107, and a side surface of the conductive layer 112*b*) of an opening 141 provided in the insulating layer 110 and the like; an insulating layer 106, which includes a region in contact with a top surface and a side surface of the semiconductor layer 108 and the top surface of the conductive layer 112*b*; and a conductive layer 104, which is provided over the insulating layer 106 to include a region overlapping with the inner wall of the opening 141**.

In the transistor M2, the conductive layer **112*a* functions as one of a source electrode and a drain electrode, while the conductive layer 112*b* functions as the other of the source electrode and the drain electrode. The semiconductor layer 108 functions as a semiconductor layer where a channel is formed. The insulating layer 106 functions as a gate insulating layer. The conductive layer 104** functions as a gate electrode.

In the transistor M2, the region of the semiconductor layer 108, which functions as a channel formation region, overlaps with the conductive layer 104 with the insulating layer 106 interposed therebetween and is positioned above the top surface of the conductive layer **112*a* and below the bottom surface of the conductive layer 112*b* in a cross-sectional view (see FIG. 1). That is, the length of this region is the channel length of the transistor M2. Hence, the channel length of the transistor M2 can be determined by adjusting the thickness of the insulating layers (the insulating layers 110 and 107) between the conductive layers 112*a* and 112*b*. Thus, a transistor with a short channel length can be fabricated with high accuracy. When a plurality of transistors M2** are fabricated, variation in characteristics among the transistors can be reduced.

In the transistor M2, since the semiconductor layer 108 is provided in the region overlapping with the opening 141 in a plan view (see FIG. 1A), the outer circumferential length of the opening 141, which is more properly the outer circumferential length of the channel formation region of the transistor M2 in the opening 141, is the channel width of the transistor M2. Note that in FIG. 1B, the opening 141 has a width in the X-direction that is narrowed toward the conductive layer 112*a* and widened toward the conductive layer 112*b*. In this structure, the outer circumferential length of the channel formation region in the region with the smallest width in the X-direction of the opening 141 may be defined as the channel width of the transistor M2; meanwhile, the outer circumferential length of the channel formation region in the region with the largest width in the X-direction of the opening 141 may be defined as the channel width of the transistor M2. Alternatively, the intermediate value of both of the cases may be defined as the channel width of the transistor M2.

As described above, the conductive layer 112*b* functions as the gate electrode of the transistor M1 and as the other of the source electrode and the drain electrode of the transistor M2. In other words, the gate electrode of the transistor M1 is electrically connected to the other of the source electrode and the drain electrode of the transistor M2. Thus, the semiconductor device 10 of one embodiment of the present invention includes two transistors (the transistors M1 and M2) electrically connected to each other.

In the transistor M1, a drain current flows in the region of the semiconductor layer 109, which is positioned between the conductive layers 116*a* and 116*b*; in the transistor M2, a drain current flows in the region of the semiconductor layer 108, which is positioned between the conductive layers 112*a* and 112*b*. Specifically, the direction in which the drain current flows in the transistor M1 is substantially parallel to the substrate plane; the direction in which the drain current flows in the transistor M2 is substantially perpendicular to the substrate plane.

A "lateral channel transistor" refers to a transistor, like the transistor M1, in which the source and drain electrodes are placed in the lateral direction (the X-direction or the Y-direction in FIGS. 1A and 1B) and the drain current flows in the lateral direction. A "vertical channel transistor" refers to a transistor, like the transistor M2, in which the source and drain electrodes are placed in the vertical direction (the Z-direction in FIGS. 1A and 1B) and the drain current flows in the vertical direction.

In the vertical channel transistor, since both the source electrode and the drain electrode are placed in the Z-direction, the area in the substrate plane occupied by the transistor can be significantly smaller than that occupied by the lateral channel transistor. One (transistor M2) of the two transistors included in the semiconductor device 10 of one embodiment of the present invention is a vertical channel transistor. The area in a substrate plane occupied by the semiconductor device 10 of one embodiment of the present invention can be smaller than that occupied by a semiconductor device including two lateral channel transistors placed in the lateral direction. One (transistor M1) of the two transistors included in the semiconductor device 10 of one embodiment of the present invention is a lateral channel transistor. Therefore, some transistor components such as the source and drain electrodes can be formed on the same plane at a time. Accordingly, the number of formation steps of the lateral channel transistor can be smaller than that of the vertical channel transistor. Furthermore, the transistor M1 is a so-called bottom-contact transistor in which the bottom surface of the semiconductor layer (semiconductor layer 109) where the channel is formed is in contact with the top surface of the source and drain electrodes (conductive layers 116*a* and 116*b*). Unlike a top-contact transistor (in which the top surface of the semiconductor layer where the channel is formed is in contact with the bottom surface of the source and drain electrodes), a bottom-contact transistor enables the semiconductor layer where the channel is formed to be free from the damage caused by the formation of the source and drain electrodes. Hence, the quality of the semiconductor layer where the channel is formed and the transistor characteristics are better than those of the top-contact transistor in some cases. Thus, according to one embodiment of the present invention, a semiconductor device in which transistors having favorable characteristics are arranged with high density can be provided. A semiconductor device having a high degree of integration can be provided. For example, the semiconductor device 10 of one embodiment of the present invention is used for a pixel circuit of a display apparatus (described later), whereby the display apparatus can have high resolution.

Materials that can be used for the semiconductor device 10 of one embodiment of the present invention are described below.

[Substrate 102]

There is no great limitation on a material used for the substrate 102. The material may be determined considering whether it has or does not have light-transmitting properties or it has heat resistance that can withstand heat treatment. For example, a glass substrate of barium borosilicate glass and aluminoborosilicate glass, or the like, a ceramic substrate, a quartz substrate, a sapphire substrate, or the like can be used. Alternatively, a semiconductor substrate, a flexible substrate, an attachment film, a base film, or the like may be used.

Examples of the semiconductor substrate include a semiconductor substrate containing a material such as silicon or germanium and a compound semiconductor substrate containing a material such as silicon carbide, silicon germanium, gallium arsenide, indium phosphide, zinc oxide, or gallium oxide. The semiconductor substrate may be a single crystal semiconductor or a polycrystalline semiconductor.

When the semiconductor device 10 of one embodiment of the present invention is used for a display apparatus, a large-sized glass substrate of the 6th generation (1500 mm×1850 mm), the 7th generation (1870 mm×2200 mm), the 8th generation (2200 mm×2400 mm), the 9th generation (2400 mm×2800 mm), or the 10th generation (2950 mm×3400 mm), for example, can be used as the substrate 102. With the use of such a large substrate, a large-sized display apparatus can be fabricated. When the substrate is made larger, more display apparatuses can be produced from one substrate, which leads to a reduction in production cost.

To increase the flexibility of the semiconductor device, a flexible substrate, an attachment film, a base film, or the like may be used as the substrate 102.

For the material of the flexible substrate, the attachment film, the base film, or the like, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyethersulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example.

When any of the above-described materials is used for the substrate 102, a lightweight semiconductor device can be provided. Furthermore, when any of the above-described materials is used for the substrate 102, a shock-resistant semiconductor device can be provided. When any of the above-described materials is used for the substrate 102, a semiconductor device that is less likely to be broken can be provided.

When a flexible substrate is used as the substrate 102, the flexible substrate preferably has a lower coefficient of linear expansion because deformation due to an environment is suppressed. The flexible substrate used as the substrate 102 may be formed using, for example, a material whose coefficient of linear expansion is lower than or equal to $1\times10^{-3}$/K, lower than or equal to $5\times10^{-5}$/K, or lower than or equal to $1\times10^{-5}$/K. In particular, aramid is suitable for the flexible substrate used as the substrate 102 because of its low coefficient of linear expansion.

[Conductive Layers 104, 112*a*, 112*b*, 116*a*, and 116*b*]

The following are examples of the conductive material that can be used for conductive layers such as various wirings and electrodes included in the semiconductor device 10 of one embodiment of the present invention, in addition to the conductive layers (conductive layers 116*a* and 116*b*) functioning as the source and drain electrodes of the transistor M1, the conductive layer (conductive layer 112*b*) functioning as the gate electrode of the transistor M1, the conductive layers (conductive layers 112*a* and 112*b*) functioning as the source and drain electrodes of the transistor M2, and the conductive layer (conductive layer 104) functioning as the gate electrode of the transistor M2. The examples include a metal element selected from aluminum (Al), chromium (Cr), copper (Cu), silver (Ag), gold (Au), platinum (Pt), tantalum (Ta), nickel (Ni), titanium (Ti), molybdenum (Mo), tungsten (W), hafnium (Hf), vanadium (V), niobium (Nb), manganese (Mn), magnesium (Mg), zirconium (Zr), beryllium (Be), and the like, an alloy including any of the metal elements, an alloy including any of the metal elements in combination, and the like. A semiconductor typified by polycrystalline silicon containing an impurity element such as phosphorus, or silicide such as nickel silicide may be used. There is no particular limitation on the formation method of the conductive material, and a variety of formation methods such as an evaporation method, a chemical vapor deposition (CVD) method, a sputtering method, and a spin coating method can be employed.

A Cu—X alloy (X is Mn, Ni, Cr, Fe, Co, Mo, Ta, or Ti) may be used for the conductive material. The layer formed with a Cu—X alloy enables fabrication costs to be reduced because processing can be performed by a wet etching process. An aluminum alloy containing one or more of the elements selected from titanium, tantalum, tungsten, molybdenum, chromium, neodymium, and scandium may be used for the conductive material.

As the conductive material that can be used for the conductive layer, a conductive material containing oxygen, such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can also be used. Furthermore, a conductive material containing nitrogen, such as titanium nitride, tantalum nitride, or tungsten nitride, can be used. A stacked-layer structure formed using a conductive material containing oxygen, a conductive material containing nitrogen, and a material containing any of the above metal elements as appropriate can be used for the conductive layer.

For example, the conductive layer may have a single-layer structure of an aluminum film including silicon, a two-layer structure in which a titanium layer is stacked over an aluminum layer, a two-layer structure in which a titanium layer is stacked over a titanium nitride layer, a two-layer structure in which a tungsten layer is stacked over a titanium nitride layer, a two-layer structure in which a tungsten layer is stacked over a tantalum nitride layer, or a three-layer structure of a titanium layer, an aluminum layer stacked over the titanium layer, and a titanium layer further stacked thereover.

A plurality of conductive layers formed with the above conductive materials may be stacked and used. For example, the conductive layer may have a stacked-layer structure combining a material containing the above metal element and a conductive material containing oxygen. The conductive layer may also have a stacked-layer structure combining a material containing the above metal element and a conductive material containing nitrogen. The conductive layer may also have a stacked-layer structure combining a material containing the above metal element, a conductive material containing oxygen, and a conductive material containing nitrogen.

For example, the conductive layer can have a three-layer structure in which a conductive layer containing copper is stacked over a conductive layer containing oxygen and at least one of indium and zinc, and a conductive layer containing oxygen and at least one of indium and zinc further stacked thereover. In this case, the side surface of the conductive layer containing copper is preferably covered with the conductive layer containing oxygen and at least one of indium and zinc. In addition, for example, a plurality of conductive layers containing oxygen and at least one of indium and zinc may be stacked and used.

When an oxide semiconductor is used for the semiconductor layers 108 and 109, for example, a conductive material imparting n-type conductivity to the oxide semiconductor is preferably used as each of the conductive layers 112*a* and 112*b* in contact with the semiconductor layer 108 and the conductive layers 116*a* and 116*b* in contact with the semiconductor layer 109. For example, a conductive material containing nitrogen or a conductive material containing nitrogen and titanium or tantalum can be used. In addition, another conductive material may be provided to overlap with the conductive material containing nitrogen.

[Insulating Layers 106, 107, and 110]

In addition to the insulating layer functioning as the gate insulating layer of the transistor M1 (insulating layer 107), the insulating layer functioning as the gate insulating layer of the transistor M2 (insulating layer 106), and the insulating layer 110 functioning as an interlayer film, the insulating layers included in the semiconductor device 10 of one embodiment of the present invention can be formed with a single layer or a stack of a material selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, aluminum silicate, and the like. A material in which a plurality of materials selected from an oxide material, a nitride material, an oxynitride material, and a nitride oxide material are mixed may be used.

Note that in this specification and the like, oxynitride refers to a material that contains more oxygen than nitrogen. Nitride oxide refers to a material that contains more nitrogen than oxygen. The content of each element can be measured by a Rutherford backscattering spectrometry (RBS) method or the like, for example.

When an oxide semiconductor is used for the semiconductor layers 108 and 109, for example, an insulating material in which oxygen is contained and hydrogen is reduced is preferably used for the insulating layers 106, 107, and 110. For example, silicon oxide is preferably used for each of the insulating layers 106, 107, and 110. With the insulating layers 106, 107, and 110 each containing silicon oxide, the semiconductor layers 108 and 109 each including a region in contact with any of these insulating layers are less likely to have n-type conductivity. In addition, oxygen can be efficiently supplied from these insulating layers to the semiconductor layers 108 and 109. Thus, oxygen vacancies ($V_O$) in the semiconductor layers 108 and 109 are reduced, whereby both the electrical characteristics and reliability of the transistors M1 and M2 can be improved.

For the insulating layer (not illustrated) above or below the transistors M1 and M2, an insulating material that is relatively impermeable to impurities is preferably used, for example. For example, a single layer or a stacked layer of an insulating material containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. As examples of an insulating material that does not allow impurities to permeate easily, aluminum oxide, aluminum nitride, aluminum oxynitride, aluminum nitride oxide, gallium oxide, germanium oxide, yttrium oxide, zirconium oxide, lanthanum oxide, neodymium oxide, hafnium oxide, tantalum oxide, and silicon nitride can be given.

When an insulating material that is relatively impermeable to impurities is used for the insulating layer above or below the transistors M1 and M2, diffusion of impurities into the transistors M1 and M2 from above and below can be prevented, whereby the reliability of the semiconductor device 10 can be improved.

As the insulating layer above or below the transistors M1 and M2, an insulating layer that can function as a planarization layer may be used. As an insulating layer that can serve as a planarization layer, a heat-resistant organic material such as polyimide, acrylic resin, benzocyclobutene resin, polyamide, or epoxy resin can be used. Other than the above-described organic materials, it is also possible to use a low-dielectric constant material (a low-k material), a siloxane resin, PSG (phosphosilicate glass), BPSG (borophosphosilicate glass), or the like. Note that a plurality of insulating layers formed of these materials may be stacked.

The siloxane resin corresponds to a resin including a Si—O—Si bond formed using a siloxane-containing material as a starting material. The siloxane resin may include an organic group (e.g., an alkyl group or an aryl group) or a fluoro group as a substituent. The organic group may include a fluoro group.

A surface of the insulating layer that can function as a planarization layer may be subjected to CMP treatment. By performing the CMP treatment, unevenness of a sample surface can be reduced, so that coverage with an insulating layer and a conductive layer to be formed later can be increased.

[Semiconductor Layers 108 and 109]

A single crystal semiconductor, a polycrystalline semiconductor, a microcrystalline semiconductor, an amorphous semiconductor, or the like can be used alone or can be used in combination for the semiconductor layer 109 functioning as the semiconductor layer where the channel of the transistor M1 is formed and the semiconductor layer 108 functioning as the semiconductor layer where the channel of the transistor M2 is formed. As a semiconductor material, silicon, germanium, or the like can be used. A compound semiconductor such as silicon germanium, silicon carbide, gallium arsenide, or a nitride semiconductor may be used. As a compound semiconductor, an organic substance having semiconductor characteristics or a metal oxide having semiconductor characteristics (also referred to as an oxide semiconductor) can be used. Note that such a semiconductor material may contain an impurity as a dopant.

In particular, since an oxide semiconductor has a band gap of 2 eV or more, a transistor with an oxide semiconductor, which is a kind of metal oxide, used as a semiconductor layer where the channel is formed (also referred to as an "OS transistor") has an extremely lower off-state current than a transistor with any other material. Accordingly, the power consumption of the semiconductor device 10 can be reduced. In addition, an OS transistor operates stably even in a high-temperature environment and has small fluctuation in characteristics. For example, the off-state current hardly increases even in a high-temperature environment. Specifically, the off-state current hardly increases even at an environment temperature higher than or equal to room temperature and lower than or equal to 200° C. In addition, the on-state current of an OS transistor is unlikely to decrease even in a high-temperature environment. Accordingly, a semiconductor device including an OS transistor achieves stable operation and high reliability even in a high temperature environment.

Examples of silicon that can be used for the semiconductor layer where the channel is formed include single crystal silicon, polycrystalline silicon, microcrystalline silicon, and amorphous silicon. An example of polycrystalline silicon is low-temperature polysilicon (LTPS).

A transistor including amorphous silicon in the semiconductor layer where the channel is formed can be formed over a large-sized glass substrate, thereby reducing the manufacturing cost. A transistor including polycrystalline silicon in the semiconductor layer where the channel is formed has high field-effect mobility and enables high-speed operation. A transistor including microcrystalline silicon in the semiconductor layer where the channel is formed has higher field-effect mobility and enables higher speed operation than the transistor including polycrystalline silicon.

In this embodiment, an OS transistor is used for both the transistors M1 and M2. In other words, an oxide semiconductor is used for both the semiconductor layers 108 and 109. Since an OS transistor has high withstand voltage between its source and drain, the channel length can be short. Accordingly, the on-state current of the transistor can be increased.

Examples of the metal oxide that can be used for the semiconductor layer where a channel of an OS transistor is formed include indium oxide, gallium oxide, and zinc oxide. The metal oxide preferably contains at least indium (In) or zinc (Zn). The metal oxide preferably contain two or three kinds selected from indium, the element M, and zinc. The element M is one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, cobalt, and magnesium. Specifically, the element M is preferably one or more of aluminum, gallium, yttrium, and tin.

Examples of the metal oxide that can be used include indium oxide, indium zinc oxide (In—Zn oxide), indium tin oxide (In—Sn oxide), indium titanium oxide (In—Ti oxide), indium aluminum zinc oxide (In—Al—Zn oxide, also referred to as IAZO), indium tin zinc oxide (In—Sn—Zn oxide), indium titanium zinc oxide (In—Ti—Zn oxide), indium gallium zinc oxide (In—Ga—Zn oxide, also referred to as IGZO), indium gallium tin zinc oxide (In—Ga—Sn—

Zn oxide), and indium gallium aluminum zinc oxide (In—Ga—Al—Zn oxide, also referred to as IGAZO or IAGZO). Alternatively, indium tin oxide containing silicon or the like can be used.

The element M is preferably one or more selected from gallium, aluminum, yttrium, and tin. In particular, the element M is preferably gallium.

The composition of the metal oxide used for the semiconductor layer where the channel is formed significantly affects the electrical characteristics and reliability of the OS transistor.

For example, a metal oxide with a higher content of indium enables the transistor to have a high on-state current.

As the In—Zn oxide used for the semiconductor layer where the channel of the OS transistor is formed, a metal oxide in which the atomic ratio of indium is higher than or equal to that of zinc is preferably used. For example, a metal oxide with metal elements in an atomic ratio of In:Zn=1:1, In:Zn=2:1, In:Zn=3:1, In:Zn=4:1, In:Zn=5:1, In:Zn=7:1, or In:Zn=10:1, or the vicinity thereof can be used.

In the case where an In—Sn oxide is used for the semiconductor layer where the channel of the OS transistor is formed, a metal oxide in which the atomic ratio of indium is higher than or equal to that of tin is preferably used. For example, a metal oxide with metal elements in an atomic ratio of In:Sn=1:1, In:Sn=2:1, In:Sn=3:1, In:Sn=4:1, In:Sn=5:1, In:Sn=7:1, or In:Sn=10:1, or the vicinity thereof can be used.

In the case where an In—Sn—Zn oxide is used for the semiconductor layer where the channel of the OS transistor is formed, a metal oxide in which the atomic ratio of indium is higher than that of tin is preferably used. It is further preferable to use a metal oxide in which the atomic ratio of zinc is higher than that of tin. For example, a metal oxide with metal elements in any of the following atomic ratios can be used: In:Sn:Zn=2:1:3, In:Sn:Zn=3:1:2, In:Sn:Zn=4:2:3, In:Sn:Zn=4:2:4.1, In:Sn:Zn=5:1:3, In:Sn:Zn=5:1:6, In:Sn:Zn=5:1:7, In:Sn:Zn=5:1:8, In:Sn:Zn=6:1:6, In:Sn:Zn=10:1:3, In:Sn:Zn=10:1:6, In:Sn:Zn=10:1:7, In:Sn:Zn=10:1:8, In:Sn:Zn=5:2:5, In:Sn:Zn=10:1:10, In:Sn:Zn=20:1:10, In:Sn:Zn=40:1:10, or the vicinity thereof.

In the case where an In—Al—Zn oxide is used for the semiconductor layer where the channel of the OS transistor is formed, a metal oxide in which the atomic ratio of indium is higher than that of aluminum is preferably used. It is further preferable to use a metal oxide in which the atomic ratio of zinc is higher than that of aluminum. For example, a metal oxide with metal elements in any of the following atomic ratios can be used: In:Al:Zn=2:1:3, In:Al:Zn=3:1:2, In:Al:Zn=4:2:3, In:Al:Zn=4:2:4.1, In:Al:Zn=5:1:3, In:Al:Zn=5:1:6, In:Al:Zn=5:1:7, In:Al:Zn=5:1:8, In:Al:Zn=6:1:6, In:Al:Zn=10:1:3, In:Al:Zn=10:1:6, In:Al:Zn=10:1:7, In:Al:Zn=10:1:8, In:Al:Zn=5:2:5, In:Al:Zn=10:1:10, In:Al:Zn=20:1:10, In:Al:Zn=40:1:10, or the vicinity thereof.

In the case where an In—Ga—Zn oxide is used for the semiconductor layer where the channel of the OS transistor is formed, a metal oxide in which the atomic ratio of indium is higher than that of gallium is preferably used. It is further preferable to use a metal oxide in which the atomic ratio of zinc is higher than that of gallium. For example, a metal oxide with metal elements in any of the following atomic ratios can be used for the semiconductor layer: In:Ga:Zn=2:1:3, In:Ga:Zn=3:1:2, In:Ga:Zn=4:2:3, In:Ga:Zn=4:2:4.1, In:Ga:Zn=5:1:3, In:Ga:Zn=5:1:6, In:Ga:Zn=5:1:7, In:Ga:Zn=5:1:8, In:Ga:Zn=6:1:6, In:Ga:Zn=10:1:3, In:Ga:Zn=10:1:6, In:Ga:Zn=10:1:7, In:Ga:Zn=10:1:8, In:Ga:Zn=5:2:5, In:Ga:Zn=10:1:10, In:Ga:Zn=20:1:10, In:Ga:Zn=40:1:10, or the vicinity thereof.

In the case where an In-M-Zn oxide is used for the semiconductor layer where the channel of the OS transistor is formed, a metal oxide in which the atomic ratio of indium is higher than that of the element M can be used. It is further preferable to use a metal oxide in which the atomic ratio of zinc is higher than that of the element M. For example, a metal oxide with metal elements in any of the following atomic ratios can be used for the semiconductor layer: In:M:Zn=2:1:3, In:M:Zn=3:1:2, In:M:Zn=4:2:3, In:M:Zn=4:2:4.1, In:M:Zn=5:1:3, In:M:Zn=5:1:6, In:M:Zn=5:1:7, In:M:Zn=5:1:8, In:M:Zn=6:1:6, In:M:Zn=10:1:3, In:M:Zn=10:1:6, In:M:Zn=10:1:7, In:M:Zn=10:1:8, In:M:Zn=5:2:5, In:M:Zn=10:1:10, In:M:Zn=20:1:10, In:M:Zn=40:1:10, or the vicinity thereof.

In the case where a plurality of metal elements are contained as the element M, the atomic ratio of the sum of the metal elements can be the atomic ratio of the element M. In an In—Ga—Al—Zn oxide where gallium and aluminum are contained as the element M, for example, the atomic ratio of the sum of gallium and aluminum can be the atomic ratio of the element M. The atomic ratio of indium to the element M and zinc is preferably within the ranges given above.

It is preferable to use a metal oxide in which the atomic ratio of indium to the metal elements contained in the metal oxide is higher than or equal to 30 atomic % and lower than or equal to 100 atomic %, preferably higher than or equal to 30 atomic % and lower than or equal to 95 atomic %, further preferably higher than or equal to 35 atomic % and lower than or equal to 95 atomic %, further preferably higher than or equal to 35 atomic % and lower than or equal to 90 atomic %, further preferably higher than or equal to 40 atomic % and lower than or equal to 90 atomic %, further preferably higher than or equal to 45 atomic % and lower than or equal to 90 atomic %, further preferably higher than or equal to 50 atomic % and lower than or equal to 80 atomic %, further preferably higher than or equal to 60 atomic % and lower than or equal to 80 atomic %, further preferably higher than or equal to 70 atomic % and lower than or equal to 80 atomic %. For example, when an In—Ga—Zn oxide is used for the semiconductor layer, the atomic ratio of indium to the element M and zinc is preferably within the ranges given above.

In this specification and the like, the atomic ratio of indium to the metal elements contained is sometimes referred to as indium content. The same applies to other metal elements.

A metal oxide with a higher indium content enables the transistor to have a high on-state current. With the use of such a transistor, a circuit capable of high-speed operation can be fabricated. Furthermore, the area occupied by a circuit can be reduced. In a large-sized or high-resolution display apparatus in which the number of wirings is increased, for example, the use of the transistor can reduce signal delay in wirings and can reduce display unevenness in a large-sized or high-resolution display apparatus. In addition, since the area occupied by a circuit can be reduced, the bezel of the display apparatus can be narrowed.

As an analysis method of the composition of a metal oxide, for example, energy dispersive X-ray spectroscopy (EDX), X-ray photoelectron spectroscopy (XPS), inductively coupled plasma-mass spectrometry (ICP-MS), inductively coupled plasma-atomic emission spectroscopy (ICP-AES), or the like can be used. Alternatively, any of these methods may be combined with each other for the analysis. Note that as for an element whose content is low, the actual content may be different from the content obtained by analysis because of the influence of the analysis accuracy. In the case where the content of the element M is low, for example, the content of the element M obtained by analysis may be lower than the actual content.

In this specification and the like, the vicinity of the atomic ratio includes ±30% of an intended atomic ratio. For example, in the case of describing an atomic ratio of In:M:Zn=4:2:3 or a composition in the vicinity thereof, the case is included in which with the atomic ratio of indium being 4, the atomic ratio of M is higher than or equal to 1 and lower than or equal to 3 and the atomic ratio of zinc is higher than or equal to 2 and lower than or equal to 4. In the case of describing an atomic ratio of In:M:Zn=5:1:6 or a composition in the vicinity thereof, the case is included in which with the atomic ratio of indium being 5, the atomic ratio of M is higher than 0.1 and lower than or equal to 2 and the atomic ratio of zinc is higher than or equal to 5 and lower than or equal to 7. In the case of describing an atomic ratio of In and M to Zn that is 1:1:1 or a composition in the vicinity thereof, the case is included in which with the atomic ratio of indium being 1, the atomic ratio of M is higher than 0.1 and lower than or equal to 2 and the atomic ratio of zinc is higher than 0.1 and lower than or equal to 2.

For the formation of a metal oxide, a sputtering method or an atomic layer deposition (ALD) method can be suitably used. Note that in the case where the metal oxide is formed by a sputtering method, the atomic ratio in a target may be different from the atomic ratio in the metal oxide. Especially for zinc, the atomic ratio of zinc in the metal oxide is lower than that in the target in some cases. Specifically, the atomic ratio of zinc in the metal oxide may be approximately higher than or equal to 40% and lower than or equal to 90% of the atomic ratio of zinc in the target.

Here, the reliability of a transistor is described. Here, one of indexes for evaluating the reliability of a transistor is a gate bias-temperature stress (GBT) test in which an electric field applied to a gate is retained. A GBT test includes a positive bias-temperature stress (PBTS) test in which a positive potential (positive bias) with respect to a source potential and a drain potential is supplied to a gate and retained at a high temperature and a negative bias-temperature stress (NBTS) test in which a negative potential (negative bias) is supplied to a gate and retained at a high temperature. The PBTS test and the NBTS test conducted in a state where irradiation with light is performed are respectively referred to as a positive bias temperature illumination stress (PBTIS) test and a negative bias temperature illumination stress (NBTIS) test.

In an n-channel transistor, a positive potential is supplied to a gate when the transistor becomes an on state (a state in which a current flows); thus, the amount of change in the threshold voltage in a PBTS test is one of important indexes to be focused on as a reliability indicator of the transistor.

With the use of a metal oxide that does not contain gallium or has a low gallium content in the semiconductor layer where the channel of the transistor is formed, the transistor can be highly reliable against positive bias application. In other words, the amount of change in the threshold voltage of the transistor in the PBTS test can be small. Meanwhile, with the use of a metal oxide that contains gallium, the gallium content is preferably lower than the indium content so that the transistor can be highly reliable.

One of the factors changing the threshold voltage in the PBTS test is a defect state at the interface between a gate insulating layer and a semiconductor layer where the channel of the transistor is formed or in the vicinity of the interface. As the density of defect states increases, degradation in the PBTS test becomes significant. Generation of a defect state can be inhibited by a reduction in the gallium content in a region of the semiconductor layer where the channel of the transistor is formed, which is in contact with the gate insulating layer.

The following can be given as the reason why the amount of change in the threshold voltage in the PBTS test can be reduced when a metal oxide that does not contain gallium or has a low gallium content is used for the semiconductor layer where the channel of the transistor is formed. Gallium contained in the metal oxide more easily attracts oxygen than another metal element (e.g., indium or zinc). Therefore, when, at the interface between the metal oxide containing a large amount of gallium and the gate insulating layer, gallium is bonded to excess oxygen in the gate insulating layer, trap sites of carriers (here, electrons) are likely to be generated easily. This might cause the change in the threshold voltage when a positive potential is supplied to a gate and carriers are trapped at the interface between the semiconductor layer where the channel of the transistor is formed and the gate insulating layer.

Specifically, in the case where an In—Ga—Zn oxide is used for the semiconductor layer where the channel of the transistor is formed, a metal oxide in which the atomic ratio of indium is higher than that of gallium is preferably used. It is further preferable to use a metal oxide in which the atomic ratio of zinc is higher than that of gallium. In other words, a metal oxide with metal elements in an atomic ratio satisfying both relationships In >Ga and Zn>Ga is preferably used for the semiconductor layer where the channel of the transistor is formed.

For example, a metal oxide with metal elements in any of the following atomic ratios can be used for the semiconductor layer where the channel of the OS transistor is formed: In:Ga:Zn=2:1:3, In:Ga:Zn=3:1:2, In:Ga:Zn=4:2:3, In:Ga:Zn=4:2:4.1, In:Ga:Zn=5:1:3, In:Ga:Zn=5:1:6, In:Ga:Zn=5:1:7, In:Ga:Zn=5:1:8, In:Ga:Zn=6:1:6, In:Ga:Zn=10:1:3, In:Ga:Zn=10:1:6, In:Ga:Zn=10:1:7, In:Ga:Zn=10:1:8, In:Ga:Zn=5:2:5, In:Ga:Zn=10:1:10, In:Ga:Zn=20:1:10, In:Ga:Zn=40:1:10, and the vicinity thereof.

In the case where a metal oxide is used for the semiconductor layer where the channel of the OS transistor is formed, the atomic ratio of gallium to the metal elements contained in the metal oxide is higher than 0 atomic % and lower than or equal to 50 atomic %, preferably higher than or equal to 0.1 atomic % and lower than or equal to 40 atomic %, further preferably higher than or equal to 0.1 atomic % and lower than or equal to 35 atomic %, further preferably higher than or equal to 0.1 atomic % and lower than or equal to 30 atomic %, further preferably higher than or equal to 0.1 atomic % and lower than or equal to 25 atomic %, further preferably higher than or equal to 0.1 atomic % and lower than or equal to 20 atomic %, further preferably higher than or equal to 0.1 atomic % and lower than or equal to 15 atomic %, further preferably higher than or equal to 0.1 atomic % and lower than or equal to 10 atomic %. The reduction in the gallium content in the semiconductor layer enables the transistor to be highly resistant to the PBTS test. Note that oxygen vacancies ($V_O$) are less likely to be generated in the metal oxide when the metal oxide contains gallium.

A metal oxide that does not contain gallium may be used for the semiconductor layer where the channel of the OS transistor is formed. For example, an In—Zn oxide can be used for the semiconductor layer. In this case, when the atomic ratio of indium to the metal elements contained in the metal oxide is increased, the field-effect mobility of the transistor can be increased. By contrast, when the atomic ratio of zinc to the metal elements contained in the metal oxide is increased, the metal oxide has high crystallinity; thus, a change in the electrical characteristics of the transistor can be suppressed and the reliability can be increased. A metal oxide that contains neither gallium nor zinc, such as indium oxide, can be used for the semiconductor layer. The use of a metal oxide not containing gallium can make a change in the threshold voltage particularly in the PBTS test extremely small.

For example, an oxide containing indium and zinc can be used for the semiconductor layer where the channel of the OS transistor is formed. At that time, for example, a metal oxide with metal elements in an atomic ratio of In:Zn=2:3, In:Zn=4:1, or the vicinity thereof can be used.

Although the case of using gallium is described as an example, the same applies in the case where the element M is used instead of gallium. A metal oxide that has an atomic ratio of indium higher than that of the element M is preferably used for the semiconductor layer where the channel of the OS transistor is formed. Furthermore, a metal oxide that has an atomic ratio of zinc higher than that of the element M is preferably used.

With the use of a metal oxide with a low content of the element M for the semiconductor layer where the channel of the OS transistor is formed, the transistor can be highly reliable against positive bias application. With the use of the transistor as a transistor that is required to have high reliability against positive bias application, a highly reliable semiconductor device can be provided.

Next, the reliability of a transistor against light is described.

Light incidence on a transistor may change its electrical characteristics. In particular, a transistor provided in a region on which light can be incident preferably exhibits a small variation in electrical characteristics under light irradiation and has high reliability against light. The reliability against light can be evaluated by the amount of change in threshold voltage in a NBTIS test, for example.

The high content of the element M in a metal oxide used for the semiconductor layer where the channel of the transistor is formed enables the transistor to be highly reliable against light. In other words, the amount of change in the threshold voltage of the transistor in the NBTIS test can be small. Specifically, in a metal oxide in which the atomic ratio of the element M is higher than or equal to that of indium, the band gap is increased and accordingly the amount of change in the threshold voltage of the transistor in the NBTIS test can be reduced. The band gap of the metal oxide in the semiconductor layer where the channel of the transistor is formed is preferably greater than or equal to 2.0 eV, further preferably greater than or equal to 2.5 eV, further preferably greater than or equal to 3.0 eV, further preferably greater than or equal to 3.2 eV, further preferably greater than or equal to 3.3 eV, further preferably greater than or equal to 3.4 eV, further preferably greater than or equal to 3.5 eV.

For example, a metal oxide with metal elements in an atomic ratio of In:M:Zn=1:1:1, In:M:Zn=1:1:1.2, In:M:Zn=1:3:2, In:M:Zn=1:3:3, or In:M:Zn=1:3:4, or the vicinity thereof can be used for the semiconductor layer where the channel of the transistor is formed.

For the semiconductor layer where the channel of the transistor is formed, in particular, it is preferable to use a metal oxide in which the atomic ratio of the element M to that of the metal elements contained in the metal oxide is higher than or equal to 20 atomic % and lower than or equal to 70 atomic %, preferably higher than or equal to 30 atomic % and lower than or equal to 70 atomic %, further preferably higher than or equal to 30 atomic % and lower than or equal to 60 atomic %, further preferably higher than or equal to 40 atomic % and lower than or equal to 60 atomic %, further preferably higher than or equal to 50 atomic % and lower than or equal to 60 atomic %.

In the case where an In—Ga—Zn oxide is used for the semiconductor layer where the channel of the transistor is formed, a metal oxide in which the atomic ratio of indium is higher than or equal to that of gallium is preferably used. For example, a metal oxide with metal elements in any of the following atomic ratios can be used: In:Ga:Zn=1:1:1, In:Ga:Zn=1:1:2, In:Ga:Zn=1:3:2, In:Ga:Zn=1:3:3, In:Ga:Zn=1:3:4, and the vicinity thereof.

For the semiconductor layer where the channel of the transistor is formed, in particular, it is preferable to use a metal oxide in which the atomic ratio of gallium to that of the metal elements contained in the metal oxide is higher than or equal to 20 atomic % and lower than or equal to 60 atomic %, preferably higher than or equal to 30 atomic % and lower than or equal to 60 atomic %, further preferably higher than or equal to 40 atomic % and lower than or equal to 60 atomic %, further preferably higher than or equal to 50 atomic % and lower than or equal to 60 atomic %.

With the use of a metal oxide with a high content of the element M for the semiconductor layer where the channel of the transistor is formed, the transistor can be highly reliable against light. With the use of the transistor as a transistor that is required to have high reliability against light, a highly reliable semiconductor device can be provided.

As described above, electrical characteristics and reliability of a transistor depend on the composition of the metal oxide used for the semiconductor layer where the channel of the transistor is formed. Thus, the composition of the metal oxide is varied according to the electrical characteristics and reliability required for the transistor so that a display apparatus can achieve both excellent electrical characteristics and high reliability.

The semiconductor layer where the channel of the transistor is formed may have a stacked structure of two or more metal oxide layers. The two or more metal oxide layers included in the semiconductor layer may have the same composition or substantially the same compositions. When the compositions of the stacked metal oxide layers are the same, they can be formed using the same sputtering target and manufactured at low cost.

The two or more metal oxide layers in the semiconductor layer where the channel of the transistor is formed may have different compositions. For example, a stacked structure of a first metal oxide layer having In:M:Zn=1:3:4 [atomic ratio] or a composition in the vicinity thereof and a second metal oxide layer having In:M:Zn=1:1:1 [atomic ratio] or a composition in the vicinity thereof and being formed over the first metal oxide layer can be favorably employed. In particular, gallium or aluminum is preferably used as the element M. A stacked structure of one selected from indium oxide, indium gallium oxide, and IGZO, and one selected from IAZO, IAGZO, and ITZO (registered trademark) may be employed, for example.

A metal oxide having crystallinity is preferably used for the semiconductor layer in which the channel of the transistor is formed. For example, a metal oxide layer having a c-axis aligned crystal (CAAC) structure, a nano-crystal (nc)

structure, a polycrystalline structure, a microcrystalline structure, or the like can be used. By using a metal oxide having crystallinity for the semiconductor layer, the density of defect states in the semiconductor layer can be reduced, which enables the display apparatus to have high reliability.

As the metal oxide layer used for the semiconductor layer where the channel of the transistor is formed has higher crystallinity, the density of defect states in the semiconductor layer can be lower. By contrast, the use of a metal oxide layer with low crystallinity enables a transistor to flow a high current.

In the case where a metal oxide layer is formed by a sputtering method, the crystallinity of the metal oxide layer can be increased as the substrate temperature (the stage temperature) in formation is higher. The crystallinity of the metal oxide layer can be increased as the proportion of a flow rate of an oxygen gas to the whole formation gas (also referred to as oxygen flow rate ratio) used in formation is higher.

The semiconductor layer where the channel of the OS transistor is formed may have a stacked structure of two or more metal oxide layers having different crystallinities. For example, in a stacked structure of a first metal oxide layer and a second metal oxide layer thereover, the second metal oxide layer can include a region with higher crystallinity than the first metal oxide layer. Alternatively, the second metal oxide layer can include a region with lower crystallinity than the first metal oxide layer. The two or more metal oxide layers included in the semiconductor layer may have the same composition or substantially the same compositions. When the compositions of the stacked metal oxide layers are the same, they can be formed using the same sputtering target and the manufacturing cost can thus be reduced. For example, a stacked structure of two or more metal oxide layers with different crystallinities can be formed with the use of the same sputtering target and different oxygen flow rates. Note that the two or more metal oxide layers included in the semiconductor layer may have different compositions.

Modification examples of the above structure example are described below. Note that in some cases, the above description is referred to for the portions already described and the description thereof is omitted.

Modification Example 1

Figure 2A:
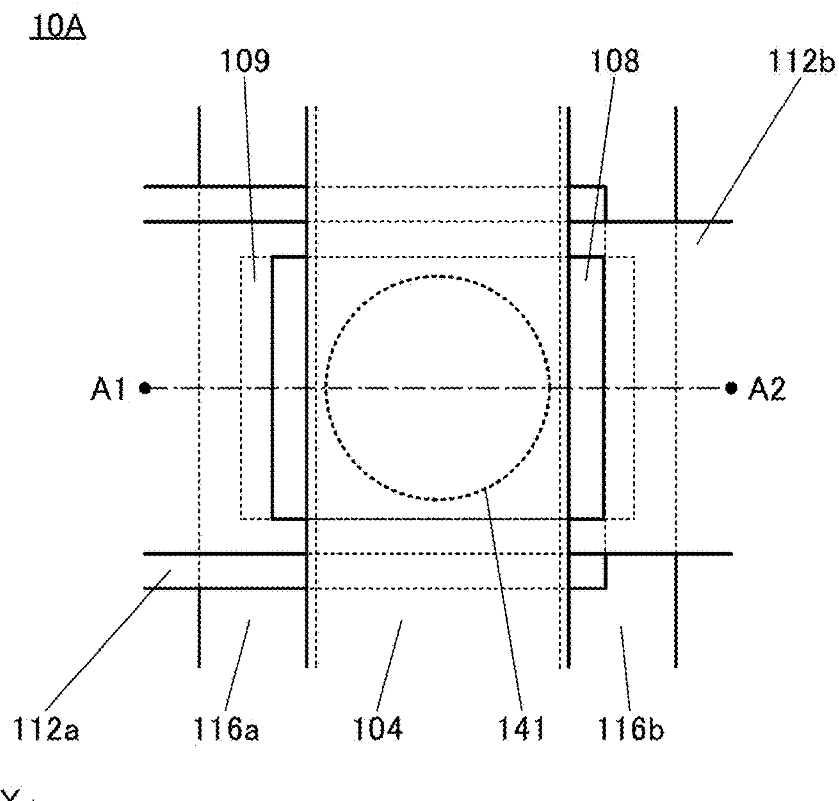
FIG. 2A is a plan view illustrating an example of a semiconductor device.
Figure 2A:
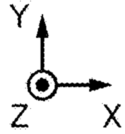
Figure 2B:
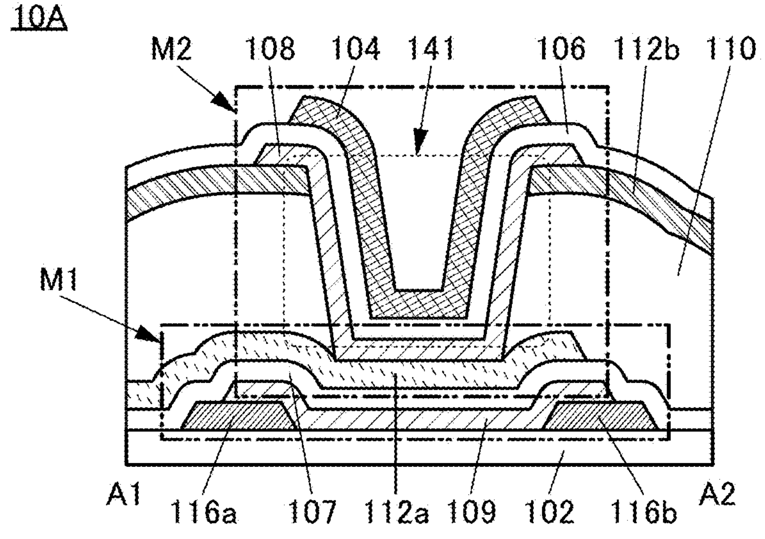
FIG. 2B is a cross-sectional view illustrating an example of a semiconductor device.
Figure 2B:
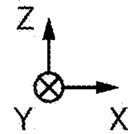

A semiconductor device 10A illustrated in FIGS. 2A and 2B is different from the semiconductor device 10 illustrated in FIGS. 1A and 1B in that the transistor M2 is provided to be over and overlap with the transistor M1.

As illustrated in FIG. 2B, in the semiconductor device 10A, a bottom surface of the semiconductor layer 108, which functions as the semiconductor layer where the channel of the transistor M2 is formed, is in contact with the top surface of the conductive layer 112*a*, which functions as the gate electrode of the transistor M1. The semiconductor layer 109, which functions as the semiconductor layer where the channel of the transistor M1 is formed, is provided below the insulating layer 110.

In the semiconductor device 10A, the conductive layer 112*a* functions as the gate electrode of the transistor M1 and also as the one of the source electrode and the drain electrode of the transistor M2. In other words, the gate electrode of the transistor M1 is electrically connected to the one of the source electrode and the drain electrode of the transistor M2 in the semiconductor device 10A.

As illustrated in FIG. 2A, in the semiconductor device 10A, the semiconductor layer 109, which functions as the semiconductor layer where the channel of the transistor M1 is formed, and the semiconductor layer 108, which functions as the semiconductor layer where the channel of the transistor M2 is formed, overlap with each other.

The transistors with the above-described structure can be arranged with high density in the semiconductor device. The area in a substrate plane occupied by the semiconductor device 10A can be smaller than the area occupied by the semiconductor device 10 illustrated in FIGS. 1A and 1B. Thus, a semiconductor device having a high degree of integration can be provided.

Modification Example 2

Figure 3A:
FIG. 3A is a plan view illustrating an example of a semiconductor device.
Figure 3A:
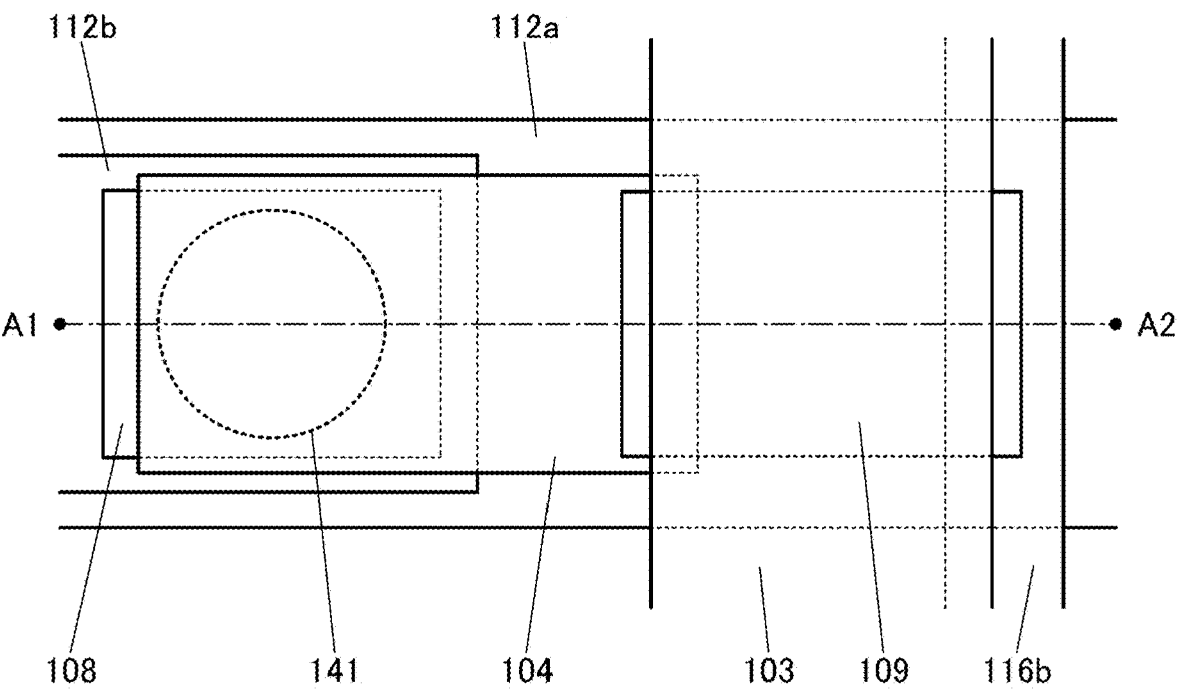
Figure 3A:
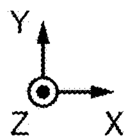
Figure 3B:
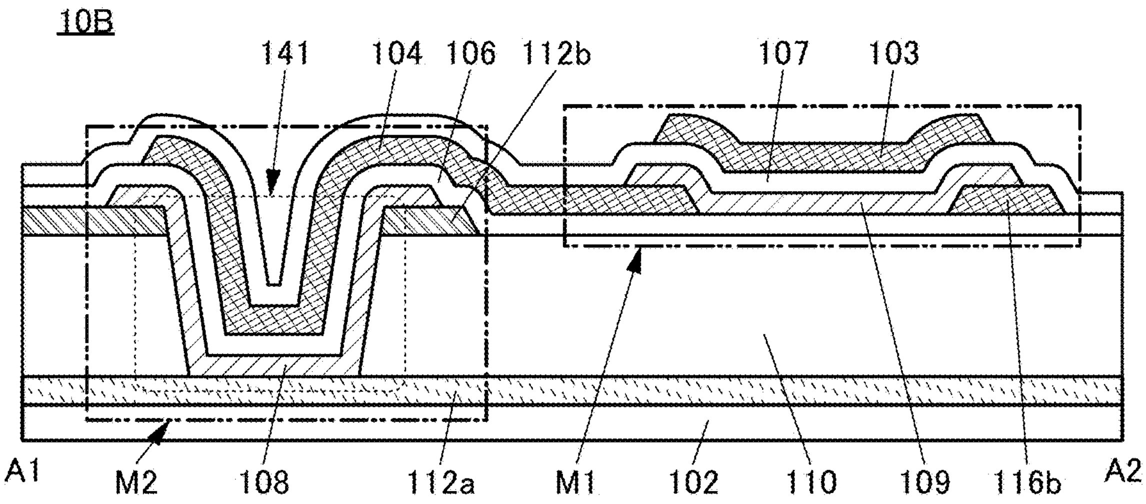
FIG. 3B is a cross-sectional view illustrating an example of a semiconductor device.
Figure 3B:
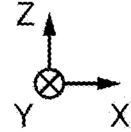

A semiconductor device 10B illustrated in FIGS. 3A and 3B is different from the semiconductor device 10 illustrated in FIGS. 1A and 1B in the structures of the gate electrode and the one of the source electrode and the drain electrode of the transistor M1, and the gate electrode of the transistor M2.

As illustrated in FIG. 3B, in the semiconductor device 10B, one end portion of the conductive layer 104, which functions as the gate electrode of the transistor M2, is extended to the transistor M1 and in contact with a bottom surface of one side end portion of the semiconductor layer 109, which functions as the semiconductor layer where the channel of the transistor M1 is formed. In addition, the insulating layer 106 functioning as a gate insulating layer of the transistor M2 is extended to the transistor M1, and positioned below the conductive layer 104 functioning as the one of the source electrode and the drain electrode of the transistor M1 (and the gate electrode of the transistor M2), the semiconductor layer 109 functioning as the semiconductor layer where the channel of the transistor M1 is formed, and the conductive layer 116*b* functioning as the other of the source electrode and the drain electrode of the transistor M1.

In the semiconductor device 10B, a conductive layer 103 functions as the gate electrode of the transistor M1. Furthermore, the conductive layer 104 functions as the one of the source electrode and the drain electrode of the transistor M1 and also as the gate electrode of the transistor M2. Thus, in the semiconductor device 10B, the source and drain electrodes of the transistor M1 are electrically connected to the gate electrode of the transistor M2. In other words, the transistor M1 in the semiconductor device 10B corresponds to the transistor M2 of the semiconductor device 10, and the transistor M2 in the semiconductor device 10B corresponds to the transistor M1 in the semiconductor device 10. With this structure, the effect similar to that obtained with the semiconductor device 10 can be obtained.

Modification Example 3

Figure 4A:
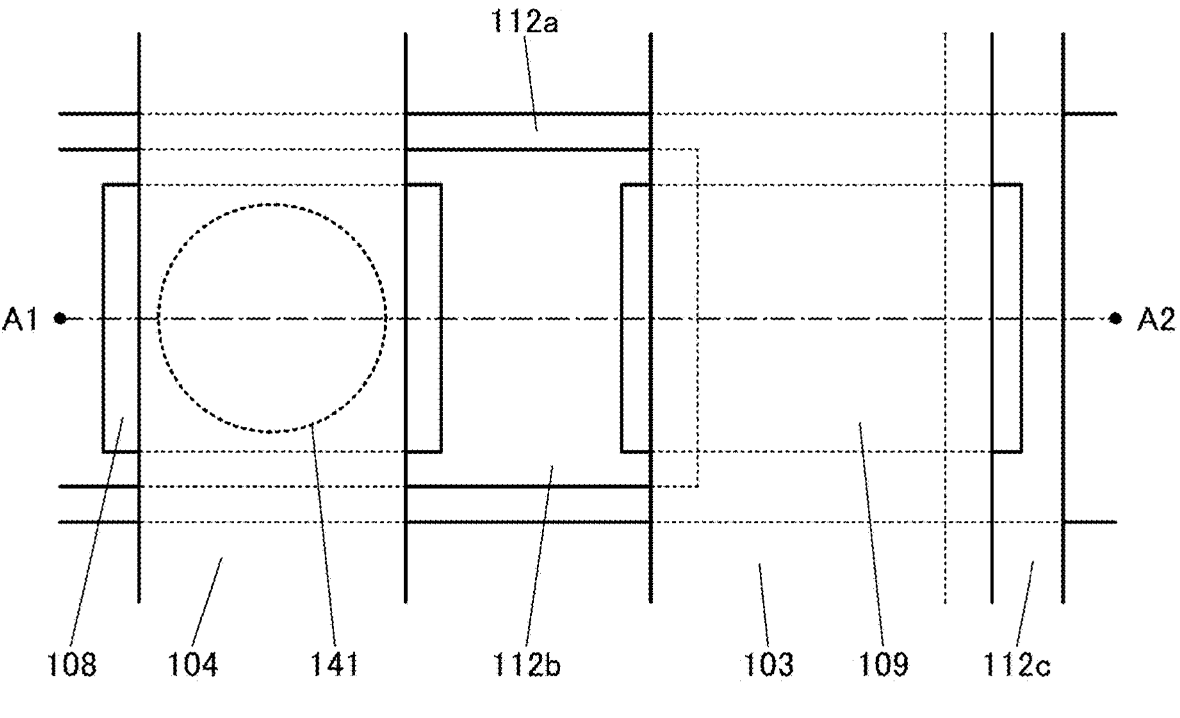
FIG. 4A is a plan view illustrating an example of a semiconductor device.
Figure 4A:
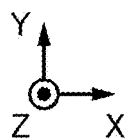
Figure 4B:
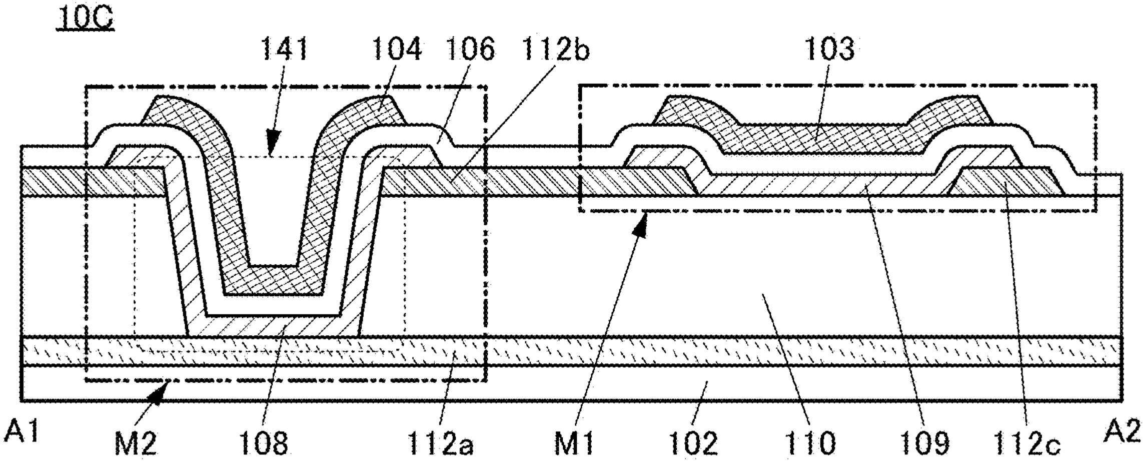
FIG. 4B is a cross-sectional view illustrating an example of a semiconductor device.
Figure 4B:
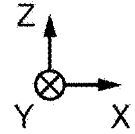

A semiconductor device 10C illustrated in FIGS. 4A and 4B is different from the semiconductor device 10 illustrated in FIGS. 1A and 1B in the structures of the gate electrode and the one of the source electrode and the drain electrode of the transistor M1, and the other of the source electrode and the drain electrode and the gate insulating layer of the transistor M2.

As illustrated in FIG. 4B, in the semiconductor device 10C, the conductive layer 112*b*, which functions as the one of the source electrode and the drain electrode of the transistor M1, is extended to the transistor M2 and in contact with the bottom surface of the semiconductor layer 108, which functions as the semiconductor layer where the channel of the transistor M2 is formed. In addition, the insulating layer 106 functioning as the gate insulating layer of the transistor M2 is extended to the transistor M1, and covers the conductive layer 112*b*, the semiconductor layer 109 functioning as the semiconductor layer where the channel of the transistor M1 is formed, and a conductive layer 112*c* functioning as the other of the source electrode and the drain electrode of the transistor M1.

In the semiconductor device 10C, the conductive layer 103 functions as the gate electrode of the transistor M1. Furthermore, the conductive layer 112*b* functions as the one of the source electrode and the drain electrode of the transistor M1 and also as the other of the source electrode and the drain electrode of the transistor M2. Thus, in the semiconductor device 10C, the one of the source electrode and the drain electrode of the transistor M1 and the other of the source electrode and the drain electrode of the transistor M2 are electrically connected to each other. The conductive layer 112*c* has functions as the other of the source electrode and the drain electrode of the transistor M1. The insulating layer 106 functions not only as the gate insulating layer of the transistor M1 but also as the gate insulating layer of the transistor M2. With this structure, the effect similar to that obtained with the semiconductor device 10 can be obtained. The number of manufacturing steps can be reduced by not including the insulating layer 107 of the semiconductor device 10.

Modification Example 4

Figure 5A:
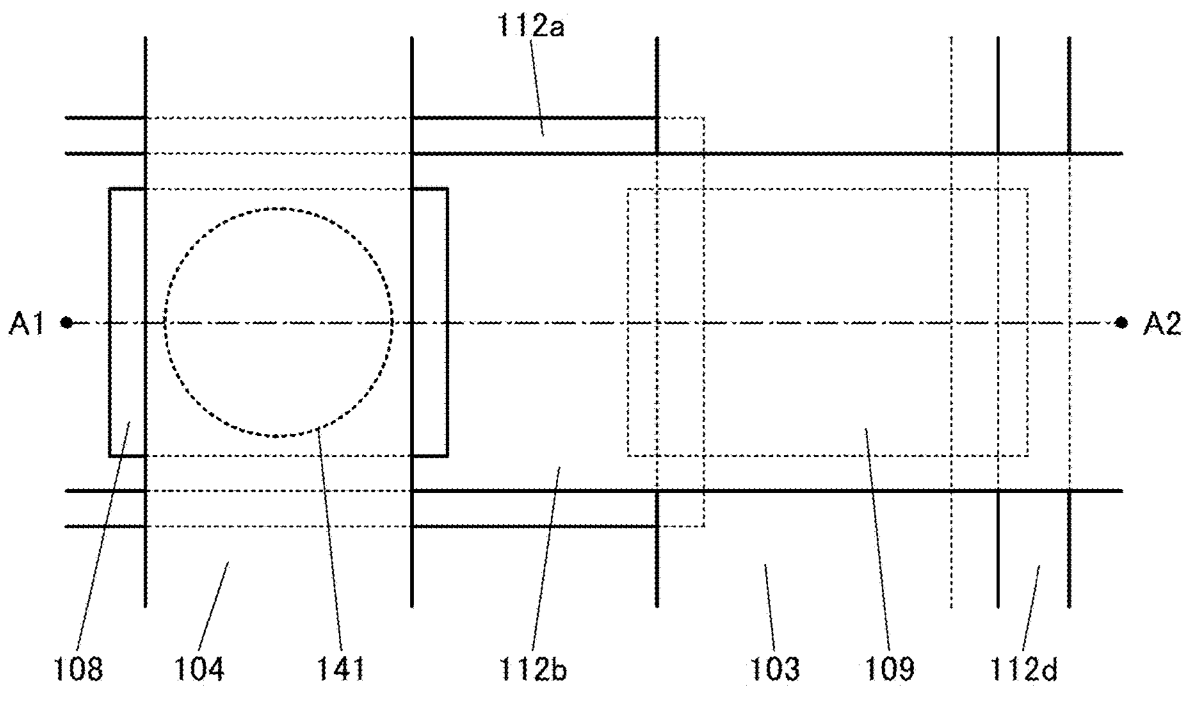
FIG. 5A is a plan view illustrating an example of a semiconductor device.
Figure 5A:
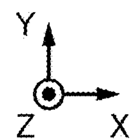
Figure 5B:
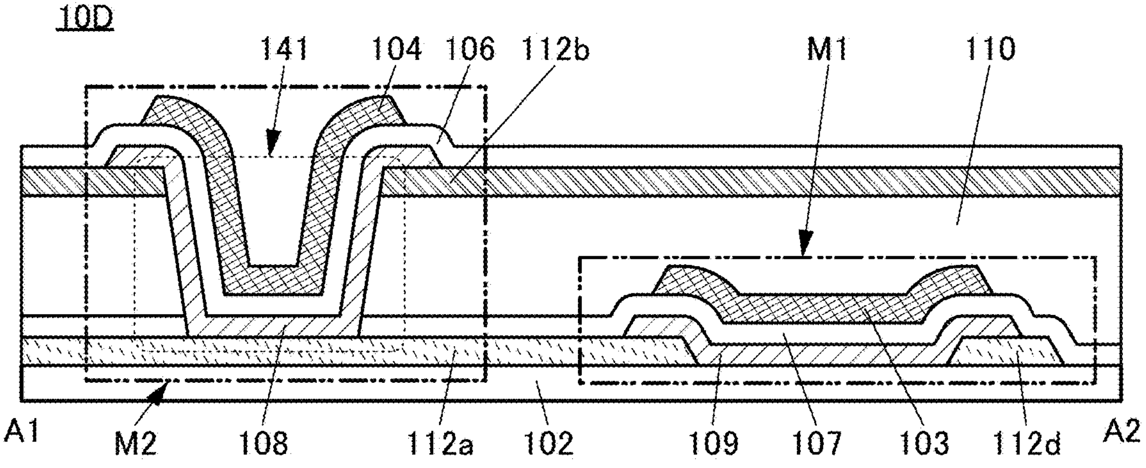
FIG. 5B is a cross-sectional view illustrating an example of a semiconductor device.
Figure 5B:
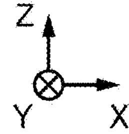

A semiconductor device 10D illustrated in FIGS. 5A and 5B is different from the semiconductor device 10 illustrated in FIGS. 1A and 1B in the structures of the gate electrode and the one of the source electrode and the drain electrode of the transistor M1, and the other of the source electrode and the drain electrode of the transistor M2.

In the semiconductor device 10D, the conductive layer 103 functions as the gate electrode of the transistor M1. Furthermore, the conductive layer 112*a* functions as the one of the source electrode and the drain electrode of the transistor M1 and also as the one of the source electrode and the drain electrode of the transistor M2. The conductive layer 112*d* functions as the other of the source electrode and the drain electrode of the transistor M1. The conductive layer 112*b* functions as the other of the source electrode and the drain electrode of the transistor M2. The conductive layer 112*b* is provided to extend over the transistor M1 with the insulating layer 110 interposed therebetween. Thus, in the semiconductor device 10D, the one of the source electrode and the drain electrode of the transistor M1 is electrically connected to the one of the source electrode and the drain electrode of the transistor M2. The semiconductor layer 109, which functions as the semiconductor layer where the channel of the transistor M1 is formed, is provided below the insulating layer 110. With this structure, the effect similar to that obtained with the semiconductor device 10 can be obtained.

Modification Example 5

Figure 6A:
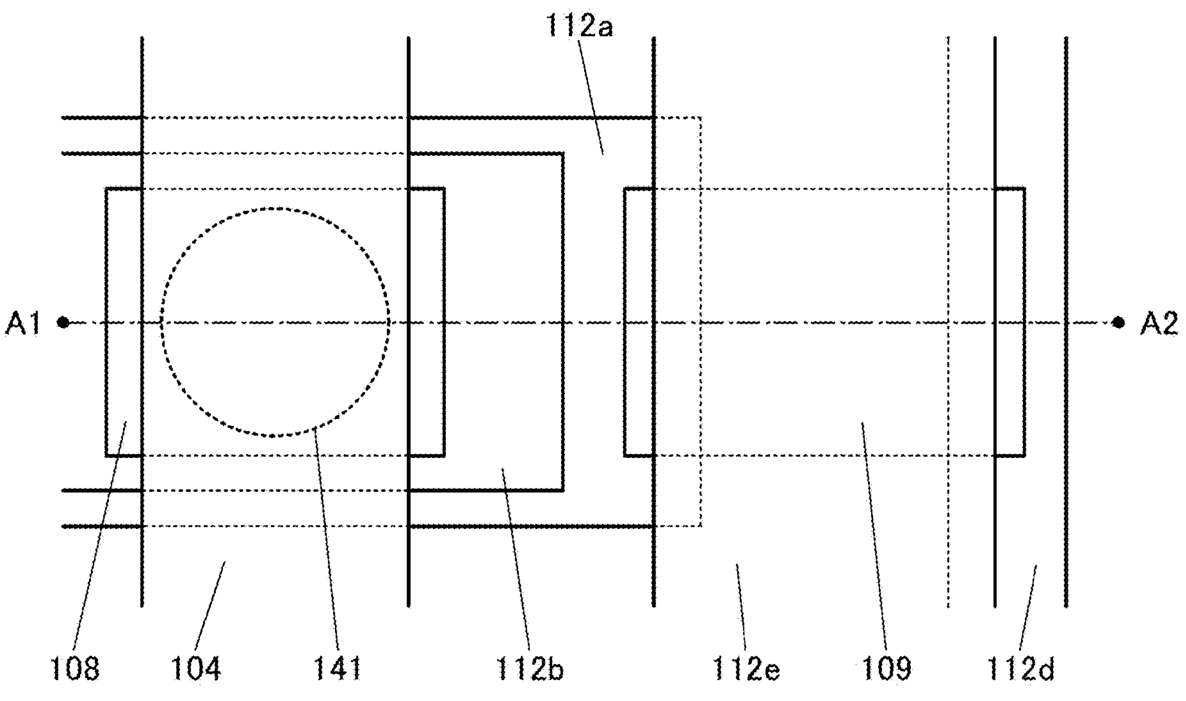
FIG. 6A is a plan view illustrating an example of a semiconductor device.
Figure 6A:
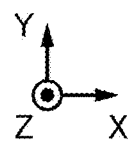
Figure 6B:
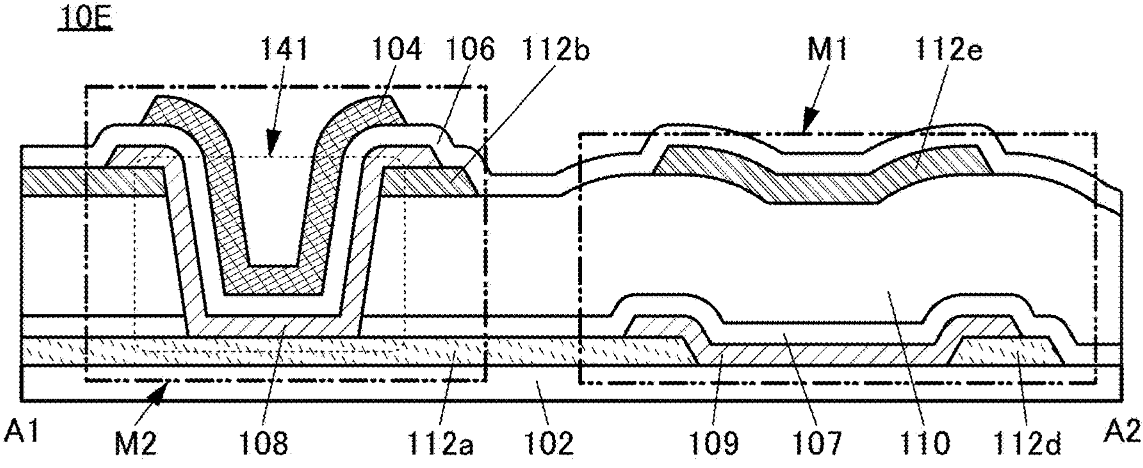
FIG. 6B is a cross-sectional view illustrating an example of a semiconductor device.
Figure 6B:
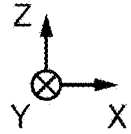

A semiconductor device 10E illustrated in FIGS. 6A and 6B is different from the semiconductor device 10 illustrated in FIGS. 1A and 1B in the structures of the gate electrode, the gate insulating layer, and the one of the source electrode and the drain electrode of the transistor M1 and the source and drain electrodes of the transistor M2.

In the semiconductor device 10E, a conductive layer 112*e* functions as the gate electrode of the transistor M1. The semiconductor layer 109 functioning as the semiconductor layer where the channel of the transistor M1 is formed is provided below the insulating layer 110, and the insulating layers 107 and 110 serve as the gate insulating layer of the transistor M1. Furthermore, the conductive layer 112*a* functions as the one of the source electrode and the drain electrode of the transistor M1 and also as the one of the source electrode and the drain electrode of the transistor M2. The conductive layer 112*d* functions as the other of the source electrode and the drain electrode of the transistor M1. The conductive layer 112*b* functions as the other of the source electrode and the drain electrode of the transistor M2. Thus, the thickness of the gate insulating layer of the transistor M1 in the semiconductor device 10E is larger than the thickness of the gate insulating layer of the transistor M1 in the semiconductor device 10. The one of the source electrode and the drain electrode of the transistor M1 is electrically connected to the one of the source electrode and the drain electrode of the transistor M2. With this structure, the effect similar to that obtained with the semiconductor device 10 can be obtained. In the semiconductor device 10E, since the gate electrode (conductive layer 112*e*) of the transistor M1, the other of the source electrode and the drain electrode (conductive layer 112*b*) of the transistor M2 are both formed over the insulating layer 110, these conductive layers can be formed with the same material and the same process. The number of manufacturing steps can be smaller than that of manufacturing steps of the semiconductor device 10.

Modification Example 6

Figure 7A:
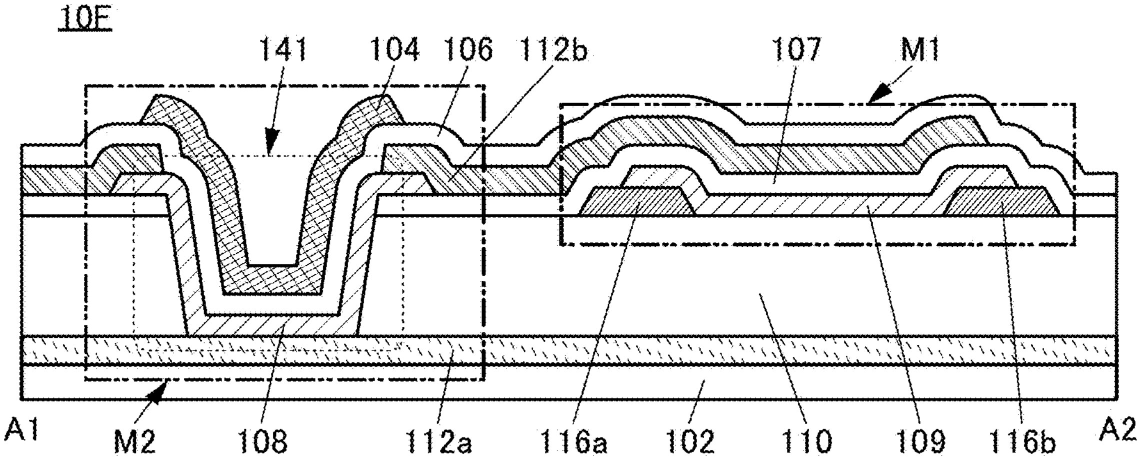
FIGS. 7A to 7C are cross-sectional views illustrating the examples of a semiconductor device.

A semiconductor device 10F illustrated in FIG. 7A is different from the semiconductor device 10 illustrated in FIGS. 1A and 1B in that the other of the source electrode and the drain electrode (conductive layer 112*b*) of the transistor M2 is in contact with a top surface of the semiconductor layer (semiconductor layer 108) where the channel of the transistor M2 is formed and that the bottom surface of the semiconductor layer is in contact with a top surface of the gate insulating layer (insulating layer 107) of the transistor M1. The other components are similar to those in the semiconductor device 10. With this structure, the effect similar to that obtained with the semiconductor device 10 can be obtained.

Modification Example 7

Figure 7B:
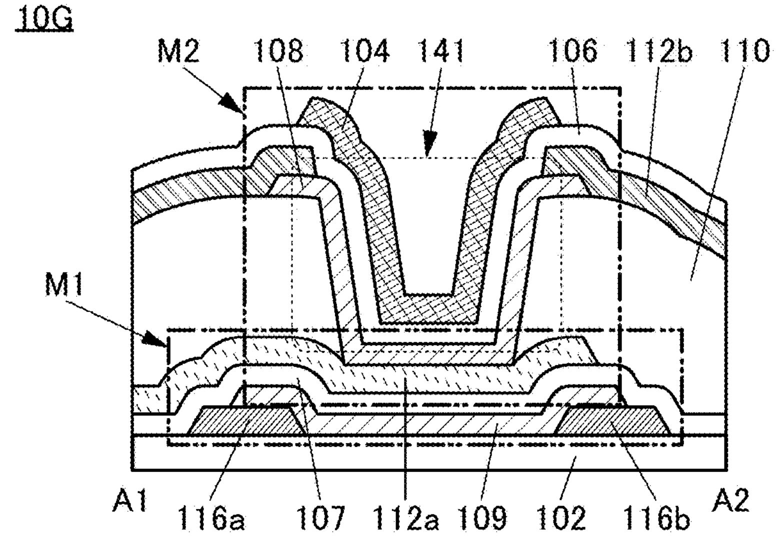

A semiconductor device 10G illustrated in FIG. 7B is different from the semiconductor device 10A illustrated in FIGS. 2A and 2B in that the other of the source electrode and the drain electrode (conductive layer 112*b*) of the transistor M2 is in contact with the top surface of the semiconductor layer (semiconductor layer 108) where the channel of the transistor M2 is formed and that the bottom surface of the semiconductor layer is in contact with the top surface of the insulating layer 110. The other components are similar to those in the semiconductor device 10A. With this structure, the effect similar to that obtained with the semiconductor device 10A can be obtained.

Modification Example 8

Figure 7C:
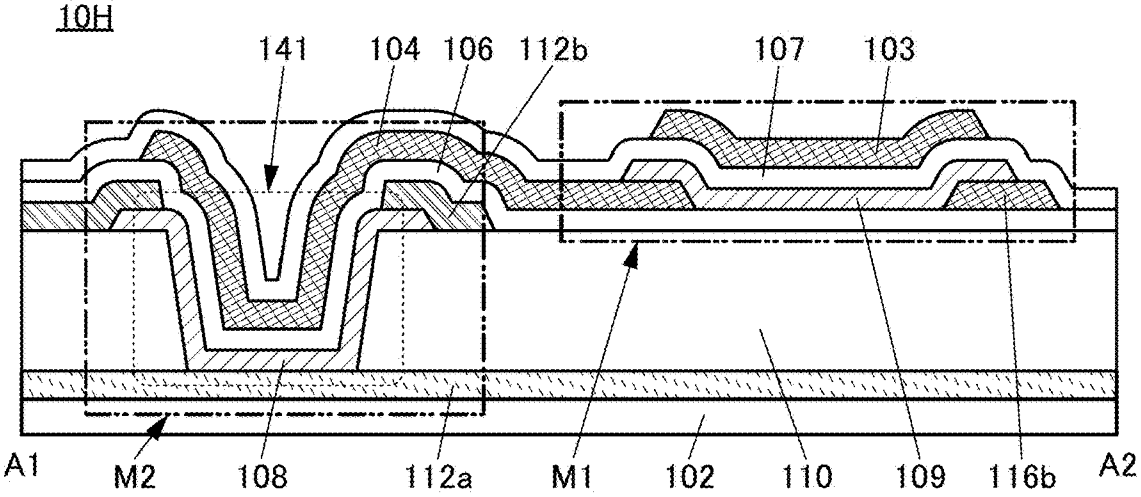

A semiconductor device 10H illustrated in FIG. 7C is different from the semiconductor device 10B illustrated in FIGS. 3A and 3B in that the other of the source electrode and the drain electrode (conductive layer 112*b*) of the transistor M2 is in contact with the top surface of the semiconductor layer (semiconductor layer 108) where the channel of the transistor M2 is formed and that the bottom surface of the semiconductor layer is in contact with the top surface of the insulating layer 110. The other components are similar to those in the semiconductor device 10B. With this structure, the effect similar to that obtained with the semiconductor device 10B can be obtained.

Modification Example 9

Figure 8A:
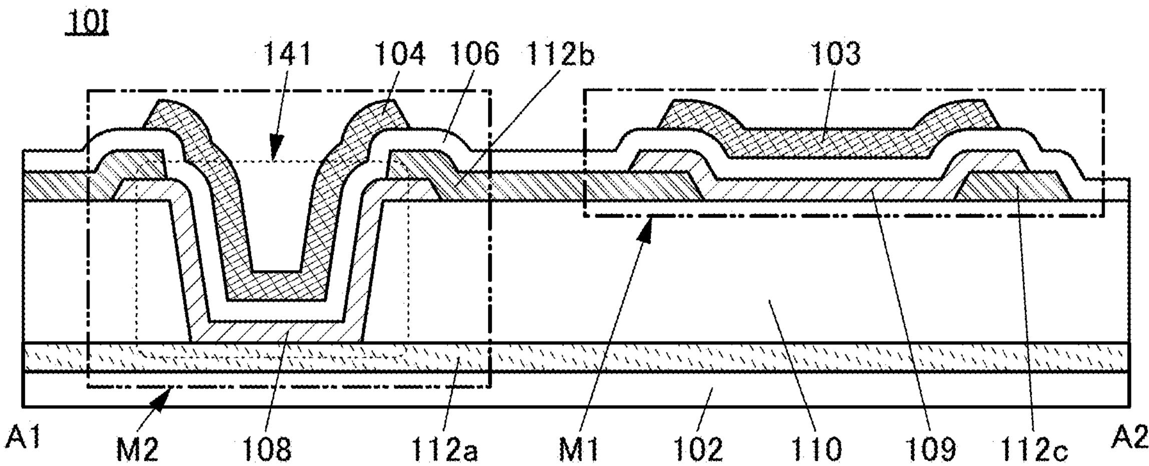
FIGS. 8A to 8C are cross-sectional views illustrating the examples of a semiconductor device.

A semiconductor device 10I illustrated in FIG. 8A is different from the semiconductor device 10C illustrated in FIGS. 4A and 4B in that the other of the source electrode and the drain electrode (conductive layer 112*b*) of the transistor M2 is in contact with the top surface of the semiconductor layer (semiconductor layer 108) where the channel of the transistor M2 is formed and that the bottom surface of the semiconductor layer is in contact with the top surface of the insulating layer 110. The other components are similar to those in the semiconductor device 10C. With this structure, the effect similar to that obtained with the semiconductor device 10C can be obtained.

Modification Example 10

Figure 8B:
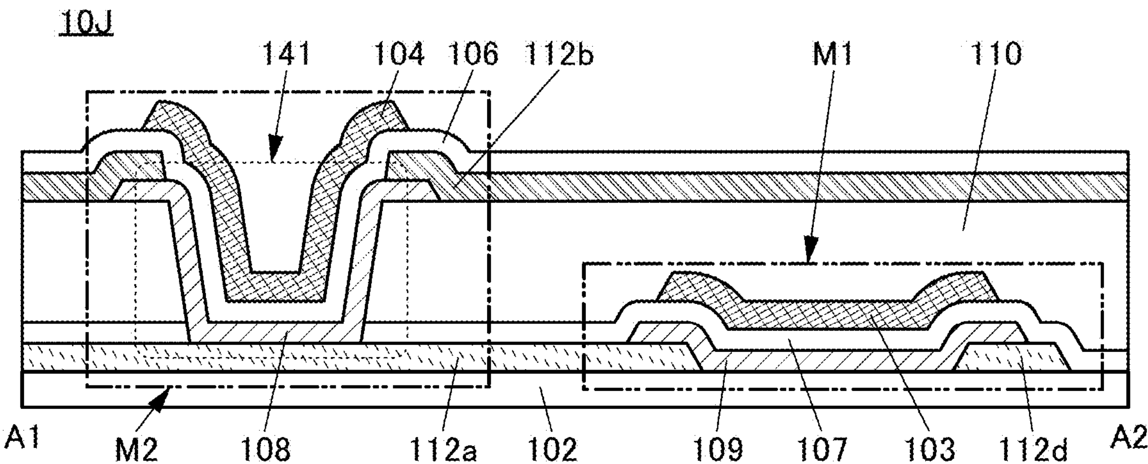

A semiconductor device 10J illustrated in FIG. 8B is different from the semiconductor device 10D illustrated in FIGS. 5A and 5B in that the other of the source electrode and the drain electrode (conductive layer 112*b*) of the transistor M2 is in contact with the top surface of the semiconductor layer (semiconductor layer 108) where the channel of the transistor M2 is formed and that the bottom surface of the semiconductor layer is in contact with the top surface of the insulating layer 110. The other components are similar to those in the semiconductor device 10D. With this structure, the effect similar to that obtained with the semiconductor device 10D can be obtained.

Modification Example 11

Figure 8C:
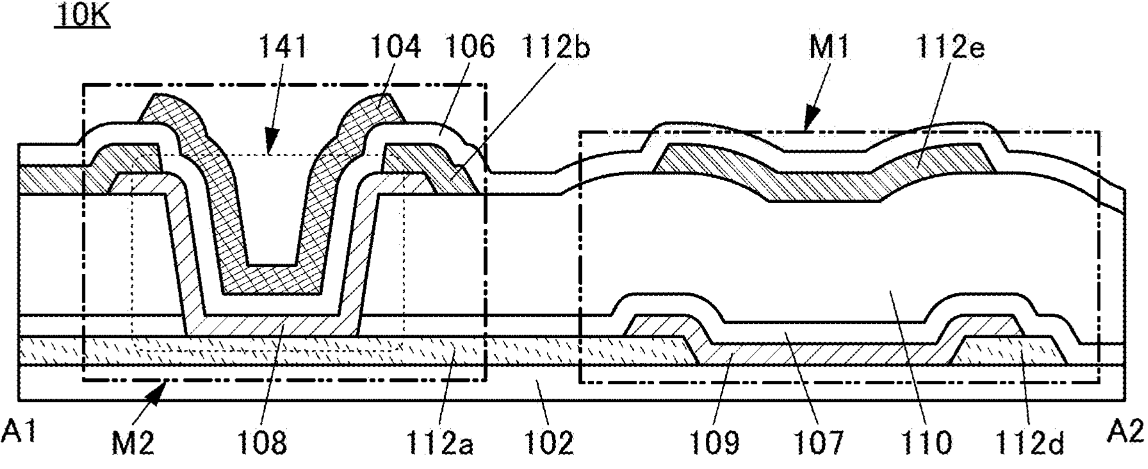

A semiconductor device 10K illustrated in FIG. 8C is different from the semiconductor device 10E illustrated in FIGS. 6A and 6B in that the other of the source electrode and the drain electrode (conductive layer 112*b*) of the transistor M2 is in contact with the top surface of the semiconductor layer (semiconductor layer 108) where the channel of the transistor M2 is formed and that the bottom surface of the semiconductor layer is in contact with the top surface of the insulating layer 110. The other components are similar to those in the semiconductor device 10E. With this structure, the effect similar to that obtained with the semiconductor device 10E can be obtained.

<Example of Manufacturing Method>

Next, an example of a manufacturing method of the semiconductor device 10 is described below. First, materials and formation methods of the layers are described.

[Formation Methods of Layers]

The insulating layers, the semiconductor layers, the conductive layers that form electrodes or wirings, and the like can be formed by any of a sputtering method, a CVD method, a vacuum evaporation method, a pulsed laser deposition (PLD) method, an ALD method, and the like. As the CVD method, a plasma-enhanced CVD (PECVD) method or a thermal CVD method may be used. As an example of the thermal CVD method, a Metal Organic CVD (MOCVD) method may be used.

Insulating layers, semiconductor layers, conductive layers, and the like included in the semiconductor device may be formed by a method such as spin coating, dipping, spray coating, ink jetting, dispensing, screen printing, offset printing, slit coating, roll coating, curtain coating, or knife coating.

By a PECVD method, a high-quality film can be obtained at a relatively low temperature. With the use of a film deposition method that does not use plasma at the time of film deposition such as an MOCVD method, an ALD method, or a thermal CVD method, the formation surface is not easily damaged. For example, a wiring, an electrode, an element (e.g., a transistor or a capacitor), or the like included in a semiconductor device is charged up by receiving charges from plasma in some cases. In that case, accumulated charges might break the wiring, electrode, element, or the like included in the semiconductor device. Conversely, such plasma damage is not caused in the case of using a deposition method that does not use plasma, and thus the yield of a semiconductor device can be increased. Furthermore, as there is no plasma damage during deposition, a film with few defects can be obtained.

Unlike a deposition method in which particles ejected from a target or the like are deposited, a CVD method and an ALD method are deposition methods in which a film is formed by reaction at a surface of an object. Thus, a CVD method and an ALD method are deposition methods that are less likely to be influenced by the shape of an object and thus have favorable step coverage. In particular, an ALD method has excellent step coverage and excellent thickness uniformity, and thus is suitable for the case of covering a surface of an opening with a high aspect ratio, for example. On the other hand, an ALD method has a relatively low deposition rate, and thus is preferably used in combination with another deposition method with a high deposition rate such as a CVD method in some cases.

A CVD method or an ALD method enables control of composition of a film to be obtained with a flow rate ratio of the source gases. For example, in a CVD method or an ALD method, a film with a desired composition can be deposited by adjusting the flow ratio of the source gases. Moreover, by a CVD method or an ALD method, by changing the flow ratio of the source gases during the deposition, a film whose composition is continuously changed can be deposited. In the case where the film is formed while changing the flow rate ratio of the source gases, as compared to the case where the film is formed using a plurality of deposition chambers, time taken for the whole film formation process can be reduced because time taken for transfer and pressure adjustment is omitted. Hence, the productivity of the semiconductor device can be improved in some cases.

When layers (thin films) included in the semiconductor device are processed, a photolithography method or the like can be used for the processing. Alternatively, island-shaped layers may be formed by a deposition method using a blocking mask. Alternatively, a nanoimprinting method, a sandblasting method, a lift-off method, or the like may be used for the processing of the layers. Examples of the photolithography method include a method in which a resist mask is formed over a layer (thin film) to be processed, part of the layer (thin film) is selectively removed using the resist mask as a mask, after which the resist mask is removed, and a method in which a photosensitive layer is formed and then exposed to light and developed to be processed into a desired shape.

In the case of using light in a photolithography method, an i-line (a wavelength of 365 nm), a g-line (a wavelength of 436 nm), and an h-line (a wavelength of 405 nm), or light combining any of them can be used for light exposure. Ultraviolet light, KrF laser light, ArF laser light, or the like can also be used. Furthermore, light exposure may be performed with liquid immersion exposure technique. Furthermore, as the light used for the light exposure, Extreme Ultra-violet (EUV) light or X-rays may be used. Furthermore, instead of the light used for the light exposure, an electron beam can also be used. It is preferable to use Extreme Ultra-violet light, X-rays, or an electron beam because extremely minute processing can be performed. Note that in the case of performing light exposure by scanning of a beam such as an electron beam, a photomask is not needed.

For removal (etching) of the layers (thin films), a dry etching method, a wet etching method, a sandblasting method, or the like can be used. These etching methods may be employed in combination.

An example of a manufacturing method of the semiconductor device 10 is described below.

Figure 9A:
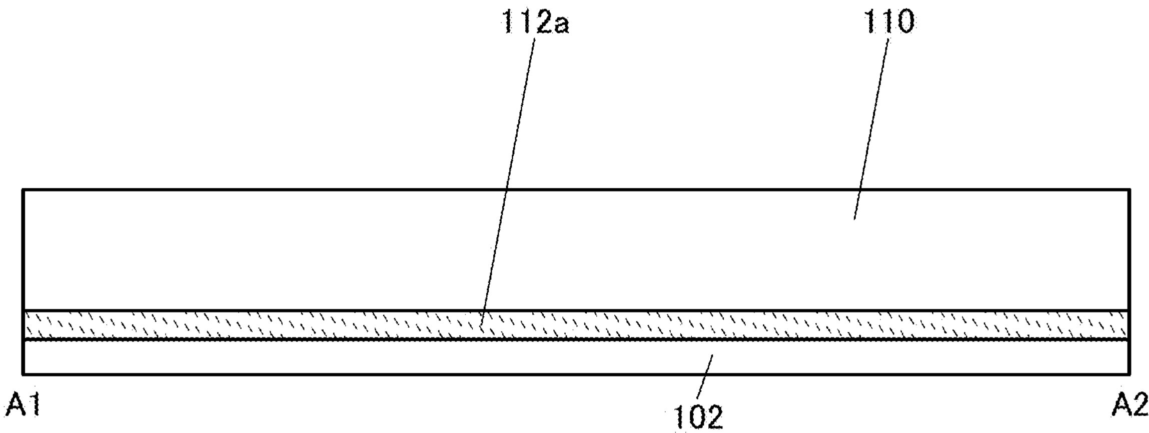
FIGS. 9A to 9C are cross-sectional views illustrating an example of a manufacturing method of a semiconductor device.

First, the conductive layer 112*a* is formed over the substrate 102, and the insulating layer 110 is formed over the conductive layer 112*a* (see FIG. 9A).

As the substrate 102, for example, an insulator substrate having an insulating surface is used. Examples of the insulator substrate include a glass substrate, a quartz substrate, a sapphire substrate, a stabilized zirconia substrate (e.g., an yttria-stabilized zirconia substrate), and a resin substrate.

A semiconductor substrate or a conductor substrate may be used as the substrate 102, as needed. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon or germanium and a compound semiconductor substrate of silicon carbide, silicon germanium, gallium arsenide, indium phosphide, zinc oxide, or gallium oxide. Another example includes a semiconductor substrate in which an insulator region is provided in the above semiconductor substrate, e.g., a silicon on insulator (SOI) substrate. Examples of the conductor substrate include a graphite substrate, a metal substrate, an alloy substrate, and a conductive resin substrate. Other examples include a substrate containing a nitride of a metal, a substrate including an oxide of a metal, an insulator substrate provided with a conductor or a semiconductor, a semiconductor substrate provided with a conductor or an insulator, and a conductor substrate provided with a semiconductor or an insulator. Alternatively, any of these substrates provided with an element may be used. Examples of the elements provided over the substrates include a capacitor, a resistor, a switching element, a light-emitting element, and a memory element.

A conductive film to be the conductive layer 112*a* can be formed with the above-described material by a sputtering method, for example. A resist mask (not illustrated) is formed over the conductive film by a photolithography process, and then the conductive film is processed, whereby the conductive layer 112*a* to be the one of the source electrode and the drain electrode of the transistor M2 later is formed. For processing of the conductive film, one or both of a wet etching method and a dry etching method can be used.

When the conductive layer 112*a* having a function of the one of the source electrode and the drain electrode of the transistor M2 is intended also to have a function of a wiring, a material with low electric resistance is preferably used to form the wiring. That is, the conductive layer 112*a* is preferably formed using a material with low electric resistance. Alternatively, a conductive layer formed using a material whose electric resistance is lower than that of the conductive layer 112*a* is preferably provided over or under the conductive layer 112*a*.

For example, preferably, a conductive oxide material is used for the conductive layer 112*a*, and a metal, an alloy, or a nitride thereof that can be used for the conductive layer 104 or the like described above is used for the conductive layer provided over or under the conductive layer 112*a*. When a conductive layer whose electric resistance is lower than that of the conductive layer 112*a* is in contact with the conductive layer 112*a*, the wiring resistance of the conductive layer 112*a* used as a wiring can be reduced.

The insulating layer 110 can be formed with the above-described material by a PECVD method, for example. The insulating layer 110 may have a stacked structure of two or more layers. The insulating layer 110 with this structure is preferably formed successively in vacuum without exposure of the surfaces of the layers to the air. Such formation can inhibit attachment of atmospherically derived impurities to the surfaces of the layers. Examples of the impurities include water and organic substances.

The substrate temperature at the time of forming the insulating layer 110 is preferably higher than or equal to 180° C. and lower than or equal to 450° C., further preferably higher than or equal to 200° C. and lower than or equal to 450° C., further preferably higher than or equal to 250° C. and lower than or equal to 450° C., further preferably higher than or equal to 300° C. and lower than or equal to 450° C., further preferably higher than or equal to 300° C. and lower than or equal to 400° C., further preferably higher than or equal to 350° C. and lower than or equal to 400° C. With the substrate temperature at the time of forming the insulating layer 110 in the above range, impurities (e.g., water and hydrogen) released from the insulating layer 110 itself can be decreased, which inhibits the diffusion of the impurities to the semiconductor layer 109 formed later. Consequently, a semiconductor device with favorable electrical characteristics and high reliability can be provided.

Since the formation of the insulating layer 110 precedes the formation of the semiconductor layer 109, heat applied in the formation of the insulating layer 110 is unlikely to cause the release of oxygen from the semiconductor layer 109.

Heat treatment may be performed after the insulating layer 110 is formed. By the heat treatment, water and hydrogen can be released from the surface and inside of the insulating layer 110.

The substrate temperature at the time of forming the insulating layer 110 is preferably higher than or equal to 150° C. and lower than the strain point of the substrate, further preferably higher than or equal to 200° C. and lower than or equal to 450° C., further preferably higher than or equal to 250° C. and lower than or equal to 450° C., further preferably higher than or equal to 300° C. and lower than or equal to 450° C., further preferably higher than or equal to 300° C. and lower than or equal to 400° C., further preferably higher than or equal to 350° C. and lower than or equal to 400° C. The heat treatment can be performed in an atmosphere containing one or more of a rare gas, nitrogen, and oxygen. As a nitrogen-containing atmosphere or an oxygen-containing atmosphere, clean dry air (CDA) may be used. Note that the content of hydrogen, water, or the like in the atmosphere is preferably as low as possible. As the atmosphere, a high-purity gas with a dew point of −60° C. or lower, preferably −100° C. or lower is preferably used. With the use of an atmosphere where the content of hydrogen, water, or the like is as low as possible, entry of hydrogen, water, and the like into the insulating layer 110 can be prevented as much as possible. An oven, a rapid thermal annealing (RTA) apparatus, or the like can be used for the heat treatment. With the RTA apparatus, the heat treatment time can be shortened.

Figure 9B:
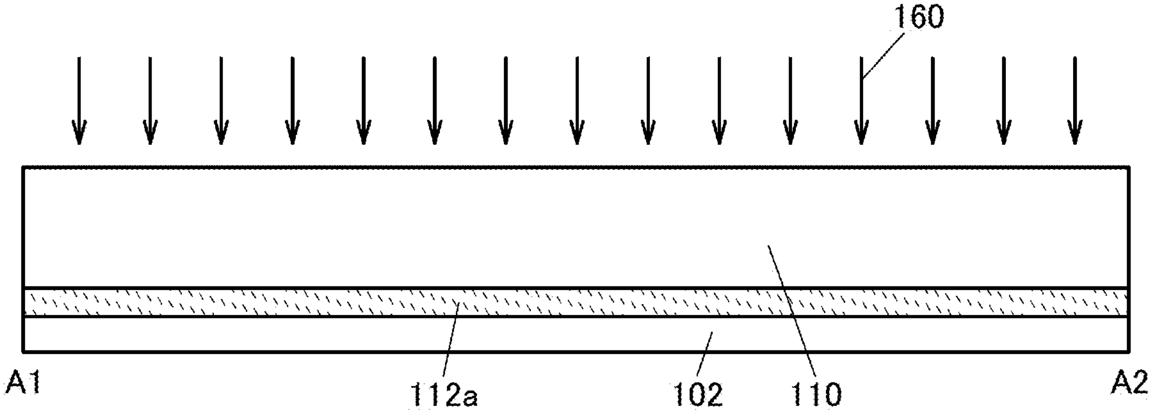

Next, treatment of supplying oxygen 160 to the insulating layer 110 is performed (see FIG. 9B). Examples of the oxygen 160 include an oxygen radical, an oxygen atom, an oxygen atomic ion, and an oxygen molecular ion. The oxygen 160 can be supplied by, for example, an ion implantation method, an ion doping method, a plasma immersion ion implantation method, plasma treatment, or the like.

For the plasma treatment, an apparatus with which an oxygen gas is made to be plasma by high-frequency power (also referred to as a plasma etching apparatus or a plasma ashing apparatus) is preferably used. For example, plasma treatment in an atmosphere containing oxygen may be performed. Alternatively, oxygen may be supplied to the insulating layer 110 by plasma treatment in an atmosphere containing an oxidizing gas such as dinitrogen monoxide ($N_2O$). When plasma treatment using a dinitrogen monoxide gas is performed, an organic substance on the surface of the insulating layer 110 can be favorably removed and oxygen can be supplied to the insulating layer 110.

Figure 9C:
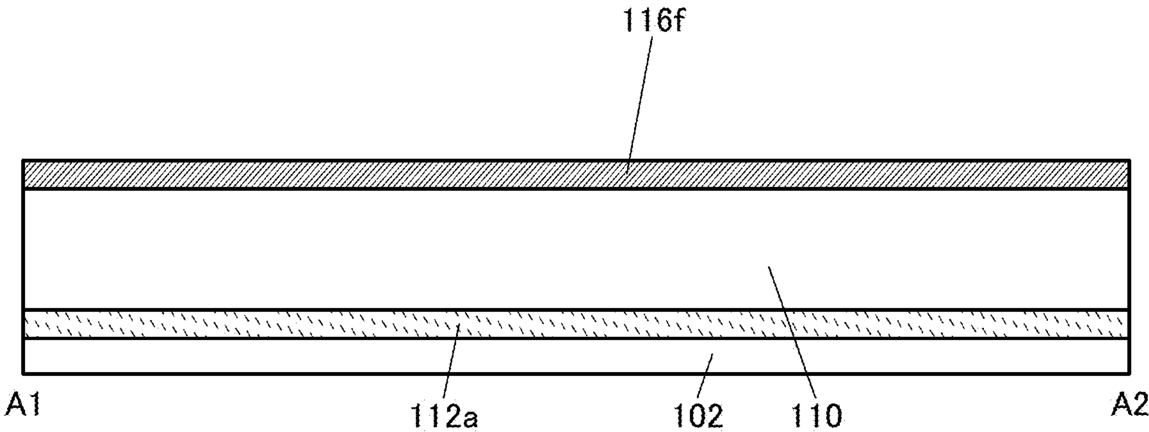

Then, a conductive film 116*f* to be the conductive layers 116*a* and 116*b* later is formed over the insulating layer 110 (see FIG. 9C). The conductive film 116*f* can be formed with the above-described material by a sputtering method, for example.

Figure 10A:
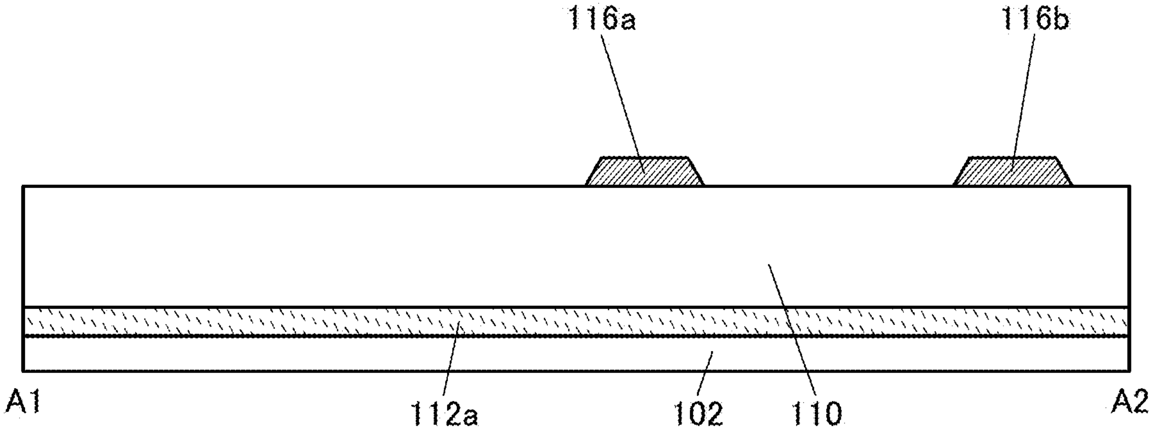
FIGS. 10A to 10C are cross-sectional views illustrating an example of a manufacturing method of a semiconductor device.

Next, a resist mask (not illustrated) is formed over the conductive film 116*f* by a photolithography process, and then the conductive film is processed, whereby the conductive layers 116*a* and 116*b* are formed (see FIG. 10A). The conductive layers 116*a* and 116*b* are to be the source and drain electrodes of the transistor M1 later. For the formation of the conductive layers 116*a* and 116*b*, either one or both of a wet etching method and a dry etching method can be used. For example, a wet etching method can be suitably used for formation of the conductive layers 116*a* and 116*b*.

At the time of forming the conductive layers 116*a* and 116*b*, the thickness of the insulating layer 110 in the region overlapping with neither the conductive layer 116*a* nor 116*b* is sometimes smaller than the thickness of the insulating layer 110 in the region overlapping with the conductive layers 116*a* and 116*b*.

After the conductive layers 116*a* and 116*b* are formed, cleaning treatment may be performed. As the cleaning treatment, wet cleaning using a cleaning solution or the like or cleaning by plasma treatment using plasma can be employed. Such cleaning methods may be performed in combination as appropriate. By performing the cleaning treatment, impurities (e.g., metal and an organic substance) attached on the surface of the insulating layer 110 at the time of forming the conductive layers 116*a* and 116*b* can be removed.

For the wet cleaning, for example, a cleaning solution containing at least one of phosphoric acid, oxalic acid, and hydrochloric acid can be used. A cleaning solution containing phosphoric acid is preferably used for the wet cleaning. The concentration of a cleaning solution is preferably determined in consideration of the etching rate of the insulating layer 110.

For the plasma treatment, for example, a gas containing at least one of oxygen, ozone, nitrogen, dinitrogen monoxide ($N_2O$), and argon can be used. An oxygen-containing gas is preferably used for the plasma treatment. In particular, with the use of a gas containing dinitrogen monoxide ($N_2O$), an organic substance on the surface of the insulating layer 110 can be favorably removed. The plasma treatment can be performed with a PECVD apparatus or an etching apparatus, for example.

Figure 10B:
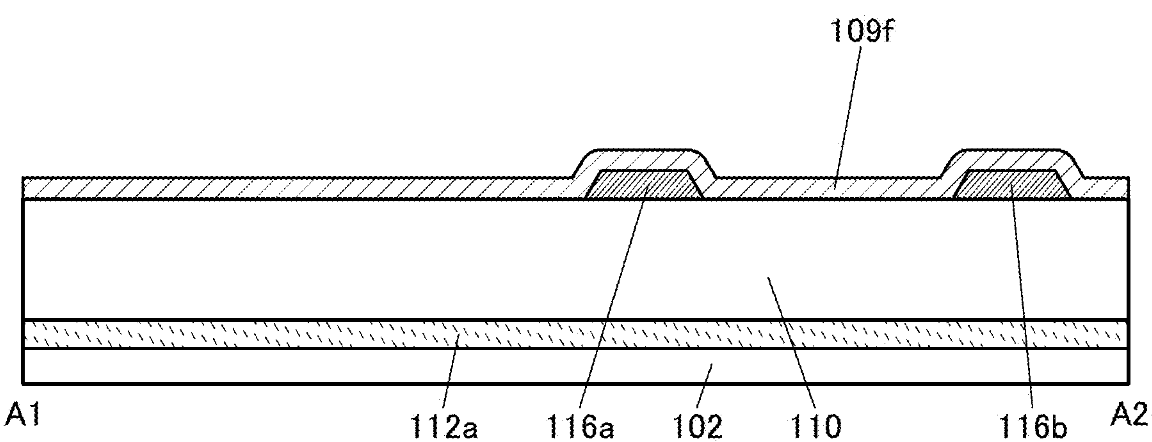

Then, a metal oxide film 109*f* to be the semiconductor layer 109 later is formed over the conductive layers 116*a* and 116*b* and the insulating layer 110 (see FIG. 10B). The metal oxide film 109*f* is preferably formed by a sputtering method using a metal oxide target.

The metal oxide film 109*f* is preferably a dense film with as few defects as possible. The metal oxide film 109*f* is preferably a highly purified film in which impurities containing hydrogen elements are reduced as much as possible. It is particularly preferable to use a metal oxide film having crystallinity as the metal oxide film 109*f*.

In forming the metal oxide film 109*f*, an oxygen gas is preferably used. For example, in the case of using an oxygen gas at the time of forming the metal oxide film 109*f*, oxygen can be favorably supplied to the insulating layer 110.

Oxygen supply to the insulating layer 110 enables the semiconductor layer 109 to be supplied with oxygen in a later step, whereby oxygen vacancies ($V_O$) and defects of oxygen vacancies into which hydrogen enters (hereinafter, also referred to as $V_OH$) in the semiconductor layer 109 can be reduced.

In forming the metal oxide film 109*f*, an oxygen gas and an inert gas (such as a helium gas, an argon gas, or a xenon gas) may be mixed. The higher the proportion of the oxygen gas in the whole formation gas (oxygen flow rate ratio) is in forming the metal oxide film 109*f*, the higher the crystallinity of the metal oxide film 109*f* can be, achieving the highly reliable transistor M1. By contrast, the lower the oxygen flow rate ratio is, the lower the crystallinity of the metal oxide film 109*f* is, offering the transistor M1 with increased on-state current.

In forming the metal oxide film 109*f*, as the substrate temperature becomes higher, the denser metal oxide film 109*f* having higher crystallinity can be formed. On the other hand, as the substrate temperature becomes lower, the metal oxide film 109*f* having lower crystallinity and higher electric conductivity can be formed.

The metal oxide film 109*f* is formed at a substrate temperature higher than or equal to room temperature and lower than or equal to 250° C., preferably higher than or equal to room temperature and lower than or equal to 200° C., further preferably higher than or equal to room temperature and lower than or equal to 140° C. For example, the substrate temperature is preferably set to be higher than or equal to room temperature and lower than or equal to 140° C. because the productivity is increased. When the metal oxide film 109*f* is formed at a substrate temperature set to room temperature or without heating the substrate, the metal oxide film 109*f* can have low crystallinity.

In the case where the semiconductor layer 109 has a stacked-layer structure, an upper metal oxide film is preferably formed successively after the formation of a lower metal oxide film without exposure of the surface of the lower metal oxide film to the air.

Heat treatment may be carried out after the formation of the metal oxide film 109*f*. By the heat treatment, water or hydrogen can be released from the surface and inside of the metal oxide film 109*f*. By the heat treatment, oxygen can also be supplied from the insulating layer 110 to the metal oxide film 109*f*. Furthermore, the film quality of the metal oxide film 109*f* is improved (e.g., the number of defects is reduced or crystallinity is increased) by the heat treatment in some cases. For the heat treatment, the conditions for the above heat treatment that can be used after the formation of the insulating layer 110 can be used.

Note that the heat treatment is not necessarily performed. The heat treatment is not necessarily performed in this step, and heat treatment performed in a later step may also serve as the heat treatment in this step. In some cases, treatment at a high temperature (e.g., film formation step) or the like in a later step can serve as the heat treatment in this step.

Figure 10C:
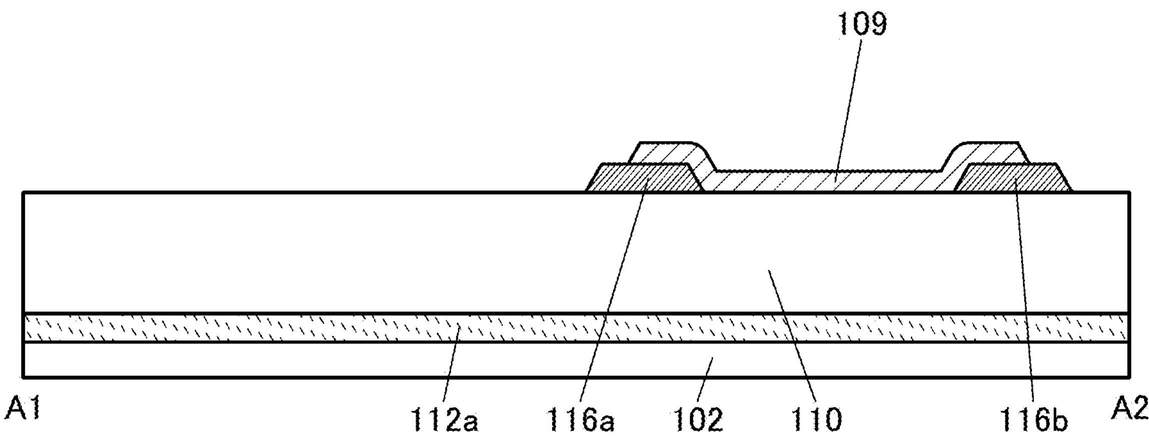

Next, the metal oxide film 109*f* is processed into an island shape to form the semiconductor layer 109 in contact with the side and top surfaces of the side end portions of the conductive layers 116*a* and 116*b*, which face each other, and the top surface of the insulating layer 110 in the region interposed between the conductive layers 116*a* and 116*b* (see FIG. 10C).

For the formation of the semiconductor layer 109, either one or both of a wet etching method and a dry etching method can be used. For example, a wet etching method can be suitably used to form the semiconductor layer 109. At this time, part of the insulating layer 110 in the region that does not overlap with the semiconductor layer 109 is etched and thinned in some cases. Note that in the etching of the metal oxide film 109*f*, the reduction in the thickness of the insulating layer 110 can be inhibited when a material having a high etching selectivity is used for the insulating layer 110. In some cases, the conductive layers 116*a* and 116*b* in the region that does not overlap with the semiconductor layer 109 are also partly etched to be thinner than the conductive layers 116*a* and 116*b* in the region that overlaps with the semiconductor layer 109.

Figure 11A:
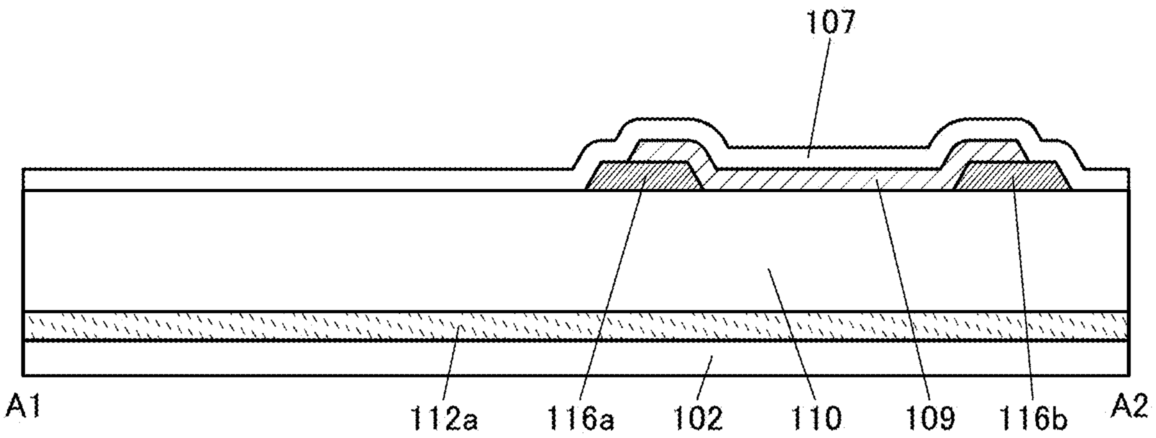
FIGS. 11A to 11C are cross-sectional views illustrating an example of a manufacturing method of a semiconductor device.

Next, the insulating layer 107 to be the gate insulating layer of the transistor M1 later is formed over the semiconductor layer 109, the conductive layers 116*a* and 116*b*, and the insulating layer 110 (see FIG. 11A). The insulating layer 107 can be formed with the above-described material by a PECVD method or the like, for example.

When an oxide semiconductor is used for the semiconductor layer 109, an insulating material in which oxygen is contained and hydrogen is reduced is preferably used for the insulating layer 107. Thus, the semiconductor layer 109 including a region in contact with the insulating layer 107 is less likely to have n-type conductivity. In addition, oxygen can be supplied from the insulating layer 107 to the semiconductor layer 109 efficiently, and accordingly, oxygen vacancies ($V_O$) in the semiconductor layer 109 can be reduced. The semiconductor layer 109 functions as the semiconductor layer where the channel of the transistor M1 is formed later. Thus, the insulating layer 107 using the material described above allows the transistor M1 to have favorable electrical characteristics and high reliability.

When the temperature at the time of forming the insulating layer 107 functioning as the gate insulating layer of the transistor M1 is increased, defects in the insulating layer 107 can be reduced. However, the high temperature at the time of forming the insulating layer 107 sometimes allows release of oxygen from the semiconductor layer 109, which increases the oxygen vacancies ($V_O$) and $V_O$H in the semiconductor layer 109. The substrate temperature at the time of forming the insulating layer 107 is preferably higher than or equal to 180° C. and lower than or equal to 450° C., further preferably higher than or equal to 200° C. and lower than or equal to 450° C., further preferably higher than or equal to 250° C. and lower than or equal to 450° C., further preferably higher than or equal to 300° C. and lower than or equal to 450° C., further preferably higher than or equal to 300° C. and lower than or equal to 400° C. With the substrate temperature at the time of forming the insulating layer 107 in the above range, release of oxygen from the semiconductor layer 109 can be inhibited while the defects in the insulating layer 107 can be reduced. Consequently, the transistor M1 can have favorable electrical characteristics and high reliability.

Before the formation of the insulating layer 107, a surface of the semiconductor layer 109 may be subjected to plasma treatment. By the plasma treatment, impurities such as water adsorbed on the surface of the semiconductor layer 109 can be reduced. Accordingly, impurities at the interface between the semiconductor layer 109 and the insulating layer 107 can be reduced, enabling the transistor M1 to have high reliability. The plasma treatment is particularly preferable in the case where the surface of the semiconductor layer 109 is exposed to the air in the process from formation of the semiconductor layer 109 to formation of the insulating layer 107. The plasma treatment can be performed in an atmosphere of oxygen, ozone, nitrogen, dinitrogen monoxide, argon, or the like. The plasma treatment and the formation of the insulating layer 107 are preferably performed successively without exposure to the air.

Figure 11B:
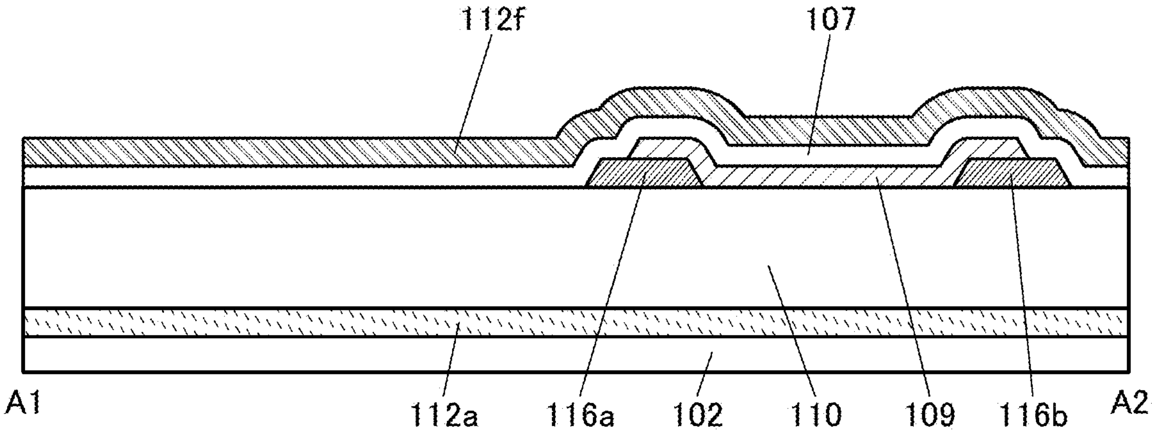

Then, a conductive film 112*f* to be the conductive layer 112*b* later is formed over the insulating layer 107 (see FIG. 11B). The conductive film 112*f* can be formed with the above-described material by a sputtering method, for example.

Figure 11C:
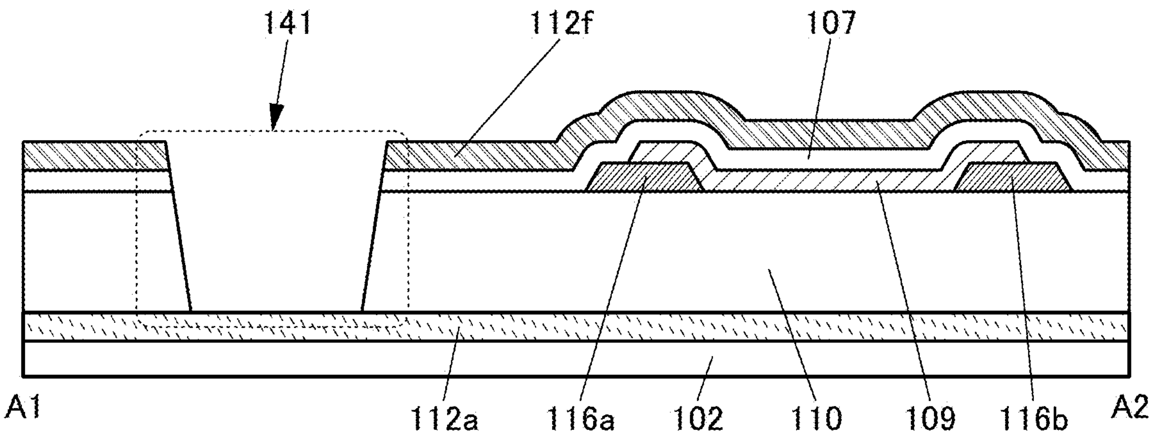

Next, a resist mask (not illustrated) is formed over the conductive film 112*f* that does not overlap with the position where the transistor M2 is formed later by a photolithography process, and then the conductive film 112*f*, the insulating layer 107, and the insulating layer 110 are each processed, whereby the opening 141 is formed (see FIG. 11C). As the method of forming the opening 141, at least one of a wet etching method and a dry etching method can be used. The opening 141 can be suitably formed by a dry etching method, for example.

Figure 12A:
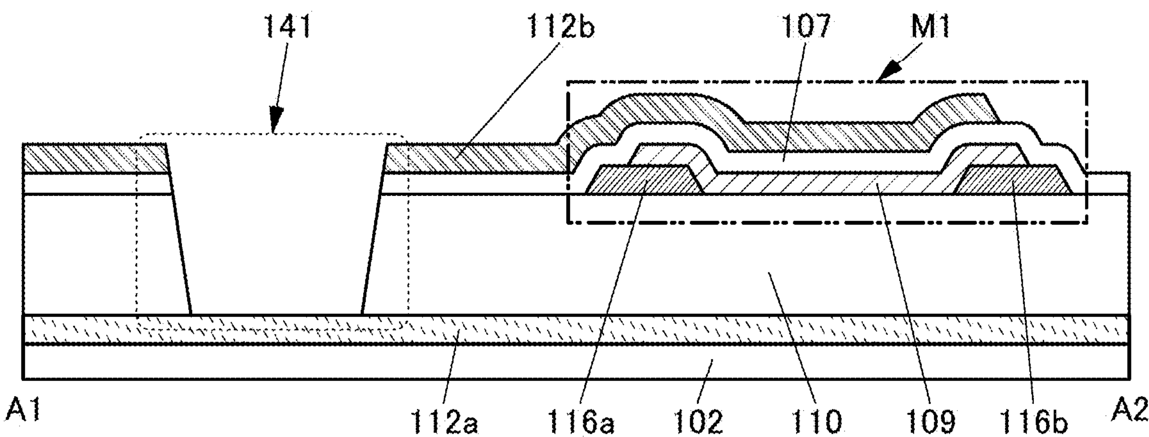
FIGS. 12A to 12C are cross-sectional views illustrating an example of a manufacturing method of a semiconductor device.

Next, a resist mask (not illustrated) is formed over the conductive film 112*f* that overlaps with the position to be the gate electrode of the transistor M1 later by a photolithography process, and then the conductive film is processed, whereby the conductive layer 112*b* is formed (see FIG. 12A). For the formation of the conductive layer 112*b*, either one or both of a wet etching method and a dry etching method can be used. A wet etching method can be suitably used for formation of the conductive layer 112*b*.

Through the above steps, the transistor M1 is formed.

Figure 12B:
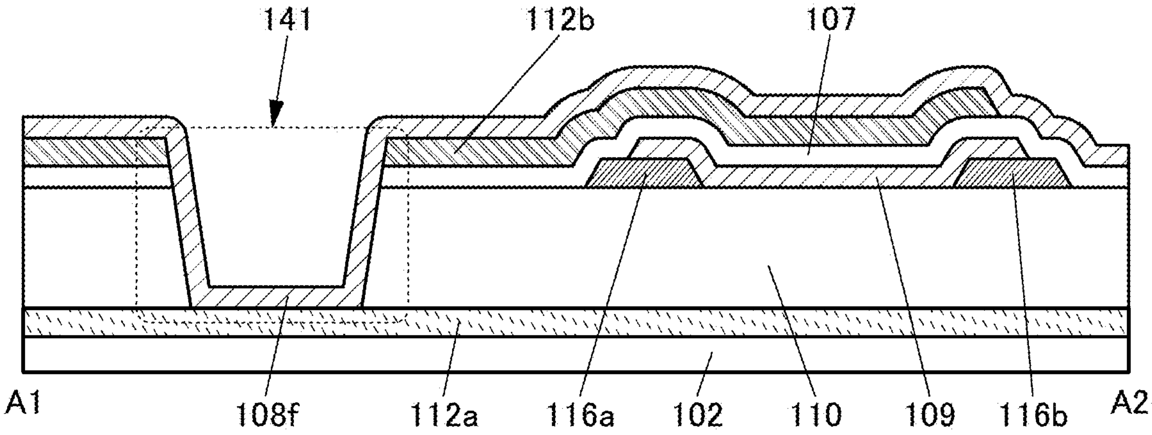
Figure 12C:
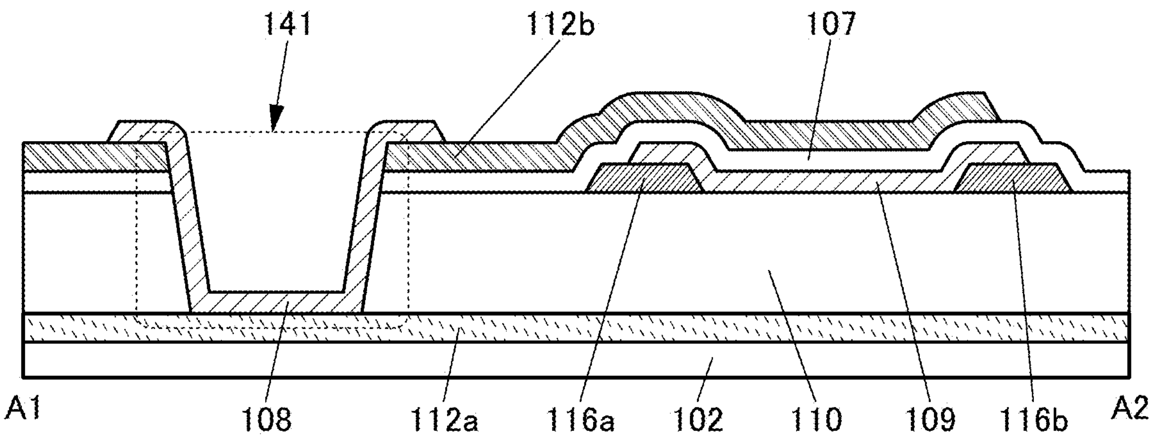

Next, the metal oxide film 108*f* to be the semiconductor layer 108 later is formed to cover the inner wall of the opening 141 (part of the top surface of the conductive layer 112*a*, the side surface of the insulating layer 110, the side surface of the insulating layer 107, and the side surface of the conductive layer 112*b*), the top surface of the conductive layer 112*b*, and part of the top surface of the insulating layer 107 (see FIG. 12B). The metal oxide film 108*f* is preferably formed by a sputtering method using a metal oxide target.

The conditions of the formation and the subsequent heat treatment of the metal oxide film **109*f* described above can be referred to for those of the metal oxide film 108*f***.

Next, the metal oxide film **108*f* is processed into an island shape to include a region overlapping with the inner wall of the opening 141, whereby the semiconductor layer 108 is formed (see FIG. 12**C).

For the formation of the semiconductor layer 108, either one or both of a wet etching method and a dry etching method can be used. For example, a wet etching method can be suitably used to form the semiconductor layer 108.

Figure 13A:
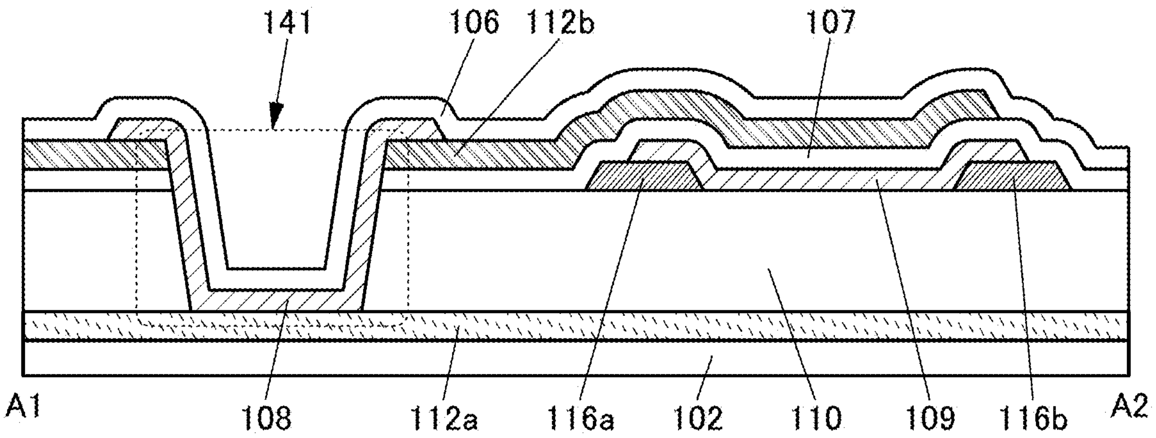
FIGS. 13A to 13C are cross-sectional views illustrating an example of a manufacturing method of a semiconductor device.

Next, the insulating layer 106 to be the gate insulating layer of the transistor M2 later is formed over the semiconductor layer 108, the conductive layer **112*b*, and the insulating layer 107 (see FIG. 13A). The insulating layer 106** can be formed with the above-described material by a PECVD method or the like, for example.

The conditions of the formation of the insulating layer 107 and the plasma treatment of the semiconductor layer 109 prior to the formation of the insulating layer 107 described above can be referred to for the conditions of the formation of the insulating layer 106 and the plasma treatment of the semiconductor layer 108 prior to the formation of the insulating layer 106.

Figure 13B:
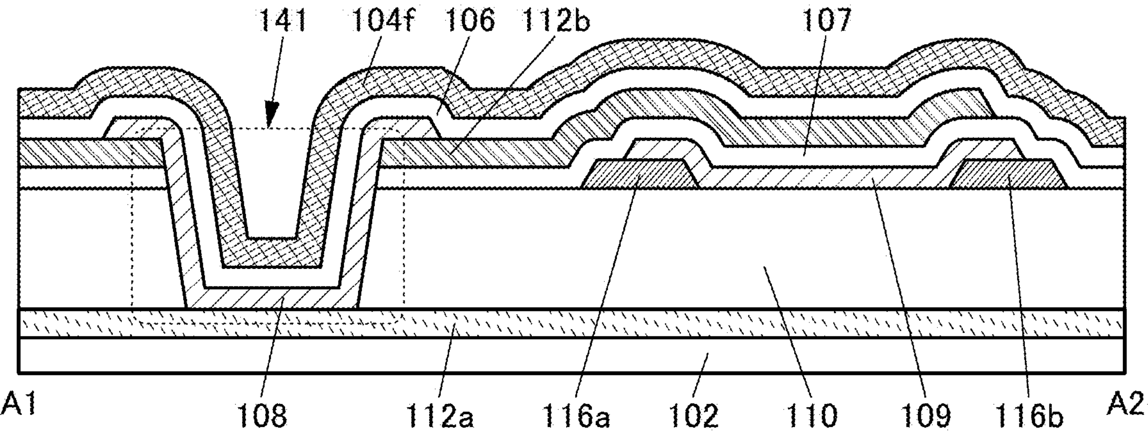

Then, a conductive film **104*f* to be the conductive layer 104 later is formed over the insulating layer 106 (see FIG. 13B). The conductive film 104** can be formed with the above-described material by a sputtering method, for example.

Figure 13C:
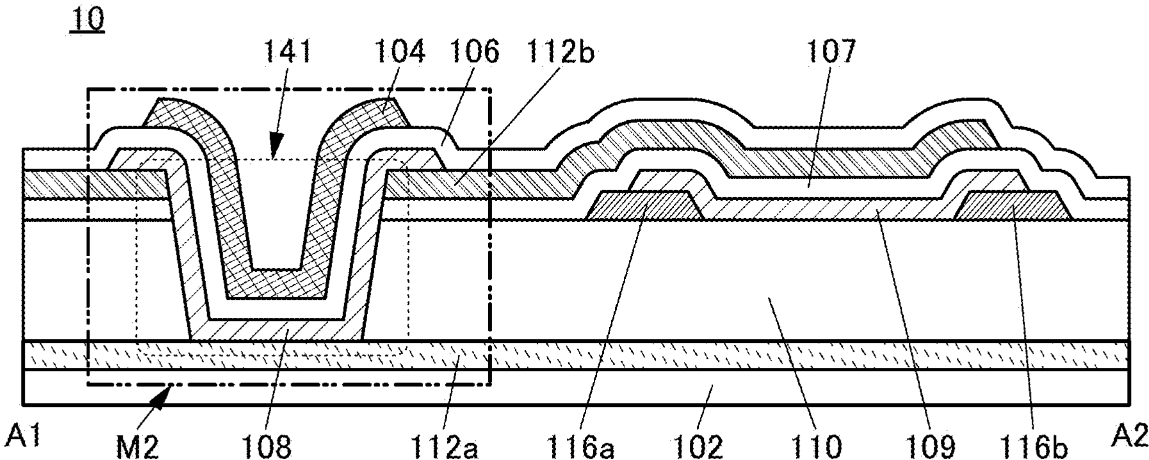

Next, a resist mask (not illustrated) is formed over the conductive film **104*f* to include a region overlapping with the opening 141, and then the conductive film is processed, whereby the conductive layer 104 is formed (see FIG. 13C). For the formation of the conductive layer 104, either one or both of a wet etching method and a dry etching method can be used. For example, a wet etching method can be suitably used to form the conductive layer 104**.

Through the above process, the transistor M2 is formed.

Thus, the semiconductor device 10 of one embodiment of the present invention, which includes the transistors M1 and M2, can be fabricated (FIGS. 1A and 1).

As described above, the semiconductor device of one embodiment of the present invention can be applied to a pixel circuit of a display apparatus, for example. Configuration examples of the pixel circuit to which the semiconductor device of one embodiment of the present invention can be applied are described below.

<Configuration Example of Pixel Circuit>

FIGS. 14A to 14D and FIGS. 15A to 15D show the configuration examples of a pixel 230 of a display apparatus to which the semiconductor device of one embodiment of the present invention can be applied. The pixel 230 includes a pixel circuit 51 (a pixel circuit 51A, a pixel circuit 51B, a pixel circuit 51C, or a pixel circuit 51D) and a light-emitting device 61.

The term light-emitting device in this embodiment and the like refers to a self-luminous display device (also referred to as a display element) such as an organic light-emitting element (also referred to as an organic LED (OLED)). Note that the light-emitting element electrically connected to the pixel circuit can be a self-luminous light-emitting element such as an LED, a micro LED, a quantum-dot LED (QLED), or a semiconductor laser.

Figure 14A:
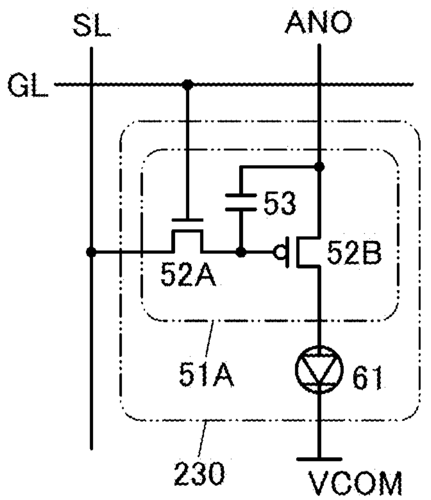
FIGS. 14A to 14D are circuit diagrams of pixel circuits.

The pixel circuit 51A illustrated in FIG. 14A is a 2Tr1C pixel circuit including transistors 52A and 52B and a capacitor 53.

One of a source and a drain of the transistor 52A is electrically connected to a wiring SL and a gate of the transistor 52A is electrically connected to a wiring GL. The other of the source and the drain of the transistor 52A is electrically connected to a gate of the transistor 52B. One of a source and a drain of the transistor 52B and one terminal of the capacitor 53 are electrically connected to a wiring ANO. The other terminal of the capacitor 53 is electrically connected to the gate of the transistor 52B. The other of the source and the drain of the transistor 52B is electrically connected to an anode of the light-emitting element 61. A cathode of the light-emitting device 61 is electrically connected to a wiring VCOM.

The wiring GL corresponds to the conductive layer 104 of the semiconductor device 10, and the wiring SL corresponds to the conductive layer **112*a* of the semiconductor device 10. The wiring VCOM supplies a potential for supplying a current to the light-emitting device 61. The transistor 52A has a function of controlling the conduction state or the non-conduction state between the wiring SL and the gate of the transistor 52**B on the basis of the potential of the wiring GL. For example, VDD is supplied to the wiring ANO and VSS is supplied to the wiring VCOM.

The transistor 52B has a function of controlling the amount of current flowing through the light-emitting device 61. The capacitor 53 has a function of retaining a gate potential of the transistor 52B. The intensity of light emitted by the light-emitting device 61 can be controlled in accordance with an image signal supplied to the gate of the transistor 52B.

Figure 14B:
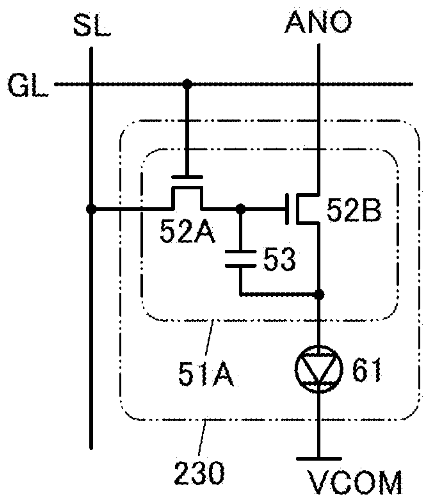

In the pixel circuit 51A illustrated in FIG. 14A, an n-channel transistor is used as the transistor 52A and a p-channel transistor is used as the transistor 52B. Note that an n-channel transistor may be used as the transistor 52B in the pixel circuit 51A as illustrated in FIG. 14B. When an n-channel transistor is used as the transistor 52B, one terminal of the capacitor 53 can be electrically connected to the other of the source or the drain of the transistor 52B.

The semiconductor device of one embodiment of the present invention can be used in the pixel circuit 51A illustrated in FIG. 14B. For example, the transistor M2 and the transistor M1 included in the semiconductor device illustrated in any of FIGS. 1A and 1B, FIGS. 2A and 2B, and FIGS. 7A and 7B can be used as the transistor 52A and the transistor 52B, respectively, included in the pixel circuit 51A.

For example, the transistor M1 and the transistor M2 included in the semiconductor device illustrated in any of FIGS. 3A and 3B and FIG. 7C can be used as the transistor 52A and the transistor 52B, respectively, included in the pixel circuit 51A.

Figure 14C:
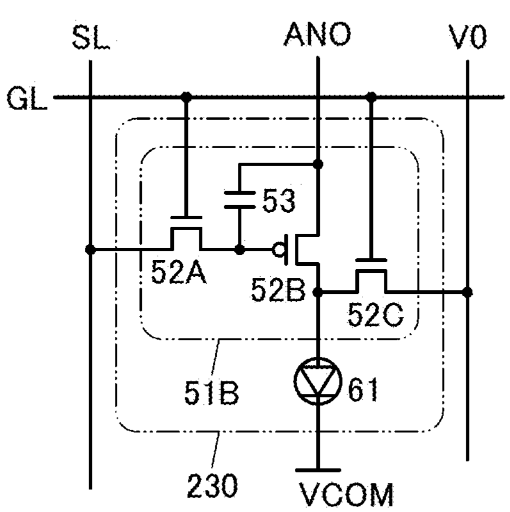

When a p-channel transistor is used as the transistor 52B, a circuit configuration of the pixel circuit 51B in FIG. 14C may be employed. The pixel circuit 51B illustrated in FIG. 14C is a 3Tr1C pixel circuit including the transistors 52A and 52B, a transistor 52C, and the capacitor 53. The pixel circuit 51B illustrated in FIG. 14C has a configuration in which the transistor 52C is added to the pixel circuit 51A illustrated in FIG. 14A.

Figure 14D:
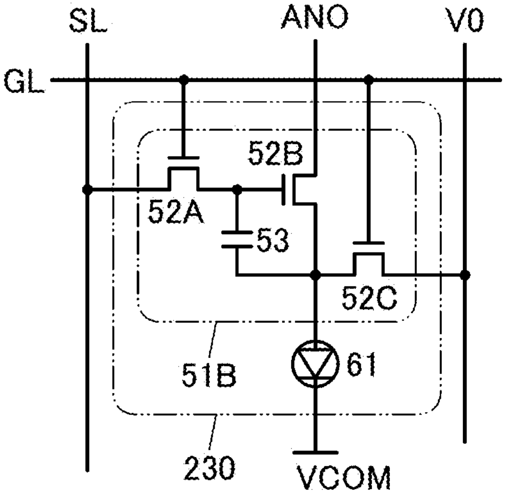

When an n-channel transistor is used as the transistor 52B, a circuit configuration of the pixel circuit 51B in FIG. 14D may be employed. The pixel circuit 51B illustrated in FIG. 14D has a configuration in which the transistor 52C is added to the pixel circuit 51A in FIG. 14D.

One of a source and a drain of the transistor 52C is electrically connected to the other of the source and the drain of the transistor 52B in the pixel circuit 51B in FIG. 14C and the pixel circuit 51B in FIG. 14D. The other of the source and the drain of the transistor 52C is electrically connected to a wiring V0. For example, a reference potential is supplied to the wiring V0.

The transistor 52C has a function of controlling the conduction state or the non-conduction state between the other of the source or the drain of the transistor 52B and the wiring V0 on the basis of the potential of the wiring GL. The wiring V0 is a wiring for supply of a reference potential. When an n-channel transistor is used as the transistor 52B, variations in the gate-source voltage of the transistor 52B can be reduced by the reference potential of the wiring V0 supplied through the transistor 52C.

A current value that can be used for setting of pixel parameters can be obtained with the use of the wiring V0. Specifically, the wiring V0 can function as a monitor line for outputting a current flowing in the transistor 52B or a current flowing in the light-emitting device 61 to the outside. A current output to the wiring V0 is converted into a voltage by a source follower circuit or the like and can be output to the outside. Alternatively, the current is converted into a digital signal by an A/D converter or the like and can be output to the outside.

The semiconductor device of one embodiment of the present invention can be used in the pixel circuit 51B illustrated in FIG. 14D. For example, the transistor M2 and the transistor M1 included in the semiconductor device illustrated in any of FIGS. 1A and 1B, FIGS. 2A and 2B, and FIGS. 7A and 7B can be used as the transistor 52A and the transistor 52B, respectively, included in the pixel circuit 51B.

For example, the transistor M1 and the transistor M2 included in the semiconductor device illustrated in any of FIGS. 3A and 3B and FIG. 7C can be used as the transistor 52A and the transistor 52B, respectively, included in the pixel circuit 51B.

For example, the transistor M1 (transistor M2) and the transistor M2 (transistor M1) included in the semiconductor device illustrated in any of FIGS. 4A and 4B, FIGS. 5A and 5B, FIGS. 6A and 6B, and FIGS. 8A to 8C and can be used as the transistor 52B and the transistor 52C, respectively, included in the pixel circuit 51B.

Figure 15A:
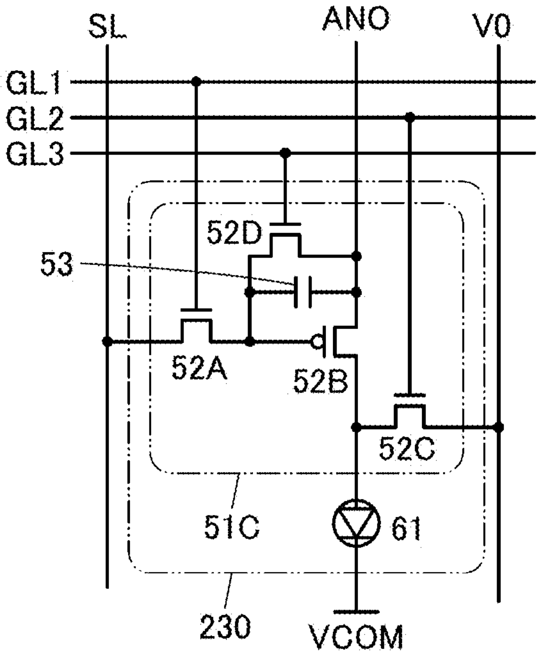
FIGS. 15A to 15D are circuit diagrams illustrating pixel circuits.

The pixel circuit 51C illustrated in FIG. 15A has a configuration in which a transistor 52D is added to the pixel circuit 51B illustrated in FIG. 14C. The pixel circuit 51C illustrated in FIG. 15A is a 4Tr1C pixel circuit including the transistors 52A, 52B, 52C, and 52D and the capacitor 53.

One of a source and a drain of the transistor 52D is electrically connected to the wiring ANO, and the other is electrically connected to the other of the source and the drain of the transistor 52A, the other terminal of the capacitor 53, and the gate of the transistor 52B.

A wiring GL1, a wiring GL2, and a wiring GL3 are electrically connected to the pixel circuit 51C. In this embodiment and the like, the wirings GL1, GL2, and GL3 are collectively referred to as the wiring GL in some cases. Thus, the wiring GL may be one wiring or a plurality of wirings.

The wiring GL1 is electrically connected to a gate of the transistor 52A, the wiring GL2 is electrically connected to a gate of the transistor 52C, and the wiring GL3 is electrically connected to a gate of the transistor 52D.

When the transistor 52D is turned on, the source and the gate of the transistor 52B have the same potential, so that the transistor 52B can be turned off. Thus, a current flowing to the light-emitting device 61 can be blocked forcibly. Such a pixel circuit is suitable for the case of using a display method in which a display period and an off period are alternately provided. The transistor 52C may be turned on at the same time when the transistor 52D is turned on.

The semiconductor device of one embodiment of the present invention can be used in the pixel circuit 51C illustrated in FIG. 15A. For example, the transistor M1 (transistor M2) and the transistor M2 (transistor M1) included in the semiconductor device illustrated in any of FIGS. 4A and 4B, FIGS. 5A and 5B, FIGS. 6A and 6B, and FIGS. 8A to 8C can be used as the transistor 52A and the transistor 52D, respectively, included in the pixel circuit 51C.

Figure 15B:
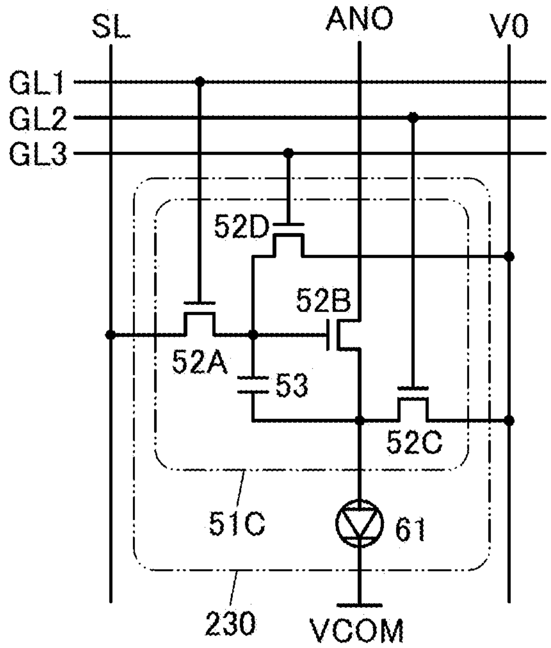

In the pixel circuit 51C illustrated in FIG. 15A, n-channel transistors are used as the transistors 52A, 52C, and 52D and a p-channel transistor is used as the transistor 52B. Note that an n-channel transistor may be used as the transistor 52B in the pixel circuit 51C as illustrated in FIG. 15B. When an n-channel transistor is used as the transistor 52B, one terminal of the capacitor 53 can be electrically connected to the other of the source or the drain of the transistor 52B. The one of the source and the drain of the transistor 52D is electrically connected to the wiring V0.

The semiconductor device of one embodiment of the present invention can be used in the pixel circuit 51C illustrated in FIG. 15B. For example, the transistor M1 (transistor M2) and the transistor M2 (transistor M1) included in the semiconductor device illustrated in any of FIGS. 4A and 4B, FIGS. 5A and 5B, FIGS. 6A and 6B, and FIGS. 8A to 8C can be used as the transistor 52A and the transistor 52D, respectively, included in the pixel circuit 51C.

For example, the transistor M1 (transistor M2) and the transistor M2 (transistor M1) included in the semiconductor device illustrated in any of FIGS. 4A and 4B, FIGS. 5A and 5B, FIGS. 6A and 6B, and FIGS. 8A to 8C and can be used as the transistor 52B and the transistor 52C, respectively, included in the pixel circuit 51C.

For example, the transistor M2 and the transistor M1 included in the semiconductor device illustrated in any of FIGS. 1A and 1B, FIGS. 2A and 2B, and FIGS. 7A and 7B can be used as the transistor 52A and the transistor 52B, respectively, included in the pixel circuit 51C.

For example, the transistor M1 and the transistor M2 included in the semiconductor device illustrated in any of FIGS. 3A and 3B and FIG. 7C can be used as the transistor 52A and the transistor 52B, respectively, included in the pixel circuit 51C.

The semiconductor device of one embodiment of the present invention can be used in the pixel circuit 51C. For example, the transistor M2 and the transistor M1 included in the semiconductor device illustrated in any of FIGS. 1A and 1B, FIGS. 2A and 2B, and FIGS. 7A and 7B can be used as the transistor 52D and the transistor 52B, respectively, included in the pixel circuit 51C.

For example, the transistor M1 and the transistor M2 included in the semiconductor device illustrated in any of FIGS. 3A and 3B and FIG. 7C can be used as the transistor 52D and the transistor 52B, respectively, included in the pixel circuit 51C.

Figure 15C:
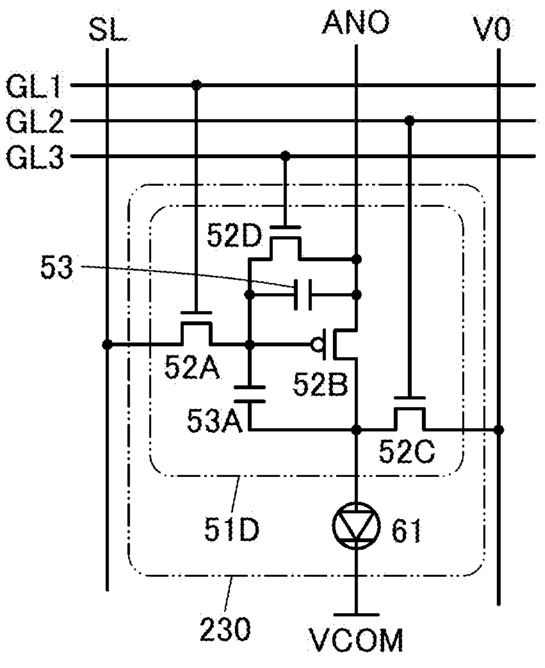

The pixel circuit 51D illustrated in FIG. 15C has a configuration in which a capacitor 53A is added to the pixel circuit 51C illustrated in FIG. 15A. In the pixel circuit 51D illustrated in FIG. 15C, one terminal of the capacitor 53A is electrically connected to the other of the source and the drain of the transistor 52B, and the other terminal is electrically connected to the gate of the transistor 52B.

The semiconductor device of one embodiment of the present invention can be used in the pixel circuit 51D illustrated in FIG. 15C. For example, the transistor M1 (transistor M2) and the transistor M2 (transistor M1) included in the semiconductor device illustrated in any of FIGS. 4A and 4B, FIGS. 5A and 5B, FIGS. 6A and 6B, and FIGS. 8A to 8C can be used as the transistor 52A and the transistor 52D, respectively, included in the pixel circuit 51D.

Figure 15D:
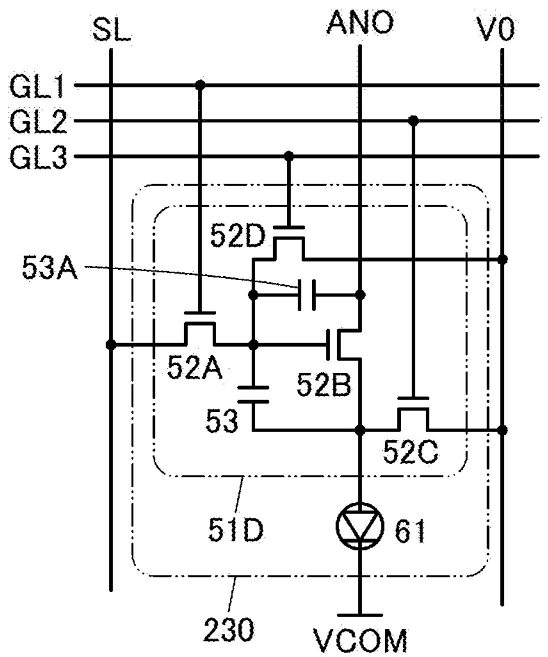

The pixel circuit 51D illustrated in FIG. 15D has a configuration in which a capacitor 53A is added to the pixel circuit 51C illustrated in FIG. 15B. In the pixel circuit 51D illustrated in FIG. 15D, one terminal of the capacitor 53A is electrically connected to the wiring ANO, and the other terminal is electrically connected to the gate of the transistor 52B. The capacitors 53 and 53A each function as a storage capacitor. The pixel circuits 51D illustrated in FIGS. 15C and 15D are 4Tr2C pixel circuits.

The semiconductor device of one embodiment of the present invention can be used in the pixel circuit 51D illustrated in FIG. 15D. For example, the transistor M1 (transistor M2) and the transistor M2 (transistor M1) included in the semiconductor device illustrated in any of FIGS. 4A and 4B, FIGS. 5A and 5B, FIGS. 6A and 6B, and FIGS. 8A to 8C can be used as the transistor 52A and the transistor 52D, respectively, included in the pixel circuit 51D.

For example, the transistor M1 (transistor M2) and the transistor M2 (transistor M1) included in the semiconductor device illustrated in any of FIGS. 4A and 4B, FIGS. 5A and 5B, FIGS. 6A and 6B, and FIGS. 8A to 8C and can be used as the transistor 52B and the transistor 52C, respectively, included in the pixel circuit 51D.

For example, the transistor M2 and the transistor M1 included in the semiconductor device illustrated in any of FIGS. 1A and 1B, FIGS. 2A and 2B, and FIGS. 7A and 7B can be used as the transistor 52A and the transistor 52B, respectively, included in the pixel circuit 51D.

For example, the transistor M1 and the transistor M2 included in the semiconductor device illustrated in any of FIGS. 3A and 3B and FIG. 7C can be used as the transistor 52A and the transistor 52B, respectively, included in the pixel circuit 51D.

For example, the transistor M2 and the transistor M1 included in the semiconductor device illustrated in any of FIGS. 1A and 1, FIGS. 2A and 2B, and FIGS. 7A and 7B can be used as the transistor 52D and the transistor 52B, respectively, included in the pixel circuit 51D.

For example, the transistor M1 and the transistor M2 included in the semiconductor device illustrated in any of FIGS. 3A and 3B and FIG. 7C can be used as the transistor 52D and the transistor 52B, respectively, included in the pixel circuit 51D.

Each of the transistors 52A, 52B, 52C, and 52D preferably includes a back gate electrode (second gate electrode), in which case the back gate electrode and a gate electrode can be supplied with the same signals or different signals.

P-channel transistors may be used not only as the transistor 52B but also as the transistors 52A, 52C, and 52D.

As described above, the semiconductor device of one embodiment of the present invention can be applied to a pixel circuit of a display apparatus. The semiconductor device of one embodiment of the present invention, where the transistors can be arranged with high density, can be highly integrated, and accordingly, the display apparatus using the semiconductor device in a pixel circuit can have high resolution.

This embodiment can be combined with any of the other embodiments or an example as appropriate. In this specification, in the case where a plurality of structure examples are shown in one embodiment, the structure examples can be combined as appropriate.

Embodiment 2

In this embodiment, a display apparatus using the semiconductor device of one embodiment of the present invention is described.

The display apparatus in this embodiment can be a high-resolution display apparatus. Accordingly, the display apparatus in this embodiment can be used for display portions of information terminals (wearable devices) such as watch-type and bracelet-type information terminals and display portions of wearable devices capable of being worn on the head, such as a VR device like a head-mounted display (TIMID) and a glasses-type AR device.

The display apparatus in this embodiment can be a high-definition display apparatus or a large-sized display apparatus. Accordingly, the display apparatus in this embodiment can be used for display portions of electronic devices such as a digital camera, a digital video camera, a digital photo frame, a mobile phone, a portable game console, a portable information terminal, and an audio reproducing device, in addition to display portions of electronic devices with a relatively large screen, such as a television device, a desktop or laptop personal computer, a monitor of a computer or the like, digital signage, and a large game machine such as a pachinko machine.

<Display Apparatus 200A>

Figure 16:
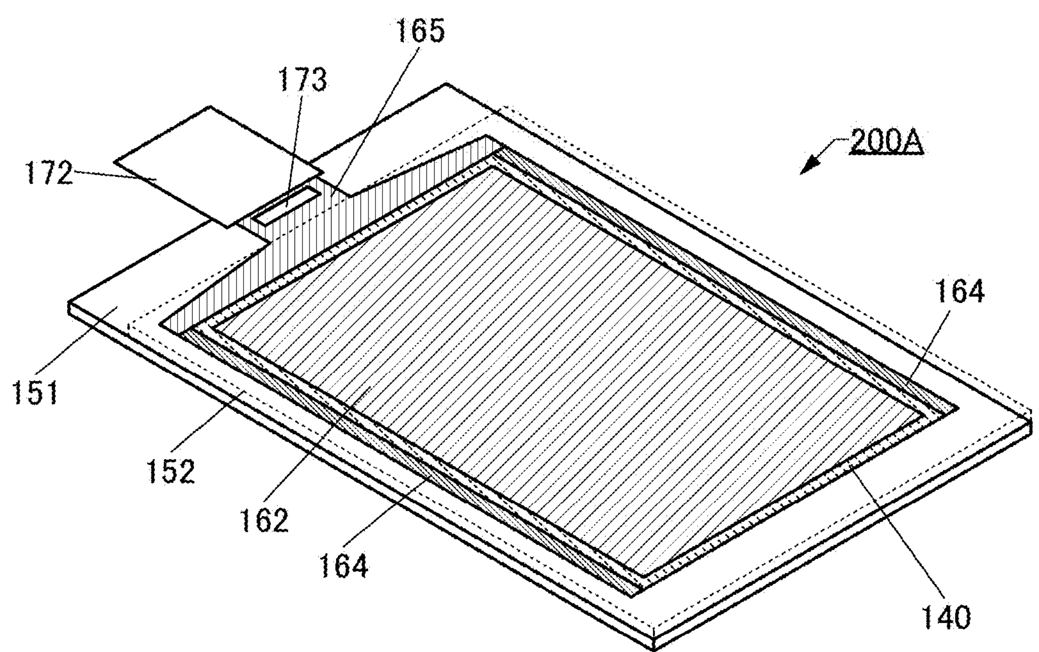
FIG. 16 is a perspective view illustrating an example of a display apparatus.

FIG. 16 is a perspective view of a display apparatus 200A. In the display apparatus 200A, a substrate 152 and a substrate 151 are attached to each other. In FIG. 16, the substrate 152 is denoted by a dashed line.

The display apparatus 200A includes a display portion 162, a connection portion 140, a circuit 164, a wiring 165, and the like. FIG. 16 illustrates an example in which an IC 173 and an FPC 172 are mounted on the display apparatus 200A. Thus, the structure illustrated in FIG. 16 can be regarded as a display module including the display apparatus 200A, the IC (integrated circuit), and the FPC.

A plurality of subpixels are arranged in a matrix in the display portion 162. Each of the pixels includes a plurality of subpixels.

Each subpixel includes a display device. Examples of the display device include a liquid crystal device (also referred to as a liquid crystal element) and a light-emitting device. As the light-emitting device, an OLED or a QLED is preferably used, for example. Examples of a light-emitting substance contained in the light-emitting device include a substance emitting fluorescent light (a fluorescent material), a substance emitting phosphorescent light (a phosphorescent material), a substance exhibiting thermally activated delayed fluorescence (a thermally activated delayed fluorescent (TADF) material), and an inorganic compound (e.g., a quantum dot material). An LED such as a micro-LED can also be used as the light-emitting device.

The light-emitting device can emit infrared, red, green, blue, cyan, magenta, yellow, or white light, for example. When the light-emitting device has a microcavity structure, the color purity can be further increased.

In the following description, a structure where a light-emitting device is used as the display device is given as an example.

A display apparatus of one embodiment of the present invention includes light-emitting devices of different colors, which are separately formed, and can perform full-color display.

The display apparatus of one embodiment of the present invention can have any of the following structures: a top-emission structure in which light is emitted in a direction opposite to the substrate where the light-emitting device is formed, a bottom-emission structure in which light is emitted toward the substrate where the light-emitting device is formed, and a dual-emission structure in which light is emitted toward both surfaces.

The connection portion 140 is provided outside the display portion 162. The connection portion 140 can be provided along one side or a plurality of sides of the display portion 162, for example. There is no particular limitation on the planar shape of the connection portion 140, and the shape can be a belt-like shape, an L shape, a U shape, a frame-like shape, or the like. The number of the connection portions 140 may be one or more. FIG. 16 illustrates an example where the connection portion 140 is provided to surround the four sides of the display portion 162. The common electrode of the light-emitting device is electrically connected to a conductive layer in the connection portion 140, and thus a potential can be supplied to the common electrode. The connection portion 140 can also be referred to as a cathode contact portion.

As the circuit 164, a scan line driver circuit can be used, for example.

The wiring 165 has a function of supplying a signal and power to the display portion 162 and the circuits 164. The signal and power are input to the wiring 165 from the outside through the FPC 172 or from the IC 173.

FIG. 16 illustrates an example where the IC 173 is provided over the substrate 151 by a chip on glass (COG) method, a chip on film (COF) method, or the like. An IC including a scan line driver circuit, a signal line driver circuit, or the like can be used as the IC 173, for example. Note that the display apparatus 200A and the display module are not necessarily provided with an IC. The IC may be mounted on the FPC by a COF method or the like.

Figure 17:
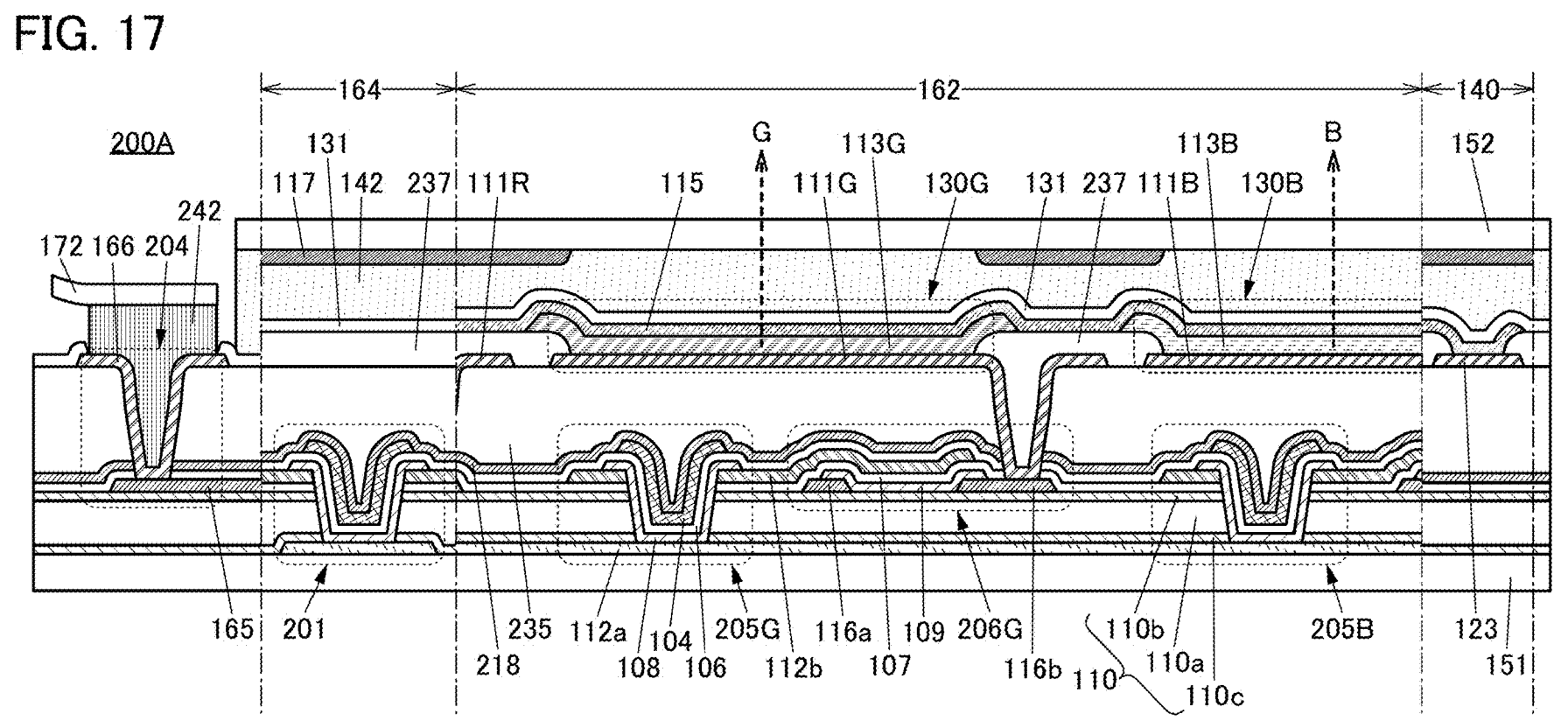

FIG. 17 illustrates an example of cross sections of part of a region including the FPC 172, part of the circuit 164, part of the display portion 162, part of the connection portion 140, and part of a region including an end portion of the display apparatus 200A.

The display apparatus 200A illustrated in FIG. 17 includes a transistor 201, a transistor 205R (not illustrated), a transistor 205G, a transistor 205B, a transistor 206R (not illustrated), a transistor 206G, a transistor 206B (not illustrated), a light-emitting device 130R (not illustrated), a light-emitting device 130G, a light-emitting device 130B, and the like between the substrates 151 and the 152.

Over the substrate 151, the transistors 201, 205R, 205G, 205B, 206R, 206G, and 206B are provided. An insulating layer 218 and an insulating layer 235 over the insulating layer 218 are provided to cover the transistors 201, 205R, 205G, 205B, 206R, 206G, and 206B. The light-emitting devices 130R, 130G, and 130B are provided over the insulating layer 235.

Matters common to the light-emitting devices 130R, 130G, and 130B are sometimes described using the term light-emitting device 130 without any letter of the alphabet distinguishing these light-emitting devices. Likewise, in the description of matters common to the components that are distinguished using letters of the alphabet, such as the transistors 205R, 205G, and 205B, reference numerals without the letters of the alphabet are sometimes used.

The transistors 201, 205R, 205G, and 205B can be fabricated with the same material and the same process. The transistors 206R, 206G, and 206B can be fabricated with the same material and the same process. Although FIG. 17 shows an example in which the transistor 201 has the same structure as the transistor 205 (transistors 205R, 205G, and 205B), one embodiment of the present invention is not limited to this example. The transistor 201 may have the same structure as the transistor 206 (transistors 206R, 206G, and 206B).

The transistor described in Embodiment 1 can be suitably used as the transistors 201, 205R, 205G, 205B, 206R, 206G, and 206B. FIG. 17 shows the structure in which the transistor M2 in the semiconductor device 10 illustrated in FIGS. 1A and 1B is used as the transistors 201, 205R, 205G, and 205B. In the structure, the transistor M1 in the semiconductor device 10 illustrated in FIGS. 1A and 1B is used as the transistors 206R, 206G, and 206B.

In other words, the transistors 205R and 206R are included in the semiconductor device in a subpixel that emits red (R) light, the transistors 205G and 206G are included in the semiconductor device in a subpixel that emits green (G) light, and the transistors 205B and 206B are included in the semiconductor device in a subpixel that emits blue (B) light. In the example in FIG. 17, the insulating layer 110 has a stacked structure of three layers, the insulating layers 110*c*, 110*a*, and 110*b*. With the use of the transistor described in Embodiment 1 for the display portion 162, the display apparatus can have high resolution. With the use of the transistor described in Embodiment 1 for the circuit 164, the display apparatus can have a narrow bezel.

All of the transistors included in the display portion 162 may be OS transistors or Si transistors. Alternatively, some of the transistors included in the display portion 162 may be OS transistors and the others may be Si transistors. As a Si transistor, a transistor using LTPS (hereinafter, referred to as a LTPS transistor) may be used.

For example, when both an LTPS transistor and an OS transistor are used in the display portion 162, the display apparatus can have low power consumption and high drive capability. Note that a structure in which the LTPS transistor and the OS transistor are combined is referred to as LTPO in some cases. As a favorable example, a structure is given in which the OS transistor is used as a transistor functioning as a switch for controlling electrical continuity and discontinuity between wirings and the LTPS transistor is used as a transistor for controlling current.

For example, one transistor (transistor 206) included in the display portion 162 can function as a transistor for controlling current flowing through the light-emitting device and be referred to as a driving transistor. One of a source and a drain of the driving transistor is electrically connected to the pixel electrode of the light-emitting device. An LTPS transistor is preferably used as the driving transistor. Accordingly, the amount of current flowing through the light-emitting device can be increased in the pixel circuit. By contrast, another transistor (transistor 205) included in the display portion 162 may function as a switch for controlling selection or non-selection of a pixel and be referred to as a selection transistor. A gate of the selection transistor is electrically connected to a gate line, and one of a source and a drain thereof is electrically connected to a source line (signal line). An OS transistor is preferably used as the selection transistor. Accordingly, the gray level of the pixel can be maintained even with an extremely low frame frequency (e.g., 1 fps or lower); thus, power consumption can be reduced by stopping the driver in displaying a still image.

The light-emitting devices 130R, 130G, and 130B each include a pair of electrodes and a layer between the pair of electrodes. The layer includes at least a light-emitting layer. One of the pair of electrodes of the light-emitting device functions as an anode, and the other electrode functions as a cathode. The case where the pixel electrode functions as an anode and the common electrode functions as a cathode is described below as an example in some cases.

The light-emitting device 130R includes a pixel electrode 111R over an insulating layer 235, an island-shaped layer 113R (not illustrated) over the pixel electrode 111R, and a common electrode 115 over the island-shaped layer 113R.

The light-emitting device 130G includes a pixel electrode 111G over the insulating layer 235, an island-shaped layer 113G over the pixel electrode 111G, and the common electrode 115 over the island-shaped layer 113G.

The light-emitting device 130B includes a pixel electrode 111B over the insulating layer 235, an island-shaped layer 113B over the pixel electrode 111B, and the common electrode 115 over the island-shaped layer 113B.

Each of the layers 113R, 113G, and 113B includes at least a light-emitting layer. For example, the light-emitting device 130R emits red (R) light, the light-emitting device 130G emits green (G) light, and the light-emitting device 130B emits blue (B) light. For example, the layer 113R, the layer 113G, and the layer 113B can respectively include a light-emitting layer that emits red light, a light-emitting layer that emits green light, and a light-emitting layer that emits blue light. In other words, the layer 113R, the layer 113G, and the layer 113B can respectively include a light-emitting material that emits red light, a light-emitting material that emits green light, and a light-emitting material that emits blue light. The layers 113R, 113G, and 113B may each include one or more functional layers. Examples of the functional layers include a light-emitting layer, carrier-injection layers (a hole-injection layer and an electron-injection layer), carrier-transport layers (a hole-transport layer and an electron-transport layer), carrier-blocking layers (a hole-blocking layer and an electron-blocking layer), and the like.

Although the layers 113R, 113G, and 113B have the same thickness in FIG. 17, the present invention is not limited thereto. The layers 113R, 113G, and 113B may have different thicknesses. For example, the thicknesses of the layers 113R, 113G, and 113B are preferably set to match an optical path length that intensifies light emitted from each layer. A microcavity structure can be achieved in this manner, and the color purity of each light-emitting device 130 can be increased.

The layers 113R, 113G, and 113B can be formed by a vacuum evaporation method using a fine metal mask, for example. In the vacuum evaporation method using a fine metal mask, the layers 113R, 113G, and 113B can be formed in an area wider than an opening of the fine metal mask. The end portions of the layers 113R, 113G, and 113B each have a tapered shape. Note that a sputtering method using a fine metal mask or an inkjet method may be used to form the layers 113R, 113G, and 113B.

The light-emitting device of this embodiment may have either a single structure (a structure including only one light-emitting unit) or a tandem structure (a structure including a plurality of light-emitting units). The light-emitting unit includes at least one light-emitting layer.

In the case of using a tandem light-emitting device, for example, the layer 113R can include a plurality of light-emitting units that emit red light, the layer 113G can include a plurality of light-emitting units that emit green light, and the layer 113B preferably includes a plurality of light-emitting units each emitting blue light. A charge-generation layer (also referred to as an intermediate layer) is preferably provided between the light-emitting units.

The common electrode 115 is shared between the light-emitting devices 130R, 130G, and 130B. The common electrode 115 is electrically connected to a conductive layer 123 provided in the connection portion 140. As the conductive layer 123, a conductive layer formed using the same material and the same process as the pixel electrodes 111R, 111G, and 111B are preferably used. Preferably, none of the layers 113R, 113G, and 113B are provided over the conductive layer 123.

In the connection portion 140, the common electrode 115 is provided over the conductive layer 123. The common electrode 115 can be formed by a sputtering method or a vacuum evaporation method, for example. Alternatively, a film formed by an evaporation method and a film formed by a sputtering method may be stacked. A mask (also referred to as an area mask, a rough metal mask, or the like to distinguish it from a fine metal mask) for specifying the area where the common electrode 115 is formed may be used to form the common electrode 115.

The insulating layer 218 provided over the transistors 205R, 205G, 205B, 206R, 206G, and 206B functions as a protective layer for the transistors 205R, 205G, 205B, 206R, 206G, and 206B. The insulating layer 218 is preferably formed using a material through which impurities such as water are not easily diffused. The insulating layer 218 functions as a blocking film that inhibits the diffusion of impurities from the outside into the transistors. Examples of the impurities include water and hydrogen. With the insulating layer 218, reliability of the display apparatus can be increased.

The insulating layer 218 can be an insulating layer including an inorganic material or an insulating layer including an organic material. An inorganic material can be suitably used for the insulating layer 218. As the inorganic material, one or more of an oxide, an oxynitride, a nitride oxide, and a nitride can be used. Specifically, for example, one or more of an inorganic insulating material such as silicon nitride, silicon nitride oxide, silicon oxynitride, aluminum oxide, aluminum oxynitride, aluminum nitride, hafnium oxide, or hafnium aluminate can be used. For example, silicon nitride oxide can be suitably used for the insulating layer 218 because the amount of impurities (such as water and hydrogen) released from silicon nitride oxide itself is small and a silicon nitride oxide film can function as a blocking film that inhibits the diffusion of impurities into the transistors from above the transistors. As an organic material, for example, one or both of an acrylic resin and a polyimide resin can be used. As an organic material, a photosensitive material may be used. A stack including two or more of the above insulating films may also be used. The insulating layer 218 may have a stacked structure of an insulating layer including an inorganic material and an insulating layer including an organic material.

Increasing the temperature at the time of forming an insulating film to be the insulating layer 218 enhances the property of blocking impurities (e.g., water and hydrogen). However, when an oxide semiconductor is used for the semiconductor layers 108 and 109, which function as the semiconductor layers where the channels of the transistors 205 and 206 are respectively formed, the high temperature at the time of forming the insulating film sometimes allows release of oxygen from the semiconductor layers 108 and 109, which increases the oxygen vacancies ($V_O$) and $V_OH$ in the semiconductor layers 108 and 109. The substrate temperature at the time of forming the insulating film is preferably higher than or equal to 180° C. and lower than or equal to 450° C., further preferably higher than or equal to 200° C. and lower than or equal to 450° C., further preferably higher than or equal to 250° C. and lower than or equal to 450° C., further preferably higher than or equal to 300° C. and lower than or equal to 450° C., further preferably higher than or equal to 300° C. and lower than or equal to 400° C. With the substrate temperature at the time of forming the insulating film in the above range, release of oxygen from the semiconductor layers 108 and 109 can be inhibited while the insulating layer 218 can have an improved property of blocking impurities. Consequently, the transistors 205 and 206 can have favorable electrical characteristics and high reliability.

The insulating layer 235 has a function of reducing unevenness caused by the transistors 205R, 205G, 205B, 206R, 206G, and 206B to make a formation surface of the light-emitting device 130 flatter. Note that in this specification and the like, the insulating layer 235 is referred to as a planarization layer in some cases.

For the insulating layer 235, an organic material can be favorably used. As the organic material, a photosensitive organic resin is preferably used, and for example, a photosensitive resin composite containing an acrylic resin is preferably used. Note that in this specification and the like, an acrylic resin refers to not only a polymethacrylic acid ester or a methacrylic resin, but also all the acrylic polymer in a broad sense in some cases.

Alternatively, the insulating layer 235 may be formed using an acrylic resin, a polyimide resin, an epoxy resin, an imide resin, a polyamide resin, a polyimide-amide resin, a silicone resin, a siloxane resin, a benzocyclobutene-based resin, a phenol resin, precursors of these resins, or the like. Alternatively, the insulating layer 235 may be formed using an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin. A photoresist may be used for the photosensitive resin. As the photosensitive organic resin, either a positive material or a negative material may be used.

The insulating layer 235 may have a stacked structure of an organic insulating layer and an inorganic insulating layer. For example, the insulating layer 235 can have a stacked structure of an organic insulating layer and an inorganic insulating layer over the organic insulating layer. An inorganic insulating layer provided on the outermost surface of the insulating layer 235 can function as an etching protective layer. This can inhibit a decrease in the flatness of the insulating layer 235, which is caused by etching of part of the insulating layer 235 in the formation of the pixel electrode 111.

The low flatness of the top surface of the insulating layer 235, which is the formation surface of the light-emitting device 130, might cause a defect such as a connection defect due to disconnection of the common electrode 115 or an increase in electric resistance due to the locally thinned regions of the common electrode 115. In addition, the low flatness of the top surface of the insulating layer 235 might lower the processing accuracy of the layer to be formed over the insulating layer 235. Making the top surface of the insulating layer 235 flat increases the processing accuracy of the light-emitting device 130 and the like to be provided over the insulating layer 235, whereby the display apparatus can have high resolution. Furthermore, since a connection defect due to disconnection of the common electrode 115 and an increase in electric resistance due to the locally thinned regions of the common electrode 115 can be prevented, the display apparatus can have high display quality.

In some cases, the insulating layer 235 is partly removed when the pixel electrodes 111R, 111G, and 111B are formed. The insulating layer 235 may have a concave portion in a region overlapping with none of the pixel electrodes 111R, 111G, and 111B.

The structure of the pixel electrode that can be applied to the display apparatus of one embodiment of the present invention is not limited to the structure of the pixel electrode 111 shown in FIG. 17 and the like.

An insulating layer 237 covers end portions of the top surfaces of the pixel electrodes 111R, 111G, and 111B. The insulating layer 237 functions as a partition (also referred to as a bank or a spacer). The insulating layer 237 can be an insulating layer including an inorganic material or an insulating layer including an organic material. A material that can be used for the insulating layer 218 or a material that can be used for the insulating layer 235 can be used for the insulating layer 237. The insulating layer 237 may have a stacked structure of an inorganic insulating layer and an organic insulating layer.

The insulating layer 237 prevents contact between the pixel electrode 111 and the common electrode 115 to inhibit a short-circuit in the light-emitting device 130. An end portion of the insulating layer 237 preferably has a tapered shape. When the end portion of the insulating layer 237 has a tapered shape, coverage with the film formed later can be increased. In particular, a photosensitive material is preferably used for an organic insulating layer of the insulating layer 237 so that the shape of the end portion can be easily controlled by the conditions of light exposure and development. Note that an inorganic insulating layer may be used for the insulating layer 237. Using an inorganic insulating layer for the insulating layer 237 enables the display apparatus to have high resolution.

When a photosensitive organic material is used for a film to be the insulating layer 237, the insulating layer 237 can be formed in such a manner that a composition containing an organic material is applied by a spin coating method, and then is subjected to selective light exposure and development. As the photosensitive organic material for the film to be the insulating layer 237, a positive-type or negative-type photosensitive resin may be used. Furthermore, light used for the exposure may include at least one of the g-line and the h-line. Adjusting the amount of light exposed can change the width of the opening. As another formation method, a sputtering method, an evaporation method, a droplet discharging method (e.g., an inkjet method), a printing method (e.g., a screen printing method or an offset printing method), or the like may be used.

The pixel electrodes 111R, 111G, and 111B are formed to cover the opening in the insulating layers 107, 106, 218, and 235. The insulating layer 237 is embedded in the concave portions of the pixel electrodes 111R, 111G, and 111B. For example, the insulating layer 237 covering the end portions of the top surface of the pixel electrode 111 and the opening is formed, and then the island-shaped layers 113R, 113G, and 113B can be formed with a fine metal mask.

The layers 113R, 113G, and 113B may be provided over the insulating layer 237. Although adjacent layers 113 are not in contact with each other in the structure shown in FIG. 17, one embodiment of the present invention is not limited thereto. Adjacent layers 113 may be in contact with each other over the insulating layer 237. Adjacent layers 113 may overlap with each other over the insulating layer 237. Over the insulating layer 237, for example, the layer 113R may be in contact with the layer 113G, and the layers 113G and 113R may overlap with each other.

The insulating layer 237 can be applied to other structure examples.

The protective layer 131 is provided over the light-emitting devices 130R, 130G, and 130B. The protective layer 131 and the substrate 152 are bonded to each other with an adhesive layer 142. The substrate 152 is provided with a light-blocking layer 117. A solid sealing structure, a hollow sealing structure, or the like can be employed to seal the light-emitting devices. In FIG. 17, a solid sealing structure is employed, in which a space between the substrate 152 and the substrate 151 is filled with the adhesive layer 142. Alternatively, a hollow sealing structure may be employed, in which the space is filled with an inert gas (e.g., nitrogen or argon). In this case, the adhesive layer 142 may be provided not to overlap with the light-emitting devices. Alternatively, the space may be filled with a resin other than the frame-like adhesive layer 142.

The protective layer 131 is preferably provided over the light-emitting devices 130R, 130G, and 130B. The protective layer 131 can inhibit oxidation of the common electrode 115 and entry of impurities (e.g., water and oxygen) into the light-emitting devices. Thus, the light-emitting devices are inhibited from deteriorating and the reliability of the display apparatus can be increased. The protective layer 131 may have a single-layer structure or a stacked structure including two or more layers. There is no limitation on the conductivity of the protective layer 131. As the protective layer 131, at least one type of insulating layers, semiconductor layers, and conductive layers can be used.

An inorganic substance can be used for the protective layer 131. For example, one or more of an oxide, an oxynitride, a nitride oxide, and a nitride can be used for the protective layer 131. Specifically, silicon oxide, silicon oxynitride, silicon nitride oxide, silicon nitride, aluminum oxide, aluminum oxynitride, and hafnium oxide can be given. In particular, the protective layer 131 preferably includes a nitride or a nitride oxide, and further preferably includes a nitride.

As the protective layer 131, a layer containing In—Sn oxide (ITO), In—Zn oxide, Ga—Zn oxide, Al—Zn oxide, In—Ga—Zn oxide (IGZO), or the like can also be used. The layer preferably has high resistance, specifically, higher resistance than the common electrode 115. The layer may further contain nitrogen.

When light emitted from the light-emitting device is extracted through the protective layer 131, the protective layer 131 preferably has a good property of transmitting visible light. For example, In—Sn oxide, In—Ga—Zn oxide, and aluminum oxide are preferable because they have a good property of transmitting visible light.

Furthermore, the protective layer 131 may include an organic film. For example, the protective layer 131 may include both an organic film and an inorganic film.

Examples of methods of forming the protective layer 131 include a vacuum evaporation method, a sputtering method, a CVD method, and an ALD method. The protective layer 131 may have a stacked structure of layers formed by different formation methods.

The protective layer 131 is provided at least in the display portion 162, and preferably provided to cover the entire display portion 162. The protective layer 131 is preferably provided to cover not only the display portion 162 but also the connection portion 140 and the circuit 164. It is further preferable that the protective layer 131 be provided to extend to the end portion of the display apparatus 200A.

The connection portion 204 is provided in a region of the substrate 151 not overlapping with the substrate 152. In the connection portion 204, the wiring 165 is electrically connected to the FPC 172 through the conductive layer 166 and a connection layer 242. The conductive layer 166 can be formed through the same process as the pixel electrodes 111R, 111G, and 111B. On the top surface of the connection portion 204, the conductive layer 166 is exposed. Thus, the connection portion 204 and the FPC 172 can be electrically connected to each other through the connection layer 242.

As the connection layer 242, for example, an anisotropic conductive film (ACF) or an anisotropic conductive paste (ACP) can be used.

The connection portion 204 has a portion not provided with the protective layer 131 so that the FPC 172 and the conductive layer 166 are electrically connected to each other. For example, the protective layer 131 is formed over the entire surface of the display apparatus 200A and then a region of the protective layer 131 overlapping with the conductive layer 166 is removed, so that the conductive layer 166 can be exposed.

A stacked structure of at least one organic layer and a conductive layer may be provided over the conductive layer 166, and the protective layer 131 may be provided over the stacked structure. Then, a separation trigger (a portion that can be a trigger of separation) may be formed in the stacked structure using laser or a sharp cutter (e.g., a needle or a utility knife) to selectively remove the stacked structure and the protective layer 131 thereover, so that the conductive layer 166 may be exposed. For example, the protective layer 131 can be selectively removed when an adhesive roller is pressed to the substrate 151 and then moved relatively while being rolled. Alternatively, an adhesive tape may be attached to the substrate 151 and then peeled. Since adhesion between the organic layer and the conductive layer or between the organic layers is low, separation occurs at the interface between the organic layer and the conductive layer or in the organic layer. Thus, a region of the protective layer 131 overlapping with the conductive layer 166 can be selectively removed. Note that when the organic layer and the like remain over the conductive layer 166, the remaining organic layer and the like can be removed by an organic solvent or the like.

As the organic layer, it is possible to use at least one of the organic layers (the layer functioning as the light-emitting layer, the carrier-blocking layer, the carrier-transport layer, or the carrier-injection layer) used for the layer 113B, 113G, or 113R, for example. The organic layer may be formed concurrently with the layer 113B, 113G, or 113R, or may be provided separately. The conductive layer can be formed using the same process and the same material as the common electrode 115. An ITO film is preferably formed as the common electrode 115 and the conductive layer, for example. Note that in the case where a stacked structure is used for the common electrode 115, at least one of the layers included in the common electrode 115 is provided as the conductive layer.

The top surface of the conductive layer 166 may be covered with a mask so that the protective layer 131 is not provided over the conductive layer 166. As the mask, a metal mask (area metal mask) or a tape or a film having adhesiveness or attachability may be used. The protective layer 131 is formed while the mask is placed and then the mask is removed, so that the conductive layer 166 can be kept exposed even after the protective layer 131 is formed.

With such a method, a region not provided with the protective layer 131 can be formed in the connection portion 204, and the conductive layer 166 and the FPC 172 can be electrically connected to each other through the connection layer 242 in the region.

The conductive layer 123 is provided over the insulating layer 235 in the connection portion 140. End portions of the conductive layer 123 are covered with the insulating layer 237. The common electrode 115 is provided over the conductive layer 123.

The display apparatus 200A illustrated in FIG. 17 is a top-emission display apparatus. Light emitted from the light-emitting devices is emitted toward the substrate 152. For the substrate 152, a material having a good property of transmitting visible light is preferably used. The pixel electrode 111 contains a material that reflects visible light, and the common electrode 115 contains a material that transmits visible light. In FIG. 17, arrows with broken lines indicate light G and light B, which are emitted toward the substrate 152 from the light-emitting device 130G and the light-emitting device 130B, respectively.

The light-blocking layer 117 is preferably provided on the surface of the substrate 152 on the substrate 151 side. The light-blocking layer 117 can be provided over a region between adjacent light-emitting devices, in the connection portion 140, and in the circuit 164. The light-blocking layer 117 can prevent color mixture by blocking light emitted from adjacent subpixels. Furthermore, the light-blocking layer 117 can prevent external light from reaching the transistors 201, 205R, 205G, 205B, 206R, 206G, and 206B, so that deterioration of these transistors by the external light can be inhibited. Note that a structure without the light-blocking layer 117 may be employed.

A variety of optical members can be provided on the outer surface of the substrate 152. Examples of optical members include a polarizing plate, a retardation plate, a light diffusion layer (e.g., a diffusion film), an anti-reflective layer, and a light-condensing film. Furthermore, an antistatic film inhibiting the attachment of dust, a water repellent film inhibiting the attachment of stain, a hard coat film inhibiting generation of a scratch caused by the use, an impact-absorbing layer, or the like may be provided as a surface protective layer on the outer surface of the substrate 152. For example, it is preferable to provide, as the surface protective layer, a glass layer or a silica layer ($SiO_x$ layer) because the surface contamination or damage can be prevented. The surface protective layer may be formed using diamond like carbon (DLC), aluminum oxide ($AlO_x$), a polyester-based material, a polycarbonate-based material, or the like. For the surface protective layer, a material having a good property of transmitting visible light is preferably used. The surface protective layer is preferably formed using a material with high hardness.

A material that can be used for the substrate 102 illustrated in FIG. 1B and the like can be used for each of the substrates 151 and 152. The substrate through which light from the light-emitting device is extracted is formed using a material that transmits the light. A polarizing plate may be used as the substrate through which light from the light-emitting device is extracted.

When the substrates 151 and 152 are formed using a flexible material, the flexibility of the display apparatus can be increased. For each of the substrate 151 and the substrate 152, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used as each of the substrate 151 and the substrate 152.

In the case where a circularly polarizing plate overlaps with the display apparatus, a highly optically isotropic substrate is preferably used as the substrate included in the display apparatus. A highly optically isotropic substrate has a low birefringence (i.e., a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of a highly optically isotropic film include a triacetyl cellulose (TAC, also referred to as cellulose triacetate) film, a cycloolefin polymer (COP) film, a cycloolefin copolymer (COC) film, and an acrylic film.

When a film used as the substrate absorbs water, the shape of the display apparatus might be changed, e.g., creases might be caused. Thus, as the substrate, a film with a low water absorption rate is preferably used. For example, the water absorption rate of the film is preferably 1% or lower, further preferably 0.1% or lower, still further preferably 0.01% or lower.

For the resin layer 142, a variety of curable adhesives such as a photocurable adhesive like an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferable. A two-component-mixture-type resin may be used. An adhesive sheet or the like may be used.

Structure examples different from the aforementioned display apparatus are described below. Note that portions similar to those of the aforementioned display apparatus are not described in some cases. In the drawings that are referred to later, the same hatching pattern is applied to portions having functions similar to those of the aforementioned display apparatus, and the portions are not denoted by reference numerals in some cases.

<Display Apparatus 200B>

Figure 18:
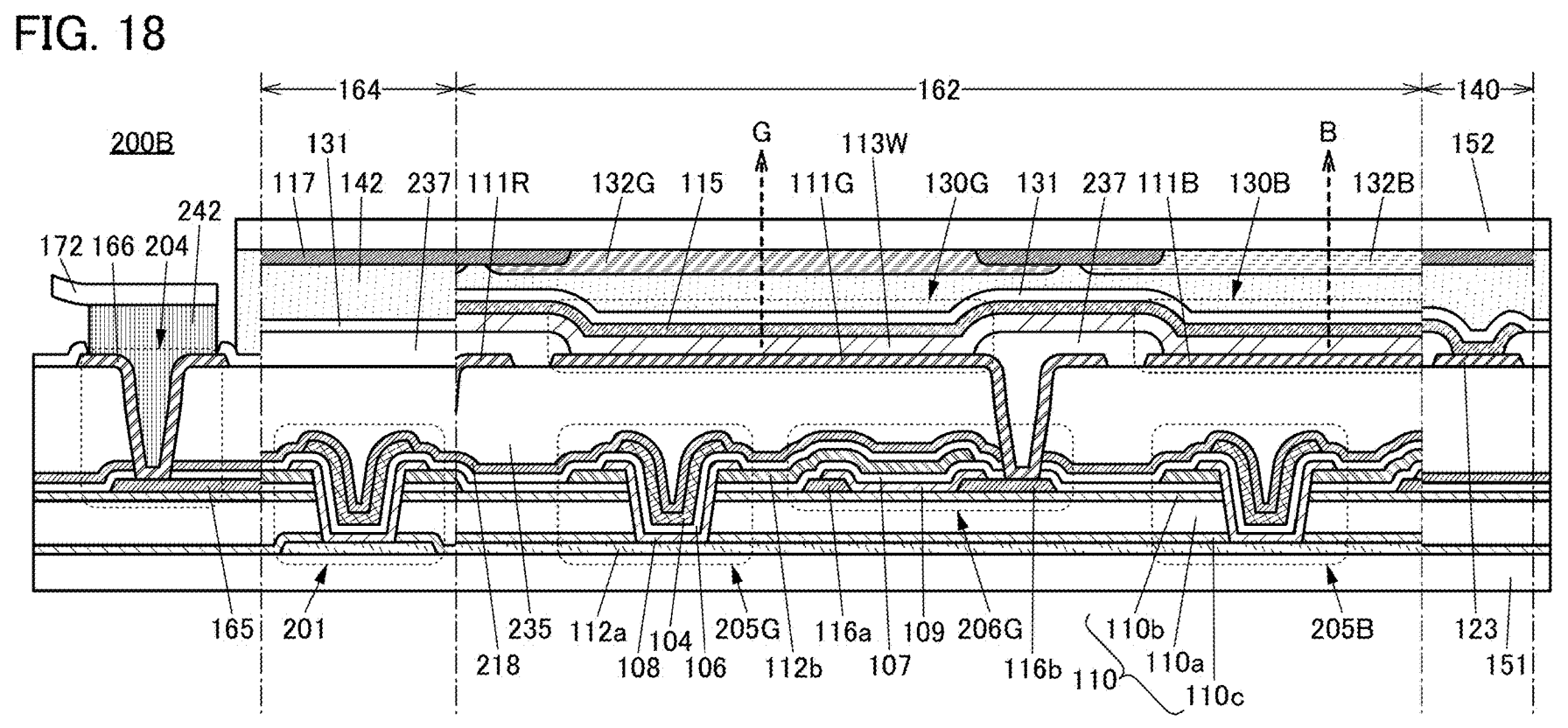

A display apparatus 200B illustrated in FIG. 18 differs from the display apparatus 200A illustrated in FIG. 17 mainly in the structures of the light-emitting device 130R (not illustrated) and the light-emitting devices 130G and 130B.

The light-emitting device 130R includes a layer 113W instead of the layer 113R. The light-emitting device 130G includes the layer 113W instead of the layer 113G. The light-emitting device 130B includes the layer 113W instead of the layer 113B. For example, the layer 113W can emit white light. The layer 113W can be formed by a vacuum evaporation method or a sputtering method, for example. The light-emitting devices 130R, 130G, and 130B can share layer 113W. The layer 113W shared between the plurality of light-emitting devices 130 enables the layer 113W to be formed without a fine metal mask. The layer 113W is provided in the display portion 162. For example, an area mask can be used to form the layer 113W.

An optical adjustment layer (not illustrated) may be provided between the pixel electrode 111 and the layer 113. As the optical adjustment layer, a conductive layer having a property of transmitting visible light can be used. The thickness of the optical adjustment layer may differ among the light-emitting devices 130R, 130G, and 130B. When the thickness of the optical adjustment layer is adjusted to optimize the optical path length, the light-emitting devices 130 can exhibit light with a desired wavelength, which is intensified, even with the layer 113W emitting white light.

A coloring layer 132R transmitting red light (not illustrated), a coloring layer 132G transmitting green light, and a coloring layer 132B transmitting blue light may be provided on the side of the substrate 152 that faces the adhesive layer 142. The coloring layer 132R is provided in a position overlapping with the light-emitting device 130R. The coloring layer 132G is provided in a position overlapping with the light-emitting device 130G. The coloring layer 132B is provided in a position overlapping with the light-emitting device 130B. For example, light with an unnecessary wavelength emitted from the red-light-emitting device 130R can be blocked by the coloring layer 132R. Such a structure can further increase the color purity of light emitted from each light-emitting device. Note that a similar effect can be obtained in a combination of the light-emitting device 130G and the coloring layer 132G or a combination of the light-emitting device 130B and the coloring layer 132B.

The coloring layers 132R, 132G, and 132B can be applied to other structure Examples.

<Display apparatus 200C>

Figure 19:
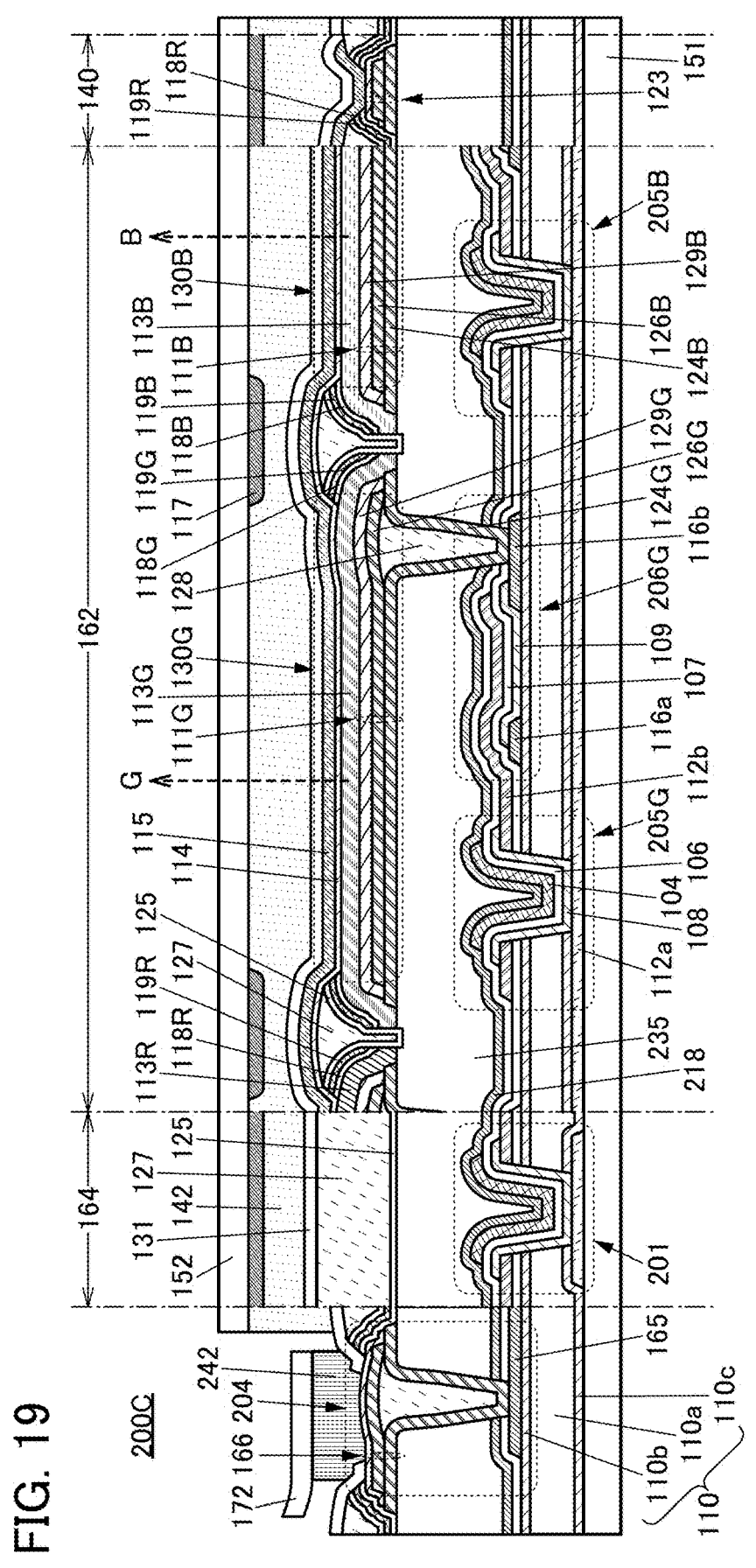

A display apparatus 200C illustrated in FIG. 19 differs from the display apparatus 200A illustrated in FIG. 17 mainly in the structures of the pixel electrode 111R (not illustrated), the pixel electrodes 111G and 111B, and the conductive layers 123 and 166 and also in that the insulating layer 237 is not included, the layer 113 covers a top surface and a side surface of the pixel electrode 111, and a common layer 114, an insulating layer 125, and an insulating layer 127 are included.

The light-emitting device 130R (not illustrated) includes a pixel electrode 111R over the insulating layer 235, the island-shaped layer 113R (not illustrated) over the pixel electrode 111R, the common layer 114 over the island-shaped layer 113R and the common electrode 115 over the common layer 114. In the light-emitting device 130R, the layer 113R and the common layer 114 can be collectively referred to as an EL layer.

The light-emitting device 130G includes a pixel electrode 111G over the insulating layer 235, the island-shaped layer 113G over the pixel electrode 111G, a common layer 114 over the island-shaped layer 113G, and a common electrode 115 over the common layer 114. In the light-emitting device 130G, the layer 113G and the common layer 114 can be collectively referred to as an EL layer.

The light-emitting device 130B includes a pixel electrode 111B over the insulating layer 235, an island-shaped layer 113B over the pixel electrode 111B, the common layer 114 over the island-shaped layer 113B, and the common electrode 115 over the common layer 114. In the light-emitting device 130B, the layer 113B and the common layer 114 can be collectively referred to as an EL layer.

In this specification and the like, in the EL layers included in the light-emitting devices, the island-shaped layer provided in each light-emitting device is referred to as the layer 113R, the layer 113G, or the layer 113B, and the layer shared by the plurality of light-emitting devices is referred to as the common layer 114. Note that in this specification and the like, only the layers 113R, 113G, and 113B are sometimes referred to as island-shaped EL layers, EL layers formed in an island shape, or the like, in which case the common layer 114 is not included in the EL layer.

For example, the layers 113R, 113G, and 113B may each include a hole-injection layer, a hole-transport layer, a light-emitting layer, and an electron-transport layer in this order. In addition, an electron-blocking layer may be provided between the hole-transport layer and the light-emitting layer. In addition, a hole-blocking layer may be provided between the electron-transport layer and the light-emitting layer. Furthermore, an electron-injection layer may be provided over the electron-transport layer.

Alternatively, the layers 113R, 113G, and 113B may each include an electron-injection layer, an electron-transport layer, a light-emitting layer, and a hole-transport layer in this order, for example. In addition, a hole-blocking layer may be provided between the electron-transport layer and the light-emitting layer. In addition, an electron-blocking layer may be provided between the hole-transport layer and the light-emitting layer. Furthermore, a hole-injection layer may be provided over the hole-transport layer.

Thus, the layers 113R, 113G, and 113B each preferably include the light-emitting layer and a carrier-transport layer (an electron-transport layer or a hole-transport layer) over the light-emitting layer. Alternatively, the layers 113R, 113G, and 113B each preferably include a light-emitting layer and a carrier-blocking layer (a hole-blocking layer or an electron-blocking layer) over the light-emitting layer. Alternatively, the layers 113R, 113G, and 113B each preferably include a light-emitting layer, a carrier-blocking layer over the light-emitting layer, and a carrier-transport layer over the carrier-blocking layer.

The light-emitting devices 130R, 130G, and 130B may have a tandem structure. In the case of using a tandem structure, preferably, the layer 113R includes a plurality of light-emitting units that emit red light, the layer 113G includes a plurality of light-emitting units that emit green light, and the layer 113B includes a plurality of light-emitting units that emit blue light. A charge-generation layer is preferably provided between the light-emitting units. The layers 113R, 113G, and 113B may include a first light-emitting unit, a charge-generation layer over the first light-emitting unit, and a second light-emitting unit over the charge-generation layer, for example.

It is preferable that the second light-emitting unit include a light-emitting layer and a carrier-transport layer (an electron-transport layer or a hole-transport layer) over the light-emitting layer. Alternatively, the second light-emitting unit preferably includes a light-emitting layer and a carrier-blocking layer (a hole-blocking layer or an electron-blocking layer) over the light-emitting layer. Alternatively, the second light-emitting unit preferably includes a light-emitting layer, a carrier-blocking layer over the light-emitting layer, and a carrier-transport layer over the carrier-blocking layer. Since the surface of the second light-emitting unit is exposed in the manufacturing process of the display apparatus, providing one or both of the carrier-transport layer and the carrier-blocking layer over the light-emitting layer inhibits the light-emitting layer from being exposed on the outermost surface, so that damage to the light-emitting layer can be reduced. Accordingly, the reliability of the light-emitting device can be increased. Note that in the case where three or more light-emitting units are provided, the uppermost light-emitting unit preferably includes a light-emitting layer and one or both of a carrier-transport layer and a carrier-blocking layer over the light-emitting layer.

The common layer 114 includes, for example, an electron-injection layer or a hole-injection layer. Alternatively, the common layer 114 may be a stack of an electron-transport layer and an electron-injection layer, or may be a stack of a hole-transport layer and a hole-injection layer. The common layer 114 is shared by the light-emitting devices 130R, 130G, and 130B. The common layer 114 can be formed by an evaporation method (including a vacuum evaporation method), a transfer method, a printing method, an inkjet method, or a coating method, for example.

The common layer 114 is not necessarily provided in the connection portion 140. In the structure shown in FIG. 19, the common electrode 115 is provided directly on the conductive layer 123. The structure in which the common layer 114 is provided over the conductive layer 123, and the conductive layer 123 and the common electrode 115 are electrically connected to each other through the common layer 114 may be employed. For example, by using an area mask, the common layer 114 can be formed in a region different from a region where the common electrode 115 is formed.

As illustrated in FIG. 19, the pixel electrode 111G included in the light-emitting device 130G has a stacked structure including a conductive layer 124G, a conductive layer 126G over the conductive layer 124G, and a conductive layer 129G over the conductive layer 126G.

The conductive layer 124G is electrically connected to the conductive layer 116*b* included in the transistor 206G through an opening provided in the insulating layers 107, 106, 218, and 235.

The end portion of the conductive layer 124G is positioned outside the end portion of the conductive layer 126G. Alternatively, the end portion of the conductive layer 126G is positioned inside the end portion of the conductive layer 129G. The end portion of the conductive layer 124G may be positioned outside the end portion of the conductive layer 129G. In other words, the end portion of the conductive layer 126G is positioned over the conductive layer 124G. The end portion of the conductive layer 129G is positioned over the conductive layer 124G. Atop surface and a side surface of the conductive layer 126G are covered with the conductive layer 129G.

For the conductive layer 124G, no particular limitations are imposed on the properties of transmitting and reflecting visible light. As the conductive layer 124G, a conductive layer having a property of transmitting visible light or a conductive layer having a property of reflecting visible light can be used. As a conductive layer having a property of transmitting visible light, a conductive layer including an oxide conductor (also referred to as an oxide conductive layer) can be used, for example. Specifically, an In—Si—Sn oxide (also referred to as ITSO) can be suitably used as the conductive layer 124G. For a conductive layer having a property of reflecting visible light, metal such as aluminum, titanium, chromium, nickel, copper, yttrium, zirconium, tin, zinc, silver, platinum, gold, molybdenum, tantalum, or tungsten, or an alloy containing the metal as its main component (e.g., an alloy of silver, palladium, and copper (Ag—Pd—Cu (APC))) can be used, for example. The conductive layer 124G may have a stacked structure of a conductive layer having a property of transmitting visible light and a conductive layer having a property of reflecting visible light having a property of transmitting visible light over the conductive layer. For the conductive layer 124G, a material with high adhesion to the formation surface of the conductive layer 124G (here, the insulating layer 235) is preferably used. Accordingly, separation of the conductive layer 124G can be inhibited.

A conductive layer having a property of reflecting visible light can be used as the conductive layer 126G. The conductive layer 126G may have a stacked structure of a conductive layer having a property of transmitting visible light and a conductive layer having a property of reflecting visible light having a property of transmitting visible light over the conductive layer. For the conductive layer 126G, the same material as the conductive layer 124G can be used. Specifically, a stacked structure of an In—Si—Sn oxide (ITSO), an alloy of silver, palladium, and copper (APC) over the In—Si—Sn oxide (ITSO) can be suitably used as the conductive layer 126G.

For the conductive layer 129G, the same material as the conductive layer 124G can be used. A conductive layer having a property of transmitting visible light can be used as the conductive layer 129G. Specifically, an In—Si—Sn oxide (ITSO) can be used for the conductive layer 129G.

When a material that is easily oxidized is used for the conductive layer 126G, a material that is not easily oxidized is used for the conductive layer 129G and the conductive layer 126G is covered with the conductive layer 129G, whereby oxidation of the conductive layer 126G can be inhibited. In addition, precipitation of a metal component included in the conductive layer 126G can be inhibited. For example, when a material including silver is used for the conductive layer 126G, an In—Si—Sn oxide (ITSO) can be suitably used for the conductive layer 129G. Thus, oxidation of the conductive layer 126G can be inhibited, and precipitation of silver can be inhibited The conductive layers 124R, 126R, and 129R (not illustrated) in the light-emitting device 130R and the conductive layers 124B, 126B, and 129B in the light-emitting device 130B are similar to those in the conductive layers 124G, 126G, and 129G in the light-emitting device 130G; thus, the detailed description thereof is omitted.

The pixel electrodes 111R, 111G, and 111B and the conductive layers 123 and 166 illustrated in FIG. 19 and the like can also be applied to other structure examples.

The conductive layers 124R, 124G, and 124B are formed to cover the opening provided in the insulating layers 107, 106, 218, and 235. A layer 128 is embedded in the concave portion of the conductive layers 124R, 124G, and 124B.

The layer 128 has a function of flattening the conductive layers 124R, 124G, and 124B. Over the conductive layers 124R, 124G, and 124B and the layer 128, the conductive layers 126R, 126G, and 126B that are respectively electrically connected to the conductive layers 124R, 124G, and 124B are provided. Thus, in the light-emitting devices 130, the regions overlapping with the concave portions of the conductive layers 124R, 124G, and 124B can also function as light-emitting regions, whereby the aperture ratio of the pixel can be increased.

The layer 128 may be an insulating layer or a conductive layer. Any of a variety of inorganic insulating materials, organic insulating materials, and conductive materials can be used for the layer 128 as appropriate. In particular, the layer 128 is preferably formed using an organic material. In particular, a photosensitive organic resin is preferably used as the organic material. For example, a photosensitive resin composition containing an acrylic resin is preferably used for the layer 128.

When the layer 128 is a conductive layer, the layer 128 can serve as part of a pixel electrode. For the layer 128, for example, an organic resin in which metal particles are dispersed can be used.

The layer 128 illustrated in FIG. 19 and the like can be applied to other structure examples.

FIG. 19 illustrates an example where the end portion of the layer 113G is positioned on the outer side of the end portion of the pixel electrode 111G. The layer 113G is formed to cover the end portion of the pixel electrode 111G. Such a structure enables the entire top surface of the pixel electrode to be a light-emitting region, and the aperture ratio can be increased as compared with the structure where the end portion of the island-shaped EL layer is positioned on the inner side of the end portion of the pixel electrode. Covering the side surface of the pixel electrode 111 with the EL layer inhibits contact between the pixel electrode 111 and the common electrode 115, thereby inhibiting a short-circuit of the light-emitting device 130. Note that although the pixel electrode 111G and the layer 113G are given as an example, the following description applies to the pixel electrode 111R and the layer 113R, and the pixel electrode 111B and the layer 113B.

An insulating layer (the insulating layer 237 in FIG. 17) covering a top end portion of the pixel electrode 111G is not provided between the pixel electrode 111G and the layer 113G. An insulating layer covering an end portion of the top surface of the pixel electrode 111B is not provided between the pixel electrode 111B and the layer 113B. Thus, the distance between adjacent light-emitting devices can be shortened. Accordingly, the display apparatus can have a high resolution or a high definition. In addition, a mask for forming the insulating layer is not needed, which leads to a reduction in manufacturing cost of the display apparatus.

The EL layer can be formed by a photolithography method, for example. Specifically, a film to be the light-emitting layers is formed across a plurality of pixel electrodes that have been formed independently for respective subpixels. Then, the film is processed by a photolithography method so that one island-shaped light-emitting layer is formed for every pixel electrode. Thus, the light-emitting layer can be divided into island-shaped light-emitting layers for respective subpixels. A photolithography method enables a miniaturized EL layer to be formed. When the EL layer is provided in an island shape for each light-emitting device, a leakage current between adjacent light-emitting devices can be inhibited. This can prevent crosstalk due to unintended light emission, so that a display apparatus with extremely high contrast can be obtained. Specifically, a display apparatus having high current efficiency at low luminance can be obtained.

The upper temperature limit of the compounds contained in the layers 113R, 113G, and 113B is preferably higher than or equal to 100° C. and lower than or equal to 180° C., further preferably higher than or equal to 120° C. and lower than or equal to 180° C., still further preferably higher than or equal to 140° C. and lower than or equal to 180° C. For example, the glass transition point (Tg) of these compounds is preferably higher than or equal to 100° C. and lower than or equal to 180° C., further preferably higher than or equal to 120° C. and lower than or equal to 180° C., still further preferably higher than or equal to 140° C. and lower than or equal to 180° C. This inhibits a reduction in light emission efficiency and a decrease in lifetime which are due to damage to the layers 113R, 113G, and 113B by heat applied in a manufacturing process.

In a region between adjacent light-emitting devices 130, the insulating layer 125 and the insulating layer 127 over the insulating layer 125 are provided. Although FIG. 19 illustrates cross sections of a plurality of insulating layers 125 and a plurality of insulating layers 127, the insulating layers 125 are connected to each other and the insulating layers 127 are connected to each other when the display apparatus 200C is seen from above. In other words, the display apparatus 200C can have a structure including one insulating layer 125 and one insulating layer 127, for example. Note that the display apparatus 200C may include a plurality of insulating layers 125 that are separated from each other and a plurality of insulating layers 127 that are separated from each other.

The insulating layer 125 is preferably in contact with the side surfaces of the layers 113R, 113G, and 113B. The insulating layer 125 in contact with the layers 113R, 113G, and 113B can prevent separation of the layers 113R, 113G, and 113B. When the insulating layer 125 is in close contact with the layers 113R, 113G, and 113B, adjacent layers among the layers 113 and the like can be fixed or bonded to each other by the insulating layer 125. Accordingly, the reliability of the light-emitting devices can be improved. The manufacturing yield of the light-emitting devices can also be improved.

The insulating layer 125 can be formed using an inorganic material. For the insulating layer 125, one or more of an oxide, an oxynitride, a nitride oxide, and a nitride can be used, for example. The insulating layer 125 may have a single-layer structure or a stacked-layer structure. Examples of the oxide include silicon oxide, aluminum oxide, magnesium oxide, indium-gallium-zinc oxide, gallium oxide, germanium oxide, yttrium oxide, zirconium oxide, lanthanum oxide, neodymium oxide, hafnium oxide, and tantalum oxide. Examples of the nitride include silicon nitride and aluminum nitride. Examples of the oxynitride include silicon oxynitride and aluminum oxynitride. Examples of the nitride oxide include silicon nitride oxide and aluminum nitride oxide. In particular, aluminum oxide is preferably used because it has high selectivity with respect to the EL layer in etching and has a function of protecting the EL layer.

The insulating layer 125 preferably has a function of a barrier insulating film against at least one of water and oxygen. Alternatively, the insulating layer 125 preferably has a function of inhibiting diffusion of at least one of water and oxygen. Alternatively, the insulating layer 125 preferably has a function of capturing or fixing (also referred to as gettering) at least one of water and oxygen. Note that in this specification and the like, a barrier insulating layer refers to an insulating layer having a barrier property. A barrier property in this specification and the like means a function of inhibiting diffusion of a particular substance (also referred to as a function of less easily transmitting the substance).

When the insulating layer 125 has a function of the barrier insulating layer or a gettering function, entry of impurities (typically, at least one of water and oxygen) that would diffuse into the light-emitting devices from the outside can be inhibited. With this structure, a highly reliable light-emitting device and a highly reliable display apparatus can be provided.

The insulating layer 127 is provided over the insulating layer 125 to fill a concave portion formed by the insulating layer 125. The insulating layer 127 can overlap with the side surface and part of the top surface of each of the layers 113R, 113G, and 113B with the insulating layer 125 therebetween. The insulating layer 127 preferably covers at least part of a side surface of the insulating layer 125. The insulating layers 125 and 127 can fill a gap between the adjacent island-shaped layers, whereby unevenness of the surface where the layers (e.g., the carrier-injection layer and the common electrode) provided over the island-shaped layers are formed can be reduced and the coverage with the layers can be improved. The top surface of the insulating layer 127 preferably has a shape with higher flatness, but may include a projection portion, a convex surface, a concave surface, or a concave portion.

As the insulating layer 127, an insulating layer containing an organic material can be favorably used. As the organic material, a photosensitive organic resin is preferably used, and for example, a photosensitive resin composite containing an acrylic resin is preferably used.

Alternatively, the insulating layer 127 may be formed using an acrylic resin, a polyimide resin, an epoxy resin, an imide resin, a polyamide resin, a polyimide-amide resin, a silicone resin, a siloxane resin, a benzocyclobutene-based resin, a phenol resin, precursors of these resins, or the like. Alternatively, the insulating layer 127 may be formed using an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin. A photoresist may be used for the photosensitive resin. As the photosensitive organic resin, either a positive material or a negative material may be used.

The insulating layer 127 may be formed using a material absorbing visible light. When the insulating layer 127 absorbs light emitted from the light-emitting device, leakage of light (stray light) from the light-emitting device to the adjacent light-emitting device through the insulating layer 127 can be inhibited. Thus, the display quality of the display apparatus can be improved. Since no polarizing plate is required to improve the display quality, the weight and thickness of the display apparatus can be reduced.

Examples of the material absorbing visible light include materials containing pigment of black or the like, materials containing dye, light-absorbing resin materials (e.g., polyimide), and resin materials that can be used for color filters (color filter materials). Using the resin material composed of stacked color filter materials of two or three or more colors is particularly preferred, in which case the effect of blocking visible light is enhanced. In particular, mixing color filter materials of three or more colors enables the formation of a black or nearly black resin layer.

A mask layer 118R and a mask layer 119R are positioned over the layer 113R included in the light-emitting device 130R, a mask layer 118G and a mask layer 119G are positioned over the layer 113G included in the light-emitting device 130G, and a mask layer 118B and a mask layer 119B are positioned over the layer 113B included in the light-emitting device 130B. The mask layers 118 and 119 are provided to surround the light-emitting region. In other words, the mask layers 118 and 119 have an opening in a portion overlapping with the light-emitting region. The mask layers 118R and 119R are remaining parts of the mask layers provided over the layer 113R at the time of processing the layer 113R. In a similar manner, the mask layers 118G and 119G are remaining parts of the mask layers at the time of processing the layer 113G, and the mask layers 118B and 119B are remaining parts of the mask layers provided at the time of processing the layer 113B. Thus, the mask layer used to protect the EL layer in manufacture of the EL layer may partly remain in the display apparatus of one embodiment of the present invention.

The common layer 114 and the common electrode 115 are provided over the layers 113R, 113G, and 113B, the mask layers 118 and 119, and the insulating layers 125 and 127. Before the insulating layers 125 and 127 are provided, a step is generated due to a difference between a region where the pixel electrode and the island-shaped EL layer are provided and a region where neither the pixel electrode nor the island-shaped EL layer is provided (region between the light-emitting devices). In the display apparatus of one embodiment of the present invention, the step can be reduced with the insulating layers 125 and r 127, and the coverage with the common layer 114 and the common electrode 115 can be improved. Thus, connection defects caused by step disconnection of the common layer 114 and the common electrode 115 can be inhibited. In addition, an increase in the electric resistance of the common electrode 115, which is caused by local thinning of the common electrode 115 due to the level difference, can be inhibited.

The insulating layer 127 may cover at least part of the side surfaces of the insulating layer 125 and the mask layers 118R, 119R, 118G, 119G, 118B, and 119B. The insulating layer 127 may include regions in contact with the layers 113R, 113G, and 113B.

<Display Apparatus 200D>

Figure 20:
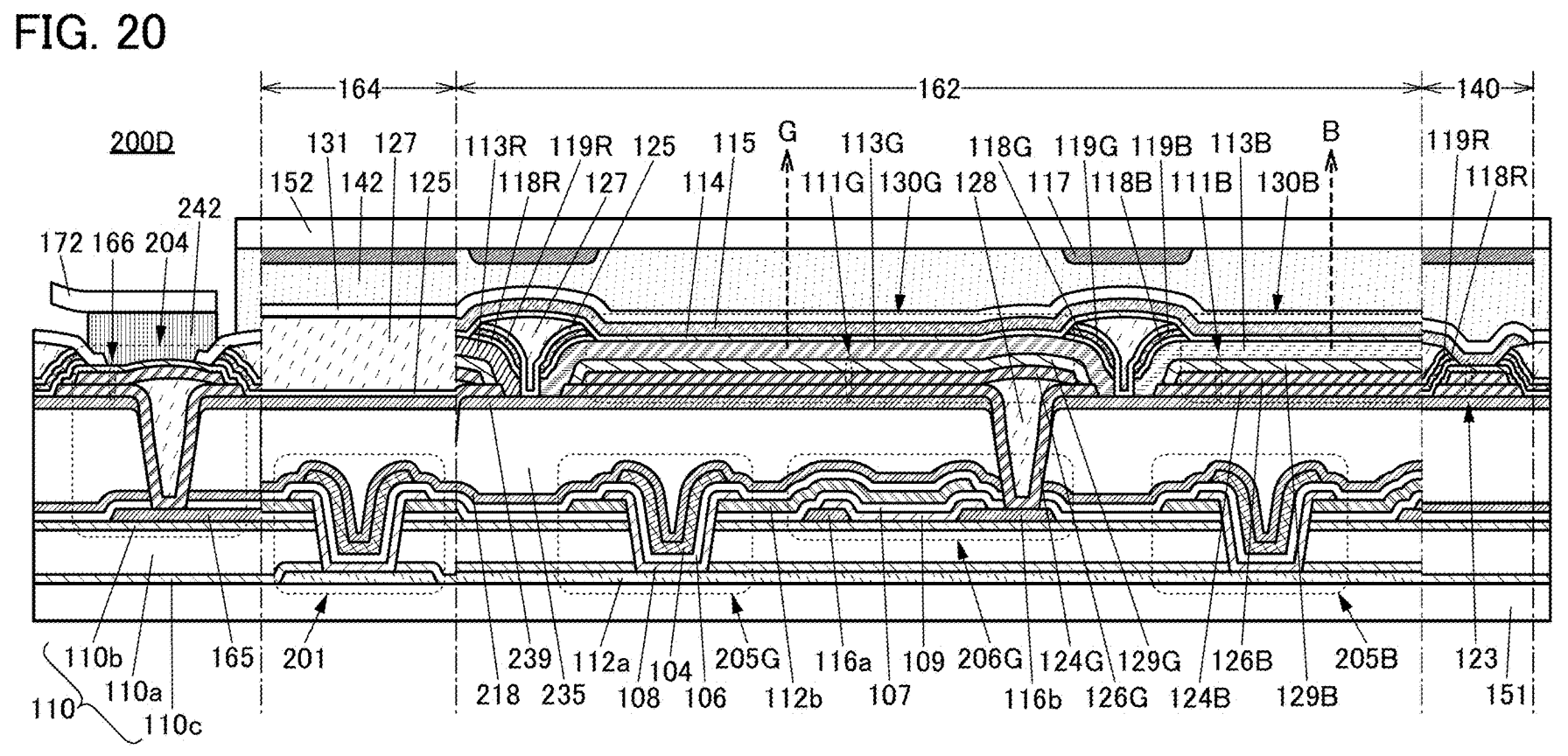

A display apparatus 200D illustrated in FIG. 20 differs from the display apparatus 200C illustrated in FIG. 19 mainly in including an insulating layer 239.

The insulating layer 239 is provided over the insulating layer 235 and includes an opening in a region overlapping with the opening in the insulating layer 235. The pixel electrode 111 is provided to cover the opening provided in the insulating layers 239, 235, 218, 106, and 107.

The insulating layer 239 can function as an etching protective film when the layer 113 and the mask layers 118 and 119 are formed. The insulating layer 239 can prevent generation of unevenness in the insulating layer 235 caused by etching of part of the insulating layer 235 at the time when the layer 113 and the mask layers 118 and 119 are formed. Thus, steps in the formation surface of the insulating layer 125 become small, whereby the coverage with the insulating layer 125 can be increased. Consequently, the side surface of the layer 113 is covered with the insulating layer 125, which inhibits separation of the layer 113.

The insulating layer 239 can be formed using an inorganic material. As the insulating layer 239, an inorganic insulating film such as an oxide insulating film, a nitride insulating film, an oxynitride insulating film, or a nitride oxide insulating film can be used, for example. The insulating layer 239 may have a single-layer structure or a stacked-layer structure. Examples of the oxide insulating film include a silicon oxide film, an aluminum oxide film, a magnesium oxide film, an indium-gallium-zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. A silicon oxide film or a silicon oxynitride film can be suitably used as the insulating layer 239, for example.

The insulating layer 239 preferably includes a material having a high etching rate (selectivity) with respect to films to be the layer 113 and the mask layers 118 and 119 in etching of the films.

The low flatness of the formation surface of the light-emitting device 130, might cause a defect, such as a connection defect due to disconnection of the common electrode 115 or an increase in electric resistance due to the locally thinned regions of the common electrode 115. In addition, the processing accuracy of the layer to be formed on the formation surface might be lowered.

In the display apparatus of one embodiment of the present invention, the formation surface of the light-emitting devices 130 can be made flatter by the insulating layer 239. Accordingly, the processing accuracy of the light-emitting devices 130 and the like provided over the insulating layer 239 is increased, whereby the display apparatus can have high resolution. Furthermore, since a connection defect due to disconnection of the common electrode 115 and an increase in electric resistance due to local thinning of the common electrode 115 can be prevented, the display apparatus can have high display quality.

Although the insulating layer 239 has a single-layer structure in FIG. 20, one embodiment of the present invention is not limited to this example. The insulating layer 239 may have a stacked-layer structure.

In the region that does not overlap with any of the layers 113R, 113G, and 113B, part of the insulating layer 239 may be removed. The thickness of the insulating layer 239 in the region that does not overlap with any of the layers 113R, 113G, and 113B may be smaller than the thickness of the insulating layer 239 in the region that overlaps with the layer 113R, 113G, or 113B.

The insulating layer 239 can be applied to other structure examples.

<Display Apparatus 200E>

Figure 21:
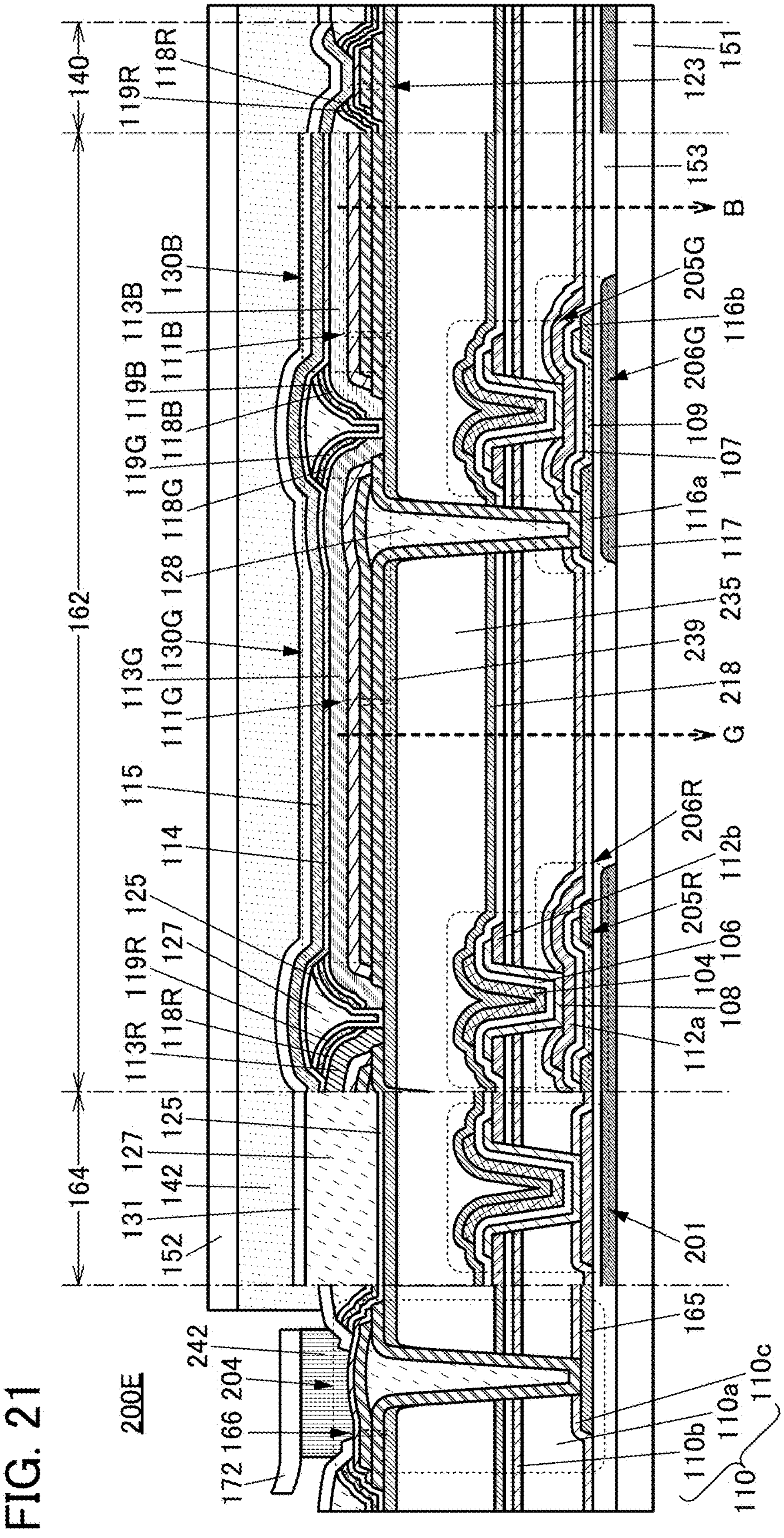
FIG. 21 is a cross-sectional view illustrating an example of a display apparatus.

A display apparatus 200E illustrated in FIG. 21 differs from the display apparatuses illustrated in FIG. 17, FIG. 18, FIG. 19, and FIG. 20 in the arrangement of the transistors 205 and 206. The display apparatus 200E differs from the display apparatus 200D illustrated in FIG. 20 mainly in having a bottom-emission structure.

In the display apparatuses illustrated in FIG. 17 to FIG. 20, the transistors 205 and 206 are adjacent to each other to form the positional relationship in the semiconductor device 10 illustrated in FIGS. 1A and 1B as a whole. Meanwhile, in the display apparatus 200E, the transistor 205 is placed over and overlaps with the transistor 206 to form the positional relationship in the semiconductor device 10A illustrated in FIGS. 2A and 2B as a whole. In a bottom-emission display apparatus, light emitted by light-emitting devices is emitted toward the substrate 151. Thus, the positional relationship between the transistors 205 and 206 in the semiconductor device 10A increases the aperture ratio of the display apparatus more significantly than that in the semiconductor device 10.

As described above, light from the light-emitting device is emitted toward the substrate 151. For the substrate 151, a material having a good property of transmitting visible light is preferably used. By contrast, there is no limitation on the light-transmitting property of a material used for the substrate 152.

The light-blocking layer 117 is preferably formed between the substrate 151 and the transistor 201 and between the substrate 151 and the transistors 205 and 206. FIG. 21 shows an example in which the light-blocking layer 117 is provided over the substrate 151, an insulating layer 153 is provided over the light-blocking layer 117, and the transistors 201, 205R, 206R, 205G, and 206G are provided over the insulating layer 153.

A material having a good property of transmitting visible light is used for each of the pixel electrode 111R (not illustrated) and the pixel electrodes 111G and 111B. A material that reflects visible light is preferably used for the common electrode 115.

<Display Apparatus 200F>

Figure 22:
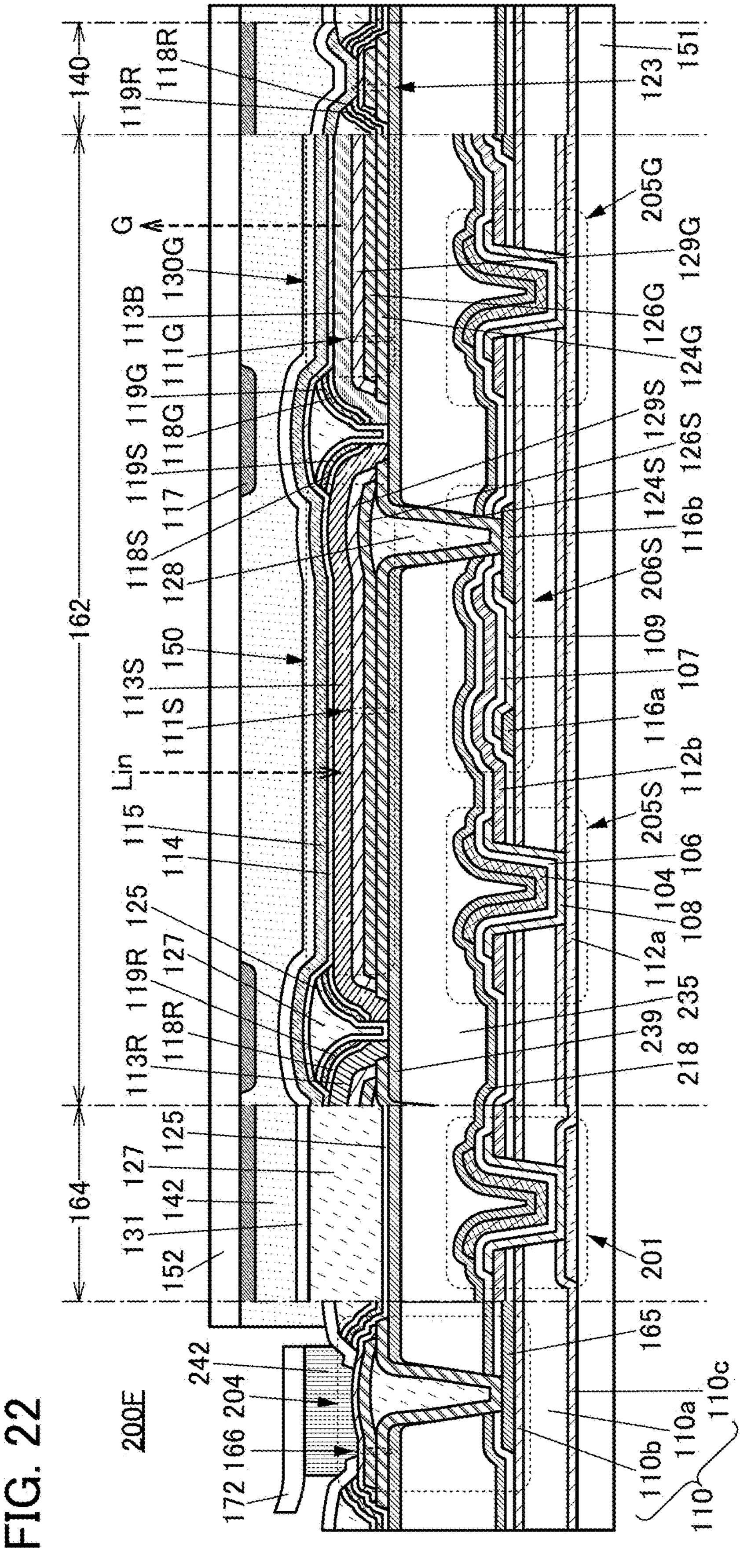
FIG. 22 is a cross-sectional view illustrating an example of a display apparatus.

A display apparatus 200F illustrated in FIG. 22 differs from the display apparatus 200D illustrated in FIG. 20 mainly in including a light-receiving device 150.

As the light-receiving device 150, a PN photodiode or a PIN photodiode can be used, for example. The light-receiving device 150 functions as a photoelectric conversion device (also referred to as a photoelectric conversion element) that senses light entering the light-receiving device and generate electric charge. The amount of electric charge generated from the light-receiving device 150 depends on the amount of light entering the light-receiving device 150.

The light-receiving device 150 can sense one or both of visible light and infrared light. In the case of sensing visible light, for example, one or more of blue light, violet light, bluish violet light, green light, yellowish green light, yellow light, orange light, red light, and the like can be sensed. The infrared light is preferably sensed because an object can be sensed even in a dark environment.

It is particularly preferable to use an organic photodiode including a layer containing an organic compound as the light-receiving device 150. An organic photodiode, which is easily made thin, lightweight, and large in area and has a high degree of freedom for shape and design, can be used in a variety of display apparatuses.

In one embodiment of the present invention, an organic EL device is used as the light-emitting device 130, and an organic photodiode is used as the light-receiving device 150. The organic EL device and the organic photodiode can be formed over one substrate. Thus, the organic photodiode can be incorporated into the display apparatus including the organic EL device.

The light-receiving device 150 is driven by application of reverse bias between the pixel electrode 111S and the common electrode 115, whereby light entering the light-receiving device can be sensed and electric charge can be generated and extracted as a current.

In FIG. 22, the light G, which is emitted toward the substrate 152 from the light-emitting device 130G, and light Lin, which enters the light-receiving device 150 through the substrate 152, are indicated by the respective arrows with broken lines.

A manufacturing method similar to that of the light-emitting device 130 can be employed for the light-receiving device 150. An island-shaped active layer (also referred to as a photoelectric conversion layer) included in the light-receiving device can be formed with a fine metal mask, for example. The active layer can be formed by a photolithography method instead of the method with a fine metal mask. In the photolithography method, a film that is to be the active layer is processed after formed on the entire surface, and accordingly the island-shaped active layer with a uniform thickness can be formed. Moreover, providing the mask layer over the active layer can reduce damage to the active layer in the manufacturing process of the display apparatus, resulting in an improvement in reliability of the light-receiving device. A structure example in which the active layer is formed by the photolithography method is described.

The light-receiving device 150 includes the pixel electrode 111S, a layer 113S, the common layer 114, and the common electrode 115. The layer 113S includes at least an active layer. The pixel electrode 111S has a stacked structure of a conductive layer 124S, a conductive layer 126S over the conductive layer 124S, and a conductive layer 129S over the conductive layer 126S. The pixel electrode 111S can be formed in the same process as the pixel electrode 111R (not illustrated), the pixel electrode 111G, and the pixel electrode 111B (not illustrated).

The pixel electrode 111S is electrically connected to the conductive layer 116*b* included in a transistor 206S. A transistor 205S can be fabricated in the same process as the transistors 205R, 205G, and 205B. The transistor 206S can be fabricated in the same process as the transistors 206R, 206G, and 206B. The insulating layers 235, 218, 106, and 107 include an opening in a region overlapping with the conductive layer 116*b* included in the transistor 206S. The pixel electrode 111S of the light-receiving device 150 is provided to cover the opening. The conductive layer 116*b* included in the transistor 206S is electrically connected to the pixel electrode 111S through the opening. The layer 113S is provided over the pixel electrode 111S. The common layer 114 is provided over the layer 113S, and the common electrode 115 is provided over the common layer 114. The common layer 114 is a continuous layer shared between the light-receiving device 150 and the light-emitting device 130.

Here, the layer 113S includes at least an active layer, preferably includes a plurality of functional layers. Examples of the functional layer include carrier-transport layers (a hole-transport layer and an electron-transport layer) and carrier-blocking layers (a hole-blocking layer and an electron-blocking layer). In addition, one or more layers are preferably formed over the active layer. A layer between the active layer and the mask layer can inhibit the active layer from being exposed on the outermost surface during the manufacturing process of the display apparatus and can reduce damage to the active layer. Accordingly, the reliability of the light-receiving device 150 can be increased. Thus, the layer 113S preferably includes an active layer and a carrier-blocking layer (a hole-blocking layer or an electron-blocking layer) or a carrier-transport layer (an electron-transport layer or a hole-transport layer) over the active layer.

The layer 113S is provided in the light-receiving device 150, not in the light-emitting devices 130. Note that the functional layer other than the active layer in the layer 113S may include the same material as the functional layer other than the light-emitting layer in the layer 113R, 113G, or 113B. Meanwhile, the common layer 114 is a continuous layer shared by the light-emitting device 130 and the light-receiving device 150.

Here, a layer shared by the light-receiving device and the light-emitting device may have a different function depending on which device the layer is in. In this specification, the name of a component is based on its function in the light-emitting device in some cases. For example, a hole-injection layer functions as a hole-injection layer in the light-emitting device and functions as a hole-transport layer in the light-receiving device. Similarly, an electron-injection layer functions as an electron-injection layer in the light-emitting device and functions as an electron-transport layer in the light-receiving device. A layer shared by the light-receiving device and the light-emitting device may have the same function in both the light-receiving device and the light-emitting device. For example, the hole-transport layer functions as a hole-transport layer in both the light-emitting device and the light-receiving device, and the electron-transport layer functions as an electron-transport layer in both the light-emitting device and the light-receiving device.

The insulating layer 125 and the insulating layer 127 over the insulating layer 125 are provided in a region between the light-emitting device 130 and the light-receiving device 150 adjacent to each other. Although not illustrated, the insulating layer 125 and the insulating layer 127 over the insulating layer 125 are provided also in a region between adjacent light-emitting devices.

The mask layers 118R and 119R are positioned between the layer 113R and the insulating layer 125, and mask layers 118S and 119S are positioned between the layer 113S and the insulating layer 125. The mask layers 118R and 119R are remaining parts of the mask layer provided over the layer 113R at the time of processing the layer 113R. The mask layers 118S and 119S are remaining parts of a mask layer provided in contact with the top surface of the layer 113S at the time of processing the layer 113S, which is a layer including the active layer. The mask layers 118R and 118S may contain the same material or different materials. The mask layers 119R and 119S may contain the same material or different materials.

This embodiment can be combined with any of the other embodiments or an example as appropriate.

Embodiment 3

In this embodiment, display apparatuses of embodiments of the present invention are described with reference to FIGS. 23A to 23H and FIGS. 24A to 24K.

A pixel layout is described. There is no particular limitation on the arrangement of subpixels, and a variety of methods can be employed. Examples of the arrangement of subpixels include stripe arrangement, S stripe arrangement, matrix arrangement, delta arrangement, Bayer arrangement, and PenTile arrangement.

Examples of a planar shape of the subpixel include polygons such as a triangle, a tetragon (including a rectangle and a square), and a pentagon; polygons with rounded corners; an ellipse; and a circle. A planar shape of the subpixel corresponds to a planar shape of a light-emitting region of a light-emitting device and a planar shape of a light-receiving region of a light-receiving device.

Figure 23A:
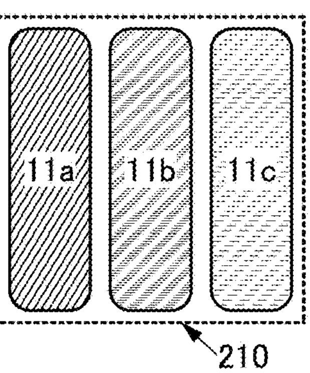
FIGS. 23A to 23H illustrate examples of pixels.

The pixel 210 illustrated in FIG. 23A employs S-stripe arrangement. The pixel 210 includes three types of subpixels 11*a*, 11*b*, and 11*c*. The subpixels 11*a*, 11*b*, and 11*c* emit light of different colors from each other. The subpixels 11*a*, 11*b*, and 11*c* can be of three colors of red (R), green (G), and blue (B) or of three colors of yellow (Y), cyan (C), and magenta (M), for example. The number of types of subpixels is not limited to three, and four or more types of subpixels may be used. Examples of four subpixels include subpixels emitting light of four colors of R, G, B, and white (W), subpixels emitting light of four colors of R, G, B, and Y, and four subpixels emitting light of R, G, and B and infrared light (IR).

The subpixels each include a pixel circuit that controls the light-emitting device. The pixel circuit is not necessarily placed within the dimensions of the subpixel illustrated in FIG. 23A and may be placed outside the subpixel. For example, transistors included in the pixel circuit of a subpixel 11*a* may be positioned within the range of a subpixel 11*a* illustrated in FIG. 23A, or some or all of the transistors may be positioned outside the range of the subpixel 11*a*.

Although the subpixels 11*a*, 11*b*, and 11*c* have the same or substantially the same aperture ratio (also referred to as size or size of a light-emitting region) in FIG. 23A, one embodiment of the present invention is not limited thereto. Note that the aperture ratio of each of the subpixels 11*a*, 11*b*, and 11*c* can be determined as appropriate. The subpixels 11*a*, 11*b*, and 11*c* may have different aperture ratios, or two or more of the subpixels 11*a*, 11*b*, and 11*c* may have the same or substantially the same aperture ratio.

Figure 23B:
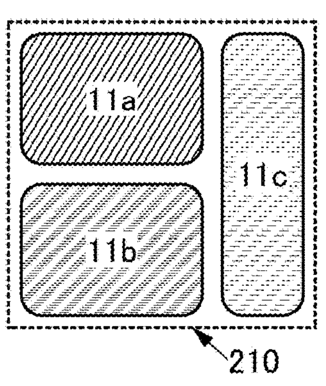

The pixel 210 in FIG. 23B employs S-stripe arrangement. In FIG. 23B, the three subpixels 11*a*, 11*b*, and 11*c* form the pixel 210, where two subpixels 11*a* and 11*b* are in the left column (first column) and one subpixel 11*c* is in the right column (second column).

Figure 23C:
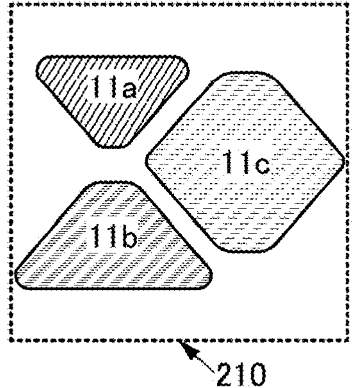

The pixel 210 illustrated in FIG. 23C includes the subpixel 11*a* whose planar shape is a rough trapezoidal shape with rounded corners, the subpixel 11*b* whose planar shape is a rough triangle shape with rounded corners, and the subpixel 11*c* whose planar shape is a rough tetragonal or rough hexagonal shape with rounded corners. The subpixel 11*a* has a smaller light-emitting area than the subpixel 11*b*. In this manner, the shapes and sizes of the subpixels can be determined independently. For example, the size of a subpixel including a light-emitting device with higher reliability can be smaller.

Figure 23D:
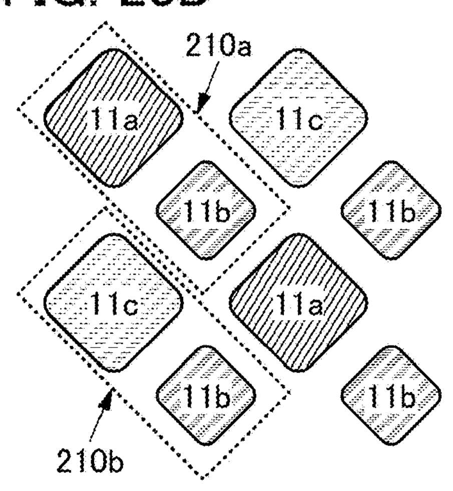

A pixel 210*a* and a pixel 210*b* illustrated in FIG. 23D employ PenTile arrangement. FIG. 23D illustrates an example where the pixels 210*a* including the subpixels 11*a* and 11*b* and the pixels 210*b* including the subpixels 11*b* and 11*c* are alternately arranged.

Figure 23E:
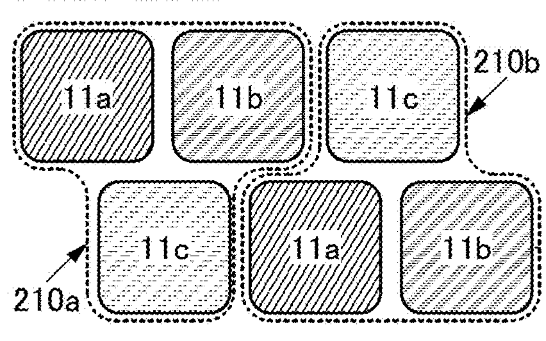
Figure 23F:
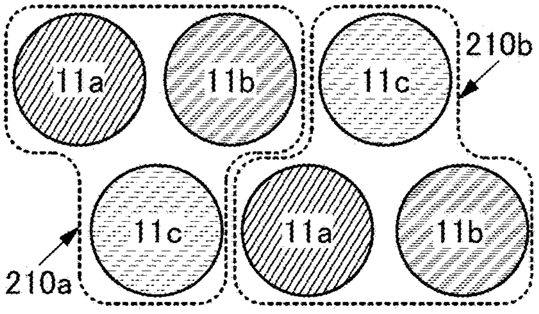
Figure 23G:
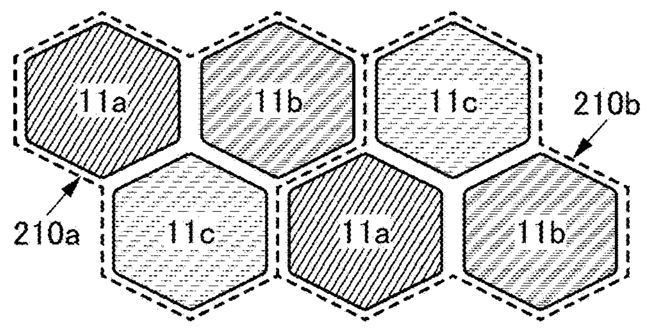

The pixels 210*a* and 210*b* illustrated in FIGS. 23E and 23G employ delta arrangement. The pixel 210*a* includes two subpixels (the subpixels 11*a* and 11*b*) in the upper row (first row) and one subpixel (the subpixel 11*c*) in the lower row (second row). The pixel 210*b* includes one subpixel (the subpixel 11*c*) in the upper row (first row) and two subpixels (the subpixels 11*a* and 11*b*) in the lower row (second row).

FIG. 23E illustrates an example where the planar shape of each subpixel is a rough square shape with rounded corners, FIG. 23F illustrates an example where the planar shape of each subpixel is a circular shape, and FIG. 23G illustrates an example where the planar shape of each subpixel is a rough hexagonal shape with rounded corners.

In FIG. 23G, each subpixel is provided inside one of the closest-packed hexagonal regions. Focusing on one of the subpixels, the subpixel is placed so as to be surrounded by six subpixels. In addition, the subpixels are arranged such that subpixels exhibiting the same color are not adjacent to each other. For example, focusing on the subpixel 11*a*, three subpixels 11*b* and three subpixels 11*c* are alternately provided so as to surround the subpixel 11*a*.

Figure 23H:
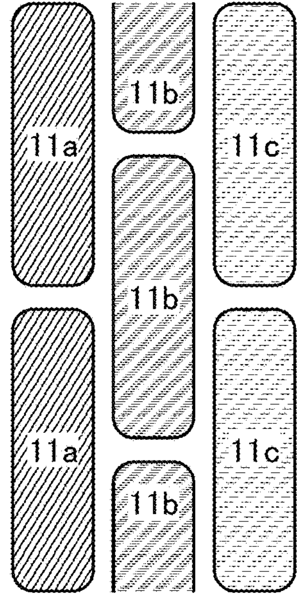

FIG. 23H illustrates an example where subpixels of different colors are arranged in a zigzag manner. Specifically, the positions of the top sides of two subpixels arranged in the column direction (e.g., the subpixel 11*a* and the subpixel 11*b* or the subpixel 11*b* and the subpixel 11*c*) are not aligned in the top view.

For example, in each pixel in FIGS. 23A to 23H, it is preferable that the subpixel 11*a* be a subpixel R emitting red light, the subpixel 11*b* be a subpixel G emitting green light, and the subpixel 11*c* be a subpixel B emitting blue light. Note that the structures of the subpixels are not limited to this, and the colors and arrangement order of the subpixels can be determined as appropriate. For example, the subpixel 11*b* may be the subpixel R emitting red light and the subpixel 11*a* may be the subpixel G emitting green light.

In a photolithography method, as a pattern to be formed by processing becomes finer, the influence of light diffraction becomes more difficult to ignore; therefore, the fidelity in transferring a photomask pattern by light exposure is degraded, and it becomes difficult to process a resist mask into a desired shape. Thus, a pattern with rounded corners is likely to be formed even with a rectangular photomask pattern. Consequently, the planar shape of a subpixel may be a polygonal shape with rounded corners, an elliptical shape, a circular shape, or the like.

To obtain a desired planar shape of the subpixel, a technique of correcting a mask pattern in advance so that a transferred pattern agrees with a design pattern (an optical proximity correction (OPC) technique) may be used. Specifically, with the OPC technique, a pattern for correction is added to a corner portion or the like of a figure on a mask pattern.

As illustrated in FIGS. 24A to 24I, the pixel can include four types of subpixels.

Figures 24A, 24B, 24C, 24D, 24E, 24F, 24G, 24H, 24I, 24J, 24K:
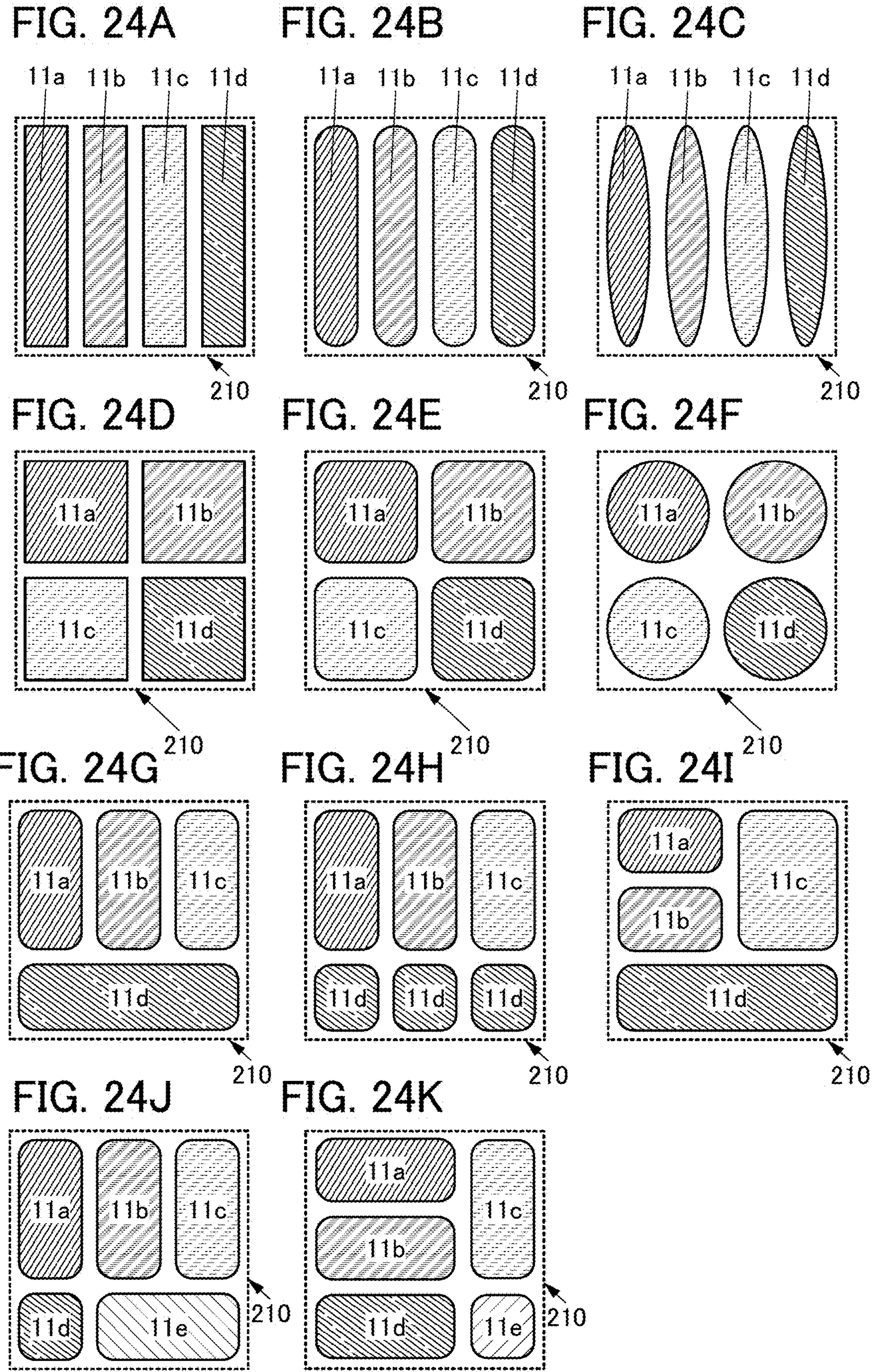
FIGS. 24A to 24K illustrate examples of pixels.

The pixel 210 illustrated in FIGS. 24A to 24C employs stripe arrangement.

FIG. 24A illustrates an example where each subpixel has a rectangular planar shape, FIG. 24B illustrates an example where each subpixel has a planar shape formed by combining two half circles and a rectangle, and FIG. 24C illustrates an example where each subpixel has an elliptical planar shape.

The pixel 210 illustrated in FIGS. 24D to 24F employs matrix arrangement.

FIG. 24D illustrates an example where the top surface of each subpixel has a square shape, FIG. 24E illustrates an example where the top surface of each subpixel has a rough square shape with rounded corners, and FIG. 24F illustrates an example where the top surface of each subpixel has a circular shape.

FIGS. 24G and 24H each illustrate an example where one pixel 210 is composed of two rows and three columns.

The pixel 210 illustrated in FIG. 24G includes three subpixels (the subpixels 11*a*, 11*b*, and 11*c*) in the upper row (first row) and one subpixel (subpixel 11*d*) in the lower row (second row). In other words, the pixel 210 includes the subpixel 11*a* in the left column (first column), the subpixel 11*b* in the center column (second column), the subpixel 11*c* in the right column (third column), and the subpixel 11*d* across these three columns.

The pixel 210 illustrated in FIG. 24H includes three subpixels (the subpixels 11*a*, 11*b*, and 11*c*) in the upper row (first row) and three subpixels 11*d* in the lower row (second row). In other words, the pixel 210 includes the subpixel 11*a* and the subpixel 11*d* in the left column (first column), the subpixel 11*b* and another subpixel 11*d* in the center column (second column), and the subpixel 11*c* and another subpixel 11*d* in the right column (third column). Matching the positions of the subpixels in the upper row and the lower row as illustrated in FIG. 24H enables dust and the like that would be produced in the manufacturing process to be removed efficiently. Thus, a display apparatus having high display quality can be provided.

FIG. 24I illustrates an example where one pixel 210 is composed of three rows and two columns.

The pixel 210 illustrated in FIG. 24I includes the subpixel 11*a* in the upper row (first row), the subpixel 11*b* in the center row (second row), the subpixel 11*c* across the first and second rows, and one subpixel (the subpixel 11*d*) in the lower row (third row). In other words, the pixel 210 includes the subpixels 11*a* and 11*b* in the left column (first column), the subpixel 11*c* in the right column (second column), and the subpixel 11*d* across these two columns.

The pixel 210 illustrated in FIGS. 24A to 24I includes four types of subpixels 11*a*, 11*b*, 11*c*, and 11*d*.

The subpixels 11*a*, 11*b*, 11*c*, and 11*d* include light-emitting devices that emit light of different colors. The subpixels 11*a*, 11*b*, 11*c*, and 11*d* can be of four colors of R, G, B, and white (W), of four colors of R, G, B, and Y, or of R, G, B and infrared (IR) light, for example.

In the pixel 210 illustrated in FIGS. 24A to 24I, it is preferable that the subpixel 11*a* be the subpixel R emitting red light, the subpixel 11*b* be the subpixel G emitting green light, the subpixel 11*c* be the subpixel B emitting blue light, and the subpixel 11*d* be any of a subpixel W emitting white light, a subpixel Y emitting yellow light, and a subpixel IR emitting near-infrared light, for example. In the case of such a structure, stripe arrangement is employed as the layout of R, G, and B in the pixel 210 illustrated in FIGS. 24G and 24H, leading to an increase in the display quality. In the pixel 210 illustrated in FIG. 24I, what is called S stripe arrangement is employed as the layout of R, G, and B, leading to higher display quality.

The pixel 210 may include a subpixel including a light-receiving device.

In the pixel 210 illustrated in FIGS. 24A to 24I, any one of the subpixels 11*a* to 11*d* may be a subpixel including a light-receiving device.

In the pixel 210 illustrated in FIGS. 24A to 24I, for example, it is preferable that the subpixel 11*a* be the subpixel R emitting red light, the subpixel 11*b* be the subpixel G emitting green light, the subpixel 11*c* be the subpixel B emitting blue light, and the subpixel 11*d* be a subpixel S including a light-receiving device. In the case of such a structure, stripe arrangement is employed as the layout of R, G, and B in the pixel 210 illustrated in FIGS. 24G and 24H, leading to higher display quality. In addition, what is called S stripe arrangement is employed as the layout of R, G, and B in the pixel 210 illustrated in FIG. 24I, leading to higher display quality.

There is no particular limitation on the wavelength of light sensed by the subpixel S including a light-receiving device. The subpixel S can have a structure in which one or both of infrared light and visible light can be sensed.

As illustrated in FIGS. 24J and 24K, the pixel can include five types of subpixels.

FIG. 24J illustrates an example where one pixel 210 is composed of two rows and three columns.

The pixel 210 illustrated in FIG. 24J includes three subpixels (the subpixels 11*a*, 11*b*, and 11*c*) in the upper row (first row) and two subpixels (the subpixel 11*d* and a subpixel 11*e*) in the lower row (second row). In other words, the pixel 210 includes the subpixels 11*a* and 11*d* in the left column (first column), the subpixel 11*b* in the center column (second column), the subpixel 11*c* in the right column (third column), and the subpixel 11*e* across the second and third columns.

FIG. 24K illustrates an example where one pixel 210 is composed of three rows and two columns.

The pixel 210 illustrated in FIG. 24K includes the subpixel 11*a* in the upper row (first row), the subpixel 11*b* in the center row (second row), the subpixel 11*c* across the first and second rows, and two subpixels (the subpixels 11*d* and 11*e*) in the lower row (third row). In other words, the pixel 210 includes the subpixels 11*a*, 11*b*, and 11*d* in the left column (first column), and the subpixels 11*c* and lie in the right column (second column).

In the pixel 210 illustrated in FIGS. 24J and 24K, for example, it is preferable that the subpixel 11*a* be the subpixel R emitting red light, the subpixel 11*b* be the subpixel G emitting green light, and the subpixel 11*c* be the subpixel B emitting blue light. In the case of such a structure, stripe arrangement is employed as the layout of R, G, and B in the pixel 210 illustrated in FIGS. 24J, leading to higher display quality. In addition, what is called S stripe arrangement is employed as the layout of R, G, and B in the pixel 210 illustrated in FIG. 24K, leading to higher display quality.

In the pixel 210 illustrated in FIGS. 24J and 24K, for example, it is preferable to use the subpixel S including a light-receiving device as at least one of the subpixels 11*d* and 11*e*. In the case where light-receiving devices are used in both the subpixels 11*d* and 11*e*, the light-receiving devices may have different structures. For example, the wavelength ranges of sensed light may be different at least partly. Specifically, one of the subpixels 11*d* and 11*e* may include a light-receiving device mainly sensing visible light and the other may include a light-receiving device mainly sensing infrared light.

In the pixel 210 illustrated in FIGS. 24J and 24K, for example, it is preferable that the subpixel S including a light-receiving device be used as one of the subpixels 11*d* and 11*e* and a subpixel including a light-receiving device that can be used as a light source be used as the other. For example, it is preferable that one of the subpixels 11*d* and 11*e* be the subpixel IR emitting infrared light and the other be the subpixel S including a light-receiving device sensing infrared light.

In the pixel including the subpixels R, G, B, IR, and S, while displaying an image using the subpixels R, G, and B, the subpixel S can sense reflected light of infrared light emitted from the subpixel IR that is used as a light source.

As described above, the pixel composed of the subpixels each including the light-emitting device can employ any of a variety of layouts in the display apparatus of one embodiment of the present invention. The display apparatus of one embodiment of the present invention can have a structure in which the pixel includes both a light-emitting device and a light-receiving device. In this case, any of a variety of layouts can be employed.

This embodiment can be combined with any of the other embodiments or an example as appropriate.

Embodiment 4

In this embodiment, a light-emitting device that can be used in the display apparatus of one embodiment of the present invention will be described.

[Light-Emitting Device]

As illustrated in FIG. 25A, the light-emitting device includes an EL layer 763 between a pair of electrodes (a lower electrode 761 and an upper electrode 762). The EL layer 763 can be formed of a plurality of layers such as a layer 780, a light-emitting layer 771, and a layer 790.

The light-emitting layer 771 contains at least a light-emitting substance (also referred to as a light-emitting material).

In the case where the lower electrode 761 is an anode and the upper electrode 762 is a cathode, the layer 780 includes one or more of a layer containing a material having a high hole-injection property (a hole-injection layer), a layer containing a material having a high hole-transport property (a hole-transport layer), and a layer containing a material having a high electron-blocking property (an electron-blocking layer). The layer 790 includes one or more of a layer containing a material having a high electron-injection property (an electron-injection layer), a layer containing a material having a high electron-transport property (an electron-transport layer), and a layer containing a material having a high hole-blocking property (a hole-blocking layer). In the case where the lower electrode 761 is a cathode and the upper electrode 762 is an anode, the structures of the layers 780 and 790 are replaced with each other.

The structure including the layer 780, the light-emitting layer 771, and the layer 790, which is provided between a pair of electrodes, can function as a single light-emitting unit, and the structure in FIG. 25A is referred to as a single structure in this specification.

FIG. 25B is a variation example of the EL layer 763 included in the light-emitting device illustrated in FIG. 25A. Specifically, the light-emitting device illustrated in FIG. 25B includes a layer 781 over the lower electrode 761, a layer 782 over the layer 781, the light-emitting layer 771 over the layer 782, a layer 791 over the light-emitting layer 771, a layer 792 over the layer 791, and the upper electrode 762 over the layer 792.

In the case where the lower electrode 761 is an anode and the upper electrode 762 is a cathode, the layer 781 can be a hole-injection layer, the layer 782 can be a hole-transport layer, the layer 791 can be an electron-transport layer, and the layer 792 can be an electron-injection layer, for example. In the case where the lower electrode 761 is a cathode and the upper electrode 762 is an anode, the layer 781 can be an electron-injection layer, the layer 782 can be an electron-transport layer, the layer 791 can be a hole-transport layer, and the layer 792 can be a hole-injection layer. With such a layered structure, carriers can be efficiently injected to the light-emitting layer 771, and the efficiency of the recombination of carriers in the light-emitting layer 771 can be enhanced.

Note that structures in which a plurality of light-emitting layers (light-emitting layers 771, 772, and 773) are provided between the layers 780 and 790 as illustrated in FIGS. 25C and 25D are other variations of the single structure. Although FIGS. 25C and 25D illustrate the examples where three light-emitting layers are included, the light-emitting device having a single structure may include two or four or more light-emitting layers. In addition, the light-emitting device having a single structure may include a buffer layer between two light-emitting layers. A carrier-transport layer (a hole-transport layer or an electron-transport layer) can be used as the buffer layer, for example.

In this specification, as illustrated in FIGS. 25E and 25F, a structure where a plurality of light-emitting units (a light-emitting unit 763*a* and a light-emitting unit 763*b*) are connected in series with a charge-generation layer 785 therebetween is referred to as a tandem structure. Note that a tandem structure may be referred to as a stack structure. The tandem structure enables a light-emitting device capable of high-luminance light emission. Furthermore, a tandem structure allows the amount of current needed for obtaining the same luminance to be reduced as compared to the case of using a single structure, and thus can improve the reliability.

Note that FIGS. 25D and 25F illustrate examples where the display apparatus includes a layer 764 overlapping with the light-emitting device. FIG. 25D illustrates an example where the layer 764 overlaps with the light-emitting device illustrated in FIG. 25C, and FIG. 25F illustrates an example where the layer 764 overlaps with the light-emitting device illustrated in FIG. 25E. In FIGS. 25D and 25F, a conductive film transmitting visible light is used for the upper electrode 762 to extract light to the upper electrode 762 side.

One or both of a color conversion layer and a color filter (coloring layer) can be used as the layer 764.

In FIGS. 25C and 25D, light-emitting substances that emit light of the same color or the same light-emitting substance may be used for the light-emitting layers 771, 772, and 773. For example, a light-emitting substance that emits blue light may be used for the light-emitting layers 771, 772, and 773. In a subpixel that emits blue light, blue light from the light-emitting device can be extracted as it is. In each of a subpixel that emits red light and a subpixel that emits green light, a color conversion layer is provided as the layer 764 illustrated in FIG. 25D for converting blue light from the light-emitting device into light with a longer wavelength, so that red light or green light can be extracted. As the layer 764, both a color conversion layer and a coloring layer are preferably used. In some cases, part of light emitted from the light-emitting device is transmitted through the color conversion layer without being converted. When light transmitted through the color conversion layer is extracted through the coloring layer, light other than light of the intended color can be absorbed by the coloring layer, and color purity of light exhibited by a subpixel can be improved.

In FIGS. 25C and 25D, light-emitting substances that emit light of different colors may be used for the light-emitting layers 771, 772, and 773. When the light-emitting layers 771, 772, and 773 emit light of complementary colors, the light emitted from the light-emitting layer 771, the light emitted from the light-emitting layer 772, and the light emitted from the light-emitting layer 773 are mixed and thus white light emission can be obtained as a whole. The light-emitting device having a single structure preferably includes a light-emitting layer containing a light-emitting substance emitting blue light and a light-emitting layer containing a light-emitting substance emitting visible light with a longer wavelength than blue light, for example.

A color filter may be provided as the layer 764 illustrated in FIG. 25D. When white light passes through a color filter, light of a desired color can be obtained.

In the case where the light-emitting device having a single structure includes three light-emitting layers, for example, a light-emitting layer containing a light-emitting substance emitting red (R) light, a light-emitting layer containing a light-emitting substance emitting green (G) light, and a light-emitting layer containing a light-emitting substance emitting blue (B) light are preferably included. The stacking order of the light-emitting layers can be RGB or RBG from an anode side, for example. In that case, a buffer layer may be provided between R and G or between R and B.

In the case where the light-emitting device having a single structure includes two light-emitting layers, for example, a light-emitting layer containing a light-emitting substance emitting blue (B) light and a light-emitting layer containing a light-emitting substance emitting yellow (Y) light are preferably included. Such a structure may be referred to as a BY single structure.

In the light-emitting device that emits white light, two or more kinds of light-emitting substances are preferably contained. To obtain white light emission, the two or more kinds of light-emitting substances are selected so as to emit light of complementary colors. For example, when emission colors of a first light-emitting layer and a second light-emitting layer are complementary colors, the light-emitting device can emit white light as a whole. The same applies to a light-emitting device including three or more light-emitting layers.

In FIGS. 25C and 25D, each of the layers 780 and 790 may independently has a stacked structure of two or more layers as in FIG. 25B.

In FIGS. 25E and 25F, light-emitting substances emitting light of the same color or the same light-emitting substance may be used for the light-emitting layers 771 and 772. For example, in light-emitting devices included in subpixels emitting light of different colors, a light-emitting substance that emits blue light can be used for each of the light-emitting layer 771 and the light-emitting layer 772. In the subpixel that emits blue light, blue light from the light-emitting device can be extracted as it is. In each of the subpixel that emits red light and the subpixel that emits green light, a color conversion layer is provided as the layer 764 illustrated in FIG. 25F for converting blue light from the light-emitting device into light with a longer wavelength, so that red light or green light can be extracted. As the layer 764, both a color conversion layer and a coloring layer are preferably used.

In the case where the light-emitting device having any of the structures illustrated in FIG. 25E or 25F is used for the subpixels emitting different colors, the subpixels may use different light-emitting substances. Specifically, in the light-emitting device included in the subpixel emitting red light, a light-emitting substance that emits red light can be used for each of the light-emitting layer 771 and the light-emitting layer 772. In the light-emitting device included in the subpixel emitting green light, a light-emitting substance that emits green light can be used for each of the light-emitting layer 771 and the light-emitting layer 772. In the light-emitting device included in the subpixel emitting blue light, a light-emitting substance that emits blue light can be used for each of the light-emitting layer 771 and the light-emitting layer 772. A display apparatus having such a structure can be regarded as employing a light-emitting device with the tandem structure and the SBS structure. Thus, such a display apparatus takes advantages of both the tandem structure and the SBS structure. Thus, a light-emitting device being capable of high-luminance light emission and having high reliability can be obtained.

In FIGS. 25E and 25F, light-emitting substances emitting light of different colors may be used for the light-emitting layers 771 and 772. When the light-emitting layers 771 and 772 emit light of complementary colors, the light emitted from the light-emitting layer 771 and the light emitted from the light-emitting layer 772 are mixed and thus white light emission can be obtained as a whole. A color filter may be provided as the layer 764 illustrated in FIG. 25F. When white light passes through a color filter, light of a desired color can be obtained.

Although FIGS. 25E and 25F illustrate examples where the light-emitting unit 763*a* includes one light-emitting layer 771 and the light-emitting unit 763*b* includes one the light-emitting layer 772, one embodiment of the present invention is not limited thereto. The light-emitting units 763*a* and 763*b* may each include two or more light-emitting layers.

In addition, although FIGS. 25E and 25F illustrate the light-emitting device including two light-emitting units, one embodiment of the present invention is not limited thereto. The light-emitting device may include three or more light-emitting units. Note that a structure including two light-emitting units and a structure including three light-emitting units may be referred to as a two-unit tandem structure and a three-unit tandem structure, respectively.

In FIGS. 25E and 25F, the light-emitting unit 763*a* includes a layer 780*a*, the light-emitting layer 771, and a layer 790*a*, and the light-emitting unit 763*b* includes a layer 780*b*, the light-emitting layer 772, and a layer 790*b*.

In the case where the lower electrode 761 is an anode and the upper electrode 762 is a cathode, and the layers 780*a* and 780*b* each include one or more of a hole-injection layer, a hole-transport layer, and an electron-blocking layer. The layers 790*a* and 790*b* each include one or more of an electron-injection layer, an electron-transport layer, and a hole-blocking layer. In the case where the lower electrode 761 is a cathode and the upper electrode 762 is an anode, the structures of the layers 780*a* and 790*a* are replaced with each other, and the structures of the layers 780*b* and 790*b* are also replaced with each other.

In the case where the lower electrode 761 is an anode and the upper electrode 762 is a cathode, for example, the layer 780*a* includes a hole-injection layer and a hole-transport layer over the hole-injection layer, and may further include an electron-blocking layer over the hole-transport layer. The layer 790*a* includes an electron-transport layer, and may further include a hole-blocking layer between the light-emitting layer 771 and the electron-transport layer. The layer 780*b* includes a hole-transport layer, and may further include an electron-blocking layer over the hole-transport layer. The layer 790*b* includes an electron-transport layer and an electron-injection layer over the electron-transport layer, and may further include a hole-blocking layer between the light-emitting layer 772 and the electron-transport layer. In the case where the lower electrode 761 is a cathode and the upper electrode 762 is an anode, for example, the layer 780*a* includes an electron-injection layer and an electron-transport layer over the electron-injection layer, and may further include a hole-blocking layer over the electron-transport layer. The layer 790*a* includes a hole-transport layer, and may further include an electron-blocking layer between the light-emitting layer 771 and the hole-transport layer. The layer 780*b* includes an electron-transport layer, and may further include a hole-blocking layer over the electron-transport layer. The layer 790*b* includes a hole-transport layer and a hole-injection layer over the hole-transport layer, and may further include an electron-blocking layer between the light-emitting layer 772 and the hole-transport layer.

In the case of manufacturing a light-emitting device having a tandem structure, two light-emitting units are stacked with the charge-generation layer 785 therebetween. The charge-generation layer 785 includes at least a charge-generation region. The charge-generation layer 785 has a function of injecting electrons into one of the two light-emitting units and injecting holes to the other when voltage is applied between the pair of electrodes.

Examples of the light-emitting device with a tandem structure are structures illustrated in FIGS. 26A to 26C.

FIG. 26A shows a structure including three light-emitting units. In the structure illustrated in FIG. 26A, a plurality of light-emitting units (light-emitting units 763*a*, 763*b*, and 763*c*) are connected in series with the charge-generation layer 785 provided between each two light-emitting units. The light-emitting unit 763*a* includes the layer 780*a*, the light-emitting layer 771, and the layer 790*a*. The light-emitting unit 763*b* includes the layer 780*b*, the light-emitting layer 772, and the layer 790*b*. The light-emitting unit 763*c* includes a layer 780*c*, the light-emitting layer 773, and a layer 790*c*. Note that the layer 780*c* can have a structure applicable to the layers 780*a* and 780*b*, and the layer 790*c* can have a structure applicable to the layers 790*a* and 790*b*.

In FIG. 26A, the light-emitting layers 771, 772, and 773 preferably contain light-emitting substances that emit light of the same color. Specifically, the light-emitting layers 771, 772, and 773 can each contain a light-emitting substance that emits red (R) light (i.e., an R\R\R three-unit tandem structure), can each contain a light-emitting substance that emits green (G) light (i.e., a G\G\G three-unit tandem structure), or can each contain a light-emitting substance that emits blue (B) light (i.e., a B\B\B three-unit tandem structure). Note that "a\b" means that a light-emitting unit containing a light-emitting substance that emits light of the color "b" is provided over a light-emitting unit containing a light-emitting substance that emits light of the color "a" with a charge-generation layer therebetween.

In FIG. 26A, light-emitting substances that emit light of different colors may be used for some or all of the light-emitting layers 771, 772, and 773. Examples of a combination of emission colors for the light-emitting layers 771, 772, and 773 include blue (B) for two of them and yellow (Y) for the other; and red (R) for one of them, green (G) for another, and blue (B) for the other.

Note that the structure containing the light-emitting substances that emit light of the same color is not limited to the above structure. For example, a light-emitting device with a tandem structure may be employed in which light-emitting units each including a plurality of light-emitting layers are stacked as illustrated in FIG. 26B. FIG. 26B illustrates a structure in which two light-emitting units (light-emitting units 763*a* and 763*b*) are connected in series with the charge-generation layer 785 therebetween. The light-emitting unit 763*a* includes the layer 780*a*, a light-emitting layer 771*a*, a light-emitting layer 771*b*, a light-emitting layer 771*c*, and the layer 790*a*. The light-emitting unit 763*b* includes the layer 780*b*, a light-emitting layer 772*a*, a light-emitting layer 772*b*, a light-emitting layer 772*c*, and the layer 790*b*.

In FIG. 26B, the light-emitting unit 763*a* is configured to emit white (W) light by selecting light-emitting substances for the light-emitting layers 771*a*, 771*b*, and 771*c* so that their emission colors are complementary colors. Furthermore, the light-emitting unit 763*b* is configured to emit white (W) light by selecting light-emitting substances for the light-emitting layers 772*a*, 772*b*, and 772*c* are selected so that their emission colors are complementary colors. That is, the structure illustrated in FIG. 26B is a two-unit tandem structure of W\W. Note that there is no particular limitation on the stacking order of light-emitting substances that emit light of complementary colors, and a practitioner can select an optimum stacking order as appropriate. Although not illustrated, a three-unit tandem structure of W\W\W or a tandem structure with four or more units may be employed.

In the case of a light-emitting device with a tandem structure, any of the following structure may be employed, for example: a two-unit tandem structure of B\Y or Y\B including a light-emitting unit that emits yellow (Y) light and a light-emitting unit that emits blue (B) light; a two-unit tandem structure of R·G\B or B\R·G including a light-emitting unit that emits red (R) and green (G) light and a light-emitting unit that emits blue (B) light; a three-unit tandem structure of B\Y\B including a light-emitting unit that emits blue (B) light, a light-emitting unit that emits yellow (Y) light, and a light-emitting unit that emits blue (B) light in this order; a three-unit tandem structure of B\YG\B including a light-emitting unit that emits blue (B) light, a light-emitting unit that emits yellow-green (YG) light, and a light-emitting unit that emits blue (B) light in this order; and a three-unit tandem structure of B\G\B including a light-emitting unit that emits blue (B) light, a light-emitting unit that emits green (G) light, and a light-emitting unit that emits blue (B) light in this order. Note that "a·b" means that one light-emitting unit contains a light-emitting substance that emits light of the color "a" and a light-emitting substance that emits light of the color "b".

A light-emitting unit containing one light-emitting layer and a light-emitting unit including a plurality of light-emitting layers may be used in combination as illustrated in FIG. 26C.

Specifically, in the structure illustrated in FIG. 26C, a plurality of light-emitting units (the light-emitting units 763*a*, 763*b*, and 763*c*) are connected in series with the charge-generation layer 785 provided between each two light-emitting units. The light-emitting unit 763*a* includes the layer 780*a*, the light-emitting layer 771, and the layer 790*a*. The light-emitting unit 763*b* includes the layer 780*b*, the light-emitting layer 772*a*, the light-emitting layer 772*b*, the light-emitting layer 772*c*, and the layer 790*b*. The light-emitting unit 763*c* includes the layer 780*c*, the light-emitting layer 773, and the layer 790*c*.

The structure illustrated in FIG. 26C can be, for example, a three-unit tandem structure of B\R·G·YG\B in which the light-emitting unit 763*a* is a light-emitting unit that emits blue (B) light, the light-emitting unit 763*b* is a light-emitting unit that emits red (R), green (G), and yellow-green (YG) light, and the light-emitting unit 763*c* is a light-emitting unit that emits blue (B) light.

Examples of the number of stacked light-emitting units and the order of colors from the anode side include a two-unit structure of B and Y; a two-unit structure of B and a light-emitting unit X; a three-unit structure of B, Y, and B; and a three-unit structure of B, X, and B. Examples of the number of light-emitting layers stacked in the light-emitting unit X and the order of colors from an anode side include a two-layer structure of R and Y; a two-layer structure of R and G; a two-layer structure of G and R; a three-layer structure of G, R, and G; and a three-layer structure of R, G, and R. Another layer may be provided between two light-emitting layers.

Next, materials that can be used for the light-emitting device will be described.

A conductive film transmitting visible light is used for the electrode through which light is extracted, which is either the lower electrode 761 or the upper electrode 762. A conductive film reflecting visible light is preferably used for the electrode through which light is not extracted. In the case where the display apparatus includes a light-emitting device emitting infrared light, a conductive film transmitting visible light and infrared light is used for the electrode through which light is extracted, and a conductive film reflecting visible light and infrared light is preferably used for the electrode through which light is not extracted.

A conductive film transmitting visible light may be used also for the electrode through which light is not extracted. In that case, the electrode is preferably provided between a reflective layer and the EL layer 763. In other words, light emitted from the EL layer 763 may be reflected by the reflective layer to be extracted from the display apparatus.

For the pair of electrodes of the light-emitting device, a metal, an alloy, an electrically conductive compound, a mixture thereof, and the like can be used as appropriate. Specific examples of the material include metals such as aluminum, magnesium, titanium, chromium, manganese, iron, cobalt, nickel, copper, gallium, zinc, indium, tin, molybdenum, tantalum, tungsten, palladium, gold, platinum, silver, yttrium, and neodymium, and an alloy containing any of these metals in appropriate combination. Other examples of the material include indium tin oxide (In—Sn oxide, also referred to as ITO), In—Si—Sn oxide (also referred to as ITSO), indium zinc oxide (In—Zn oxide), and In—W—Zn oxide. Other examples of the material include an alloy containing aluminum (aluminum alloy), such as an alloy of aluminum, nickel, and lanthanum (Al—Ni—La), and an alloy containing silver, such as an alloy of silver and magnesium and an alloy of silver, palladium, and copper (APC). Other examples of the material include a Group 1 element and a Group 2 element of the periodic table, which are not described above (e.g., lithium, cesium, calcium, and strontium), rare earth metals such as europium and ytterbium, an alloy containing any of these elements in appropriate combination, and graphene.

The light-emitting device preferably employs a microcavity structure. Therefore, one of the pair of electrodes of the light-emitting device is preferably an electrode having properties of transmitting and reflecting visible light (a transflective electrode), and the other is preferably an electrode having a property of reflecting visible light (a reflective electrode). When the light-emitting device has a microcavity structure, light obtained from the light-emitting layer can be resonated between the electrodes, whereby light emitted from the light-emitting device can be intensified.

The transparent electrode has a light transmittance higher than or equal to 40%. For example, an electrode having a visible light (light with wavelengths greater than or equal to 400 nm and less than 750 nm) transmittance higher than or equal to 40% is preferably used in the transparent electrode of the light-emitting device. The transflective electrode has a visible light reflectance higher than or equal to 10% and lower than or equal to 95%, preferably higher than or equal to 30% and lower than or equal to 80%. The reflective electrode has a visible light reflectance higher than or equal to 40% and lower than or equal to 100%, preferably higher than or equal to 70% and lower than or equal to 100%. These electrodes preferably have a resistivity lower than or equal to $1\times10^{-2}$ Ωcm.

The light-emitting device includes at least a light-emitting layer. In addition to the light-emitting layer, the light-emitting device may further include a layer containing any of a material having a high hole-injection property, a material having a high hole-transport property, a hole-blocking material, a material having a high electron-transport property, an electron-blocking material, a material having a high electron-injection property, a material having a bipolar property (a material with a high electron- and hole-transport property), and the like. For example, the light-emitting device can include one or more of a hole-injection layer, a hole-transport layer, a hole-blocking layer, a charge-generation layer, an electron-blocking layer, an electron-transport layer, and an electron-injection layer in addition to the light-emitting layer.

Either a low molecular compound or a high molecular compound can be used in the light-emitting device, and an inorganic compound may also be included. Each layer included in the light-emitting device can be formed, for example, by an evaporation method (including a vacuum evaporation method), a transfer method, a printing method, an inkjet method, or a coating method.

The light-emitting layer can contain one or more kinds of light-emitting substances. As the light-emitting substance, a substance whose emission color is blue, violet, bluish violet, green, yellowish green, yellow, orange, red, or the like is appropriately used. Alternatively, as the light-emitting substance, a substance that emits near-infrared light can be used.

Examples of the light-emitting substance include a fluorescent material, a phosphorescent material, a TADF material, and a quantum dot material.

Examples of a fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of a phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material or an assist material) in addition to the light-emitting substance (guest material). As the one or more kinds of organic compounds, one or both of a material having a high hole-transport property (a hole-transport material) and a material having a high electron-transport property (an electron-transport material) can be used. As the hole-transport material, it is possible to use a material having a high hole-transport property which can be used for the hole-transport layer and will be described later. As the electron-transport material, it is possible to use a material having a high electron-transport property which can be used for the electron-transport layer and will be described later. Alternatively, as one or more kinds of organic compounds, a bipolar material or a TADF material may be used.

The light-emitting layer preferably includes a phosphorescent material and a combination of a hole-transport material and an electron-transport material that easily forms an exciplex, for example. With such a structure, light emission can be efficiently obtained by exciplex-triplet energy transfer (ExTET), which is energy transfer from the exciplex to the light-emitting substance (phosphorescent material). When a combination of materials is selected so as to form an exciplex that emits light whose wavelength overlaps with the wavelength of a lowest-energy-side absorption band of the light-emitting substance, energy can be transferred smoothly and light emission can be obtained efficiently. With the above structure, high efficiency, low-voltage driving, and a long lifetime of a light-emitting device can be achieved at the same time.

The hole-injection layer injects holes from the anode to the hole-transport layer and contains a material with a high hole-injection property. Examples of a material with a high hole-injection property include an aromatic amine compound and a composite material containing a hole-transport material and an acceptor material (electron-accepting material).

As the hole-transport material, it is possible to use a material having a high hole-transport property which can be used for the hole-transport layer and will be described later.

As the acceptor material, an oxide of a metal belonging to any of Group 4 to Group 8 of the periodic table can be used, for example. Specific examples include molybdenum oxide, vanadium oxide, niobium oxide, tantalum oxide, chromium oxide, tungsten oxide, manganese oxide, and rhenium oxide. Among these, molybdenum oxide is especially preferable since it is stable in the air, has a low hygroscopic property, and is easy to handle. Alternatively, an organic acceptor material containing fluorine can be used. Alternatively, organic acceptor materials such as a quinodimethane derivative, a chloranil derivative, and a hexaazatriphenylene derivative can also be used.

For example, a hole-transport material and a material containing an oxide of a metal belonging to any of Groups 4 to 8 of the periodic table (typically, molybdenum oxide) may be used as the material having a high hole-injection property.

The hole-transport layer transports holes injected from the anode by the hole-injection layer, to the light-emitting layer. The hole-transport layer contains a hole-transport material. The hole-transport material preferably has a hole mobility higher than or equal to $1\times10^{-6}$ $cm^2/Vs$. Note that other materials can also be used as long as the materials have a hole-transport property higher than an electron-transport property. As the hole-transport material, materials with a high hole-transport property, such as a π-electron rich heteroaromatic compound (e.g., a carbazole derivative, a thiophene derivative, and a furan derivative) and an aromatic amine (a compound having an aromatic amine skeleton), are preferable.

The electron-blocking layer is provided in contact with the light-emitting layer. The electron-blocking layer has a hole-transport property and contains a material capable of blocking electrons. Any of the materials having an electron-blocking property among the above hole-transport materials can be used for the electron-blocking layer.

The electron-blocking layer has a hole-transport property, and thus can also be referred to as a hole-transport layer. A layer having an electron-blocking property among the hole-transport layers can also be referred to as an electron-blocking layer.

The electron-transport layer transports electrons injected from the cathode by the electron-injection layer, to the light-emitting layer. The electron-transport layer contains an electron-transport material. The electron-transport material preferably has an electron mobility higher than or equal to $1\times10^{-6}$ $cm^2/Vs$. Note that other materials can also be used as long as the materials have an electron-transport property higher than a hole-transport property. As the electron-transport material, any of the following materials with a high electron-transport property can be used, for example: a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, and a π-electron deficient heteroaromatic compound such as a nitrogen-containing heteroaromatic compound.

The hole-blocking layer is provided in contact with the light-emitting layer. The hole-blocking layer has an electron-transport property and contains a material capable of blocking holes. Any of the materials having a hole-blocking property among the above electron-transport materials can be used for the hole-blocking layer.

The hole-blocking layer has an electron-transport property, and thus can also be referred to as an electron-transport layer. A layer having a hole-blocking property among the electron-transport layers can also be referred to as a hole-blocking layer.

The electron-injection layer injects electrons from the cathode to the electron-transport layer and contains a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

The difference between the lowest unoccupied molecular orbital (LUMO) level of the material having a high electron-injection property and the work function value of the material used for the cathode is preferably small (specifically, smaller than or equal to 0.5 eV).

The electron-injection layer can be formed using an alkali metal, an alkaline earth metal, or a compound thereof, such as lithium, cesium, ytterbium, lithium fluoride (LiF), cesium fluoride (CsF), calcium fluoride ($CaF_x$, where X is a given number), 8-(quinolinolato)lithium (abbreviation: Liq), 2-(2-pyridyl)phenolatolithium (abbreviation: LiPP), 2-(2-pyridyl)-3-pyridinolato lithium (abbreviation: LiPPy), 4-phenyl-2-(2-pyridyl)phenolatolithium (abbreviation: LiPPP), lithium oxide ($LiO_x$), or cesium carbonate, for example. The electron-injection layer may have a stacked structure of two or more layers. In the stacked-layer structure, for example, lithium fluoride can be used for the first layer and ytterbium can be used for the second layer.

The electron-injection layer may contain an electron-transport material. For example, a compound having an unshared electron pair and an electron deficient heteroaromatic ring can be used as the electron-transport material. Specifically, it is possible to use a compound having at least one of a pyridine ring, a diazine ring (a pyrimidine ring, a pyrazine ring, or a pyridazine ring), and a triazine ring.

Note that the LUMO level of the organic compound having an unshared electron pair is preferably greater than or equal to −3.6 eV and less than or equal to −2.3 eV In general, the highest occupied molecular orbital (HOMO) level and the LUMO level of an organic compound can be estimated by cyclic voltammetry (CV), photoelectron spectroscopy, optical absorption spectroscopy, inverse photoelectron spectroscopy, or the like.

For example, 4,7-diphenyl-1,10-phenanthroline (abbreviation: BPhen), 2,9-di(naphthalen-2-yl)-4,7-diphenyl-1,10-phenanthroline (abbreviation: NBPhen), 2,2'-(1,3-phenylene)bis(9-phenyl-1,10-phenanthroline) (abbreviation: mPPhen2P), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used as the organic compound having an unshared electron pair. Note that NBPhen has a higher glass transition point (Tg) than BPhen and thus has high heat resistance.

As described above, the charge-generation layer includes at least a charge-generation region. The charge-generation region preferably contains an acceptor material, and for example, preferably contains a hole-transport material and an acceptor material which can be used for the hole-injection layer.

In addition, the charge-generation layer preferably includes a layer containing a material having a high electron-injection property. The layer can also be referred to as an electron-injection buffer layer. The electron-injection buffer layer is preferably provided between the charge-generation region and the electron-transport layer. By provision of the electron-injection buffer layer, an injection barrier between the charge-generation region and the electron-transport layer can be lowered; thus, electrons generated in the charge-generation region can be easily injected into the electron-transport layer.

The electron-injection buffer layer preferably contains an alkali metal or an alkaline earth metal, and for example, can contain an alkali metal compound or an alkaline earth metal compound. Specifically, the electron-injection buffer layer preferably contains an inorganic compound containing an alkali metal and oxygen or an inorganic compound containing an alkaline earth metal and oxygen, further preferably contains an inorganic compound containing lithium and oxygen (e.g., lithium oxide ($Li_2O$)). Alternatively, a material that can be used for the electron-injection layer can be used for the electron-injection buffer layer.

The charge-generation layer preferably includes a layer containing a material having a high electron-transport property. The layer can also be referred to as an electron-relay layer. The electron-relay layer is preferably provided between the charge-generation region and the electron-injection buffer layer. In the case where the charge-generation layer does not include an electron-injection buffer layer, the electron-relay layer is preferably provided between the charge-generation region and the electron-transport layer. The electron-relay layer has a function of preventing interaction between the charge-generation region and the electron-injection buffer layer (or the electron-transport layer) and smoothly transferring electrons.

A phthalocyanine-based material such as copper(II) phthalocyanine (abbreviation: CuPc) or a metal complex having a metal-oxygen bond and an aromatic ligand is preferably used for the electron-relay layer.

Note that the charge-generation region, the electron-injection buffer layer, and the electron-relay layer cannot be clearly distinguished from each other in some cases depending on the cross-sectional shapes, the characteristics, or the like.

Note that the charge-generation layer may contain a donor material instead of an acceptor material. For example, the charge-generation layer may include a layer containing an electron-transport material and a donor material, which can be used for the electron-injection layer.

When the light-emitting units are stacked, provision of a charge-generation layer between two light-emitting units can suppress an increase in driving voltage.

This embodiment can be combined with any of the other embodiments or an example as appropriate.

Embodiment 5

In this embodiment, a light-receiving device that can be used for a display apparatus of one embodiment of the present invention, and a display apparatus having a light sensing function will be described.

[Light-Receiving Device]

Figure 27A:
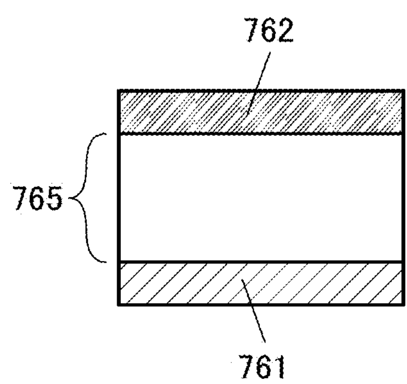
FIGS. 27A and 27B illustrate structure examples of light-receiving devices.

As illustrated in FIG. 27A, the light-receiving device includes a layer 765 between a pair of electrodes (the lower electrode 761 and the upper electrode 762). The layer 765 includes at least one active layer, and may further include another layer.

Figure 27B:
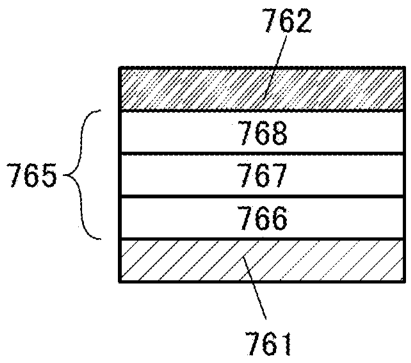

FIG. 27B is a variation example of the EL layer 765 included in the light-receiving device illustrated in FIG. 27A. Specifically, the light-receiving device illustrated in FIG. 27B includes a layer 766 over the lower electrode 761, an active layer 767 over the layer 766, a layer 768 over the active layer 767, and the upper electrode 762 over the layer 768.

The active layer 767 functions as a photoelectric conversion layer.

In the case where the lower electrode 761 is an anode and the upper electrode 762 is a cathode, the layer 766 includes one or both of a hole-transport layer and an electron-blocking layer. The layer 768 includes one or both of an electron-transport layer and a hole-blocking layer. In the case where the lower electrode 761 is a cathode and the upper electrode 762 is an anode, the structures of the layers 766 and 768 are replaced with each other.

Next, materials that can be used for the light-receiving device are described.

Either a low molecular compound or a high molecular compound can be used for the light-receiving device, and an inorganic compound may also be included. Each layer included in the light-receiving device can be formed, for example, by an evaporation method (including a vacuum evaporation method), a transfer method, a printing method, an inkjet method, or a coating method.

The active layer included in the light-receiving device includes a semiconductor. Examples of the semiconductor include an inorganic semiconductor such as silicon and an organic semiconductor including an organic compound. This embodiment describes an example where an organic semiconductor is used as the semiconductor included in the active layer. The use of an organic semiconductor is preferable because the light-emitting layer and the active layer can be formed by the same method (e.g., a vacuum evaporation method) and thus the same manufacturing apparatus can be used.

Examples of an n-type semiconductor material included in the active layer are electron-accepting organic semiconductor materials such as fullerene (e.g., $C_{60}$ and $C_{70}$) and fullerene derivatives. Other examples of fullerene derivatives include [6,6]-phenyl-C71-butyric acid methyl ester (abbreviation: PC70BM), [6,6]-phenyl-C61-butyric acid methyl ester (abbreviation: PC60BM), and 1',1",4',4"-tetrahydro-di[1,4]methanonaphthaleno[1,2:2',3',56,60:2",3" ][5,6]fullerene-C60 (abbreviation: ICBA).

Examples of the material of the n-type semiconductor include perylenetetracarboxylic acid derivatives such as N,N-dimethyl-3,4,9,10-perylenetetracarboxylic diimide (abbreviation: Me-PTCDI) and 2,2'-(5,5'-(thieno[3,2-b]thiophene-2,5-diyl)bis(thiophene-5,2-diyl))bis(methan-1-yl-1-ylidene)dimalononitrile (abbreviation: FT2TDMN).

Other examples of an n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer include electron-donating organic semiconductor materials such as copper(II) phthalocyanine (CuPc), tetraphenyldibenzoperiflanthene (DBP), zinc phthalocyanine (ZnPc), tin phthalocyanine (SnPc), quinacridone, and rubrene.

Examples of a p-type semiconductor material include a carbazole derivative, a thiophene derivative, a furan derivative, and a compound having an aromatic amine skeleton. Other examples of a p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a rubrene derivative, a tetracene derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase the carrier-transport property.

For the active layer, a high molecular compound such as poly[[4,8-bis[5-(2-ethylhexyl)-2-thienyl]benzo[1,2-b:4,5-b']dithiophene-2,6-diyl]-2,5-thiophenediyl[5,7-bis(2-ethylhexyl)-4,8-dioxo-4H,8H-benzo[1,2-c:4,5-c']dithiophene-1,3-diyl]] polymer (abbreviation: PBDB-T) or a PBDB-T derivative, which functions as a donor, can be used. For example, a method in which an acceptor material is dispersed to PBDB-T or a PBDB-T derivative can be used.

For example, the active layer is preferably formed by co-evaporation of an n-type semiconductor and a p-type semiconductor. Alternatively, the active layer may be formed by stacking an n-type semiconductor and a p-type semiconductor.

Three or more kinds of materials may be included in the active layer. For example, a third material may be mixed with an n-type semiconductor material and a p-type semiconductor material in order to extend the absorption wavelength range. In this case, the third material may be a low molecular compound or a high molecular compound.

In addition to the active layer, the light-receiving device may further include a layer containing a material having a high hole-transport property, a material having a high electron-transport property, a material having a bipolar property (a material having a high electron- and hole-transport property), or the like. Without limitation to the above, the light-receiving device may further include a material having a high hole-injection property, a hole-blocking material, a material having a high electron-injection property, an electron-blocking material, or the like. Layers other than the active layer in the light-receiving device can be formed using a material that can be used for the light-emitting device.

As the hole-transport material or the electron-blocking material, a high molecular compound such as poly(3,4-ethylenedioxythiophene)/poly(styrenesulfonic acid) (PEDOT/PSS), or an inorganic compound such as a molybdenum oxide or copper iodide (CuI) can be used, for example. As the electron-transport material or the hole-blocking material, an inorganic compound such as zinc oxide (ZnO), or an organic compound such as polyethylenimine ethoxylate (PEIE) can be used. The light-receiving device may include a mixed film of PEIE and ZnO, for example.

[Display Apparatus Having Light Sensing Function]

In the display apparatus of one embodiment of the present invention, the light-emitting devices are arranged in a matrix in a display portion, and an image can be displayed on the display portion. Furthermore, the light-receiving devices are arranged in a matrix in the display portion, and the display portion has one or both of an image capturing function and a sensing function in addition to an image displaying function. The display portion can be used as an image sensor or a touch sensor. That is, by sensing light at the display portion, an image can be captured or the approach or contact of an object (e.g., a finger, a hand, or a stylus) can be detected.

Furthermore, in the display apparatus of one embodiment of the present invention, the light-emitting devices can be used as a light source of the sensor. In the display apparatus of one embodiment of the present invention, when an object reflects (or scatters) light emitted from the light-emitting device included in the display portion, the light-receiving device can sense the reflected light (or the scattered light); thus, image capturing or touch sensing is possible even in a dark place.

Accordingly, a light-receiving portion and a light source do not need to be provided separately from the display apparatus; hence, the number of components of an electronic device can be reduced. For example, a biometric authentication device provided in the electronic device, a capacitive touch panel for scroll operation, or the like is not necessarily provided separately. Thus, with the use of the display apparatus of one embodiment of the present invention, the electronic device can be provided at lower manufacturing costs.

Specifically, the display apparatus of one embodiment of the present invention includes a light-emitting device and a light-receiving device in a pixel. In the display apparatus of one embodiment of the present invention, organic EL devices are used as the light-emitting devices, and organic photodiodes are used as the light-receiving devices. The organic EL device and the organic photodiode can be formed over one substrate. Thus, the organic photodiode can be incorporated into the display apparatus including the organic EL device.

The display apparatus can detect the touch or approach of an object while displaying an image because the pixel included in the display apparatus includes the light-emitting device and the light-receiving device and thus has a light-receiving function. For example, an image can be displayed by using all the subpixels included in a display apparatus; or light can be emitted by some of the subpixels as a light source, light can be sensed by some other subpixels, and an image can be displayed by using the remaining subpixels.

When the light-receiving device is used as an image sensor, the display apparatus can capture an image with the use of the light-receiving device. For example, the display apparatus of this embodiment can be used as a scanner.

For example, image capturing for personal authentication with the use of a fingerprint, a palm print, the iris, the shape of a blood vessel (including the shape of a vein and the shape of an artery), a face, or the like is possible by using the image sensor.

For example, an image of the periphery, surface, or inside (e.g., fundus) of an eye of a user of a wearable device can be captured with the use of the image sensor. Therefore, the wearable device can have a function of sensing one or more selected from blinking, movement of an iris, and movement of an eyelid of the user.

Moreover, the light-receiving device can be used in a touch sensor (also referred to as a direct touch sensor), a near touch sensor (also referred to as a hover sensor, a hover touch sensor, a contactless sensor, or a touchless sensor), or the like.

Here, the touch sensor or the near touch sensor can detect an approach or contact of an object (e.g., a finger, a hand, or a pen).

The touch sensor can detect the object when the display apparatus and the object come in direct contact with each other. Furthermore, the near touch sensor can detect the object even when the object is not in contact with the display apparatus. For example, the display apparatus is preferably capable of sensing an object positioned in the range of 0.1 mm to 300 mm inclusive, more preferably 3 mm to 50 mm inclusive from the display apparatus. This structure enables the display apparatus to be operated without direct contact of an object. In other words, the display apparatus can be operated in a contactless (touchless) manner. With the above-described structure, the display apparatus can be controlled with a reduced risk of being dirty or damaged, or can be controlled without the object directly touching a dirt (e.g., dust, bacteria, or a virus) attached to the display apparatus.

The refresh rate of the display apparatus of one embodiment of the present invention can be variable. For example, the refresh rate is adjusted (in the range of 1 Hz to 240 Hz, for example) in accordance with contents displayed on the display apparatus, whereby power consumption can be reduced. The driving frequency of the touch sensor or the near touch sensor may be changed in accordance with the refresh rate. In the case where the refresh rate of the display apparatus is 120 Hz, for example, the drive frequency of a touch sensor or a near touch sensor can be higher than 120 Hz (typically 240 Hz). With this structure, low power consumption can be achieved, and the response speed of the touch sensor or the near touch sensor can be increased.

Figure 27C:
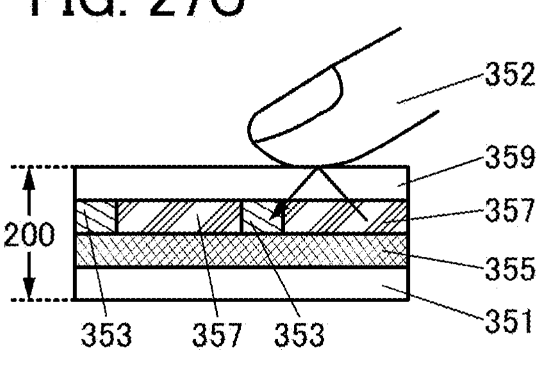
FIGS. 27C to 27E illustrate structure examples of a display apparatus.
Figure 27D:
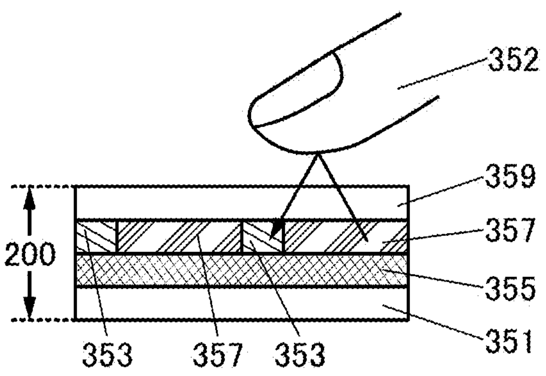
Figure 27E:
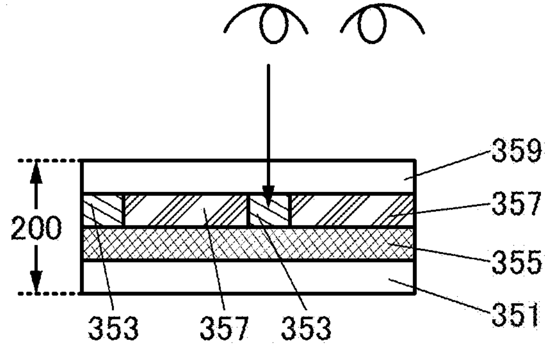

The display apparatus 200 illustrated in FIGS. 27C to 27E includes, between a substrate 351 and a substrate 359, a layer 353 including a light-receiving device, a functional layer 355, and a layer 357 including a light-emitting device.

The functional layer 355 includes a circuit for driving a light-receiving device and a circuit for driving a light-emitting device. One or more of a switch, a transistor, a capacitor, a resistor, a wiring, a terminal, and the like can be provided in the functional layer 355. Note that in the case where the light-emitting device and the light-receiving device are driven by a passive-matrix method, a structure not provided with a switch or a transistor may be employed. As the transistor provided in the functional layer 355, any of the transistors described in Embodiment 1 can be suitably used.

For example, after light emitted from the light-emitting device in the layer 357 including light-emitting devices is reflected by a finger 352 that touches the display apparatus 200 as illustrated in FIG. 27C, the light-receiving device in the layer 353 including light-receiving devices senses the reflected light. Thus, the touch of the finger 352 on the display apparatus 200 can be detected.

The display apparatus may have a function of detecting an object that is approaching (but is not touching) the display apparatus or capturing an image of such an object, as illustrated in FIGS. 27D and 27E. FIG. 27D illustrates an example where a human finger is detected, and FIG. 27E illustrates an example where information on the periphery, surface, or inside of the human eye (e.g., the number of blinks, the movement of an eyeball, and the movement of an eyelid) is detected.

This embodiment can be combined with any of the other embodiments or an example as appropriate.

Embodiment 6

In this embodiment, electronic devices of embodiments of the present invention will be described with reference to FIGS. 28A to 28D, FIGS. 29A to 29F, and FIGS. 30A to 30G.

Electronic devices of this embodiment are each provided with the display apparatus of one embodiment of the present invention in a display portion. The display apparatus of one embodiment of the present invention can be easily increased in resolution and definition. Thus, the display apparatus of one embodiment of the present invention can be used for a display portion of a variety of electronic devices.

Examples of the electronic devices include a digital camera, a digital video camera, a digital photo frame, a mobile phone, a portable game console, a portable information terminal, and an audio reproducing device, in addition to electronic devices with a relatively large screen, such as a television device, desktop and laptop personal computers, a monitor of a computer and the like, digital signage, and a large game machine such as a pachinko machine.

In particular, the display apparatus of one embodiment of the present invention can have a high definition, and thus can be favorably used for an electronic device having a relatively small display portion. Examples of such an electronic device include watch-type and bracelet-type information terminal devices (wearable devices) and wearable devices worn on the head, such as a VR device like a head-mounted display, a glasses-type AR device, and an MR device.

The definition of the display apparatus of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, a definition of 4K, 8K, or higher is preferable. The pixel density (resolution) of the display apparatus of one embodiment of the present invention is preferably 100 ppi or higher, further preferably 300 ppi or higher, further preferably 500 ppi or higher, further preferably 1000 ppi or higher, still further preferably 2000 ppi or higher, still further preferably 3000 ppi or higher, still further preferably 5000 ppi or higher, yet further preferably 7000 ppi or higher. The use of the display apparatus having one or both of such high definition and high resolution can further increase realistic sensation, sense of depth, and the like. There is no particular limitation on the screen ratio (aspect ratio) of the display apparatus of one embodiment of the present invention. For example, the display apparatus is compatible with a variety of screen ratios such as 1:1 (a square), 4:3, 16:9, and 16:10.

The electronic device in this embodiment may include a sensor (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device in this embodiment can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Examples of head-mounted wearable devices will be described with reference to FIGS. 28A to 28D. The wearable devices have at least one of a function of displaying AR contents, a function of displaying VR contents, a function of displaying SR contents, and a function of displaying MR contents. The electronic device having a function of displaying contents of at least one of AR, VR, SR, MR, and the like enables the user to feel a higher level of immersion.

Figure 28A:
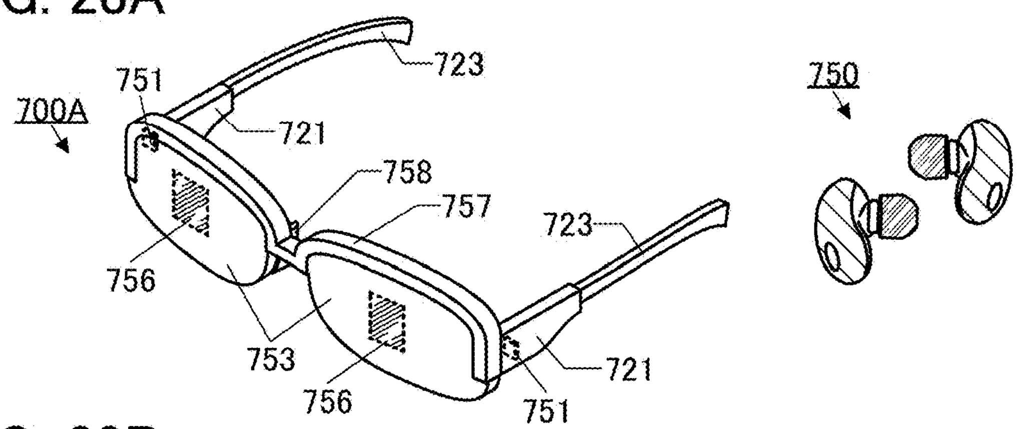
FIGS. 28A to 28D illustrate examples of electronic devices.
Figure 28B:
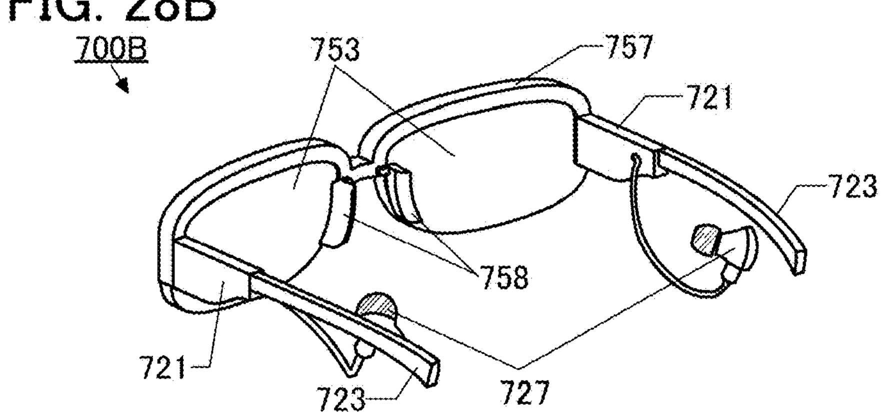

An electronic device 700A illustrated in FIG. 28A and an electronic device 700B illustrated in FIG. 28B each include a pair of display panels 751, a pair of housings 721, a communication portion (not illustrated), a pair of wearing portions 723, a control portion (not illustrated), an image capturing portion (not illustrated), a pair of optical members 753, a frame 757, and a pair of nose pads 758.

The display apparatus of one embodiment of the present invention can be used for the display panels 751. Thus, the electronic devices are capable of performing ultrahigh-resolution display.

The electronic devices 700A and 700B can each project images displayed on the display panels 751 onto display regions 756 of the optical members 753. Since the optical members 753 have a light-transmitting property, the user can see images displayed on the display regions, which are superimposed on transmission images seen through the optical members 753. Accordingly, the electronic devices 700A and 700B are electronic devices capable of AR display.

In the electronic devices 700A and 700B, a camera capable of capturing images of the front side may be provided as the image capturing portion. Furthermore, when the electronic devices 700A and 700B are provided with an acceleration sensor such as a gyroscope sensor, the orientation of the user's head can be sensed and an image corresponding to the orientation can be displayed on the display regions 756.

The communication portion includes a wireless communication device, and a video signal and the like can be supplied by the wireless communication device. Instead of or in addition to the wireless communication device, a connector that can be connected to a cable for supplying a video signal and a power supply potential may be provided.

The electronic devices 700A and 700B are provided with a battery so that they can be charged wirelessly and/or by wire.

A touch sensor module may be provided in the housing 721. The touch sensor module has a function of detecting a touch on the outer surface of the housing 721. Detecting a tap operation, a slide operation, or the like by the user with the touch sensor module enables various types of processing. For example, a video can be paused or restarted by a tap operation, and can be fast-forwarded or fast-reversed by a slide operation. When the touch sensor module is provided in each of the two housings 721, the range of the operation can be increased.

Various touch sensors can be applied to the touch sensor module. For example, any of touch sensors of the following types can be used: a capacitive type, a resistive type, an infrared type, an electromagnetic induction type, a surface acoustic wave type, and an optical type. In particular, a capacitive sensor or an optical sensor is preferably used for the touch sensor module.

In the case of using an optical touch sensor, a photoelectric conversion device (also referred to as a photoelectric conversion element) can be used as a light-receiving device. One or both of an inorganic semiconductor and an organic semiconductor can be used for an active layer of the photoelectric conversion device.

Figure 28C:
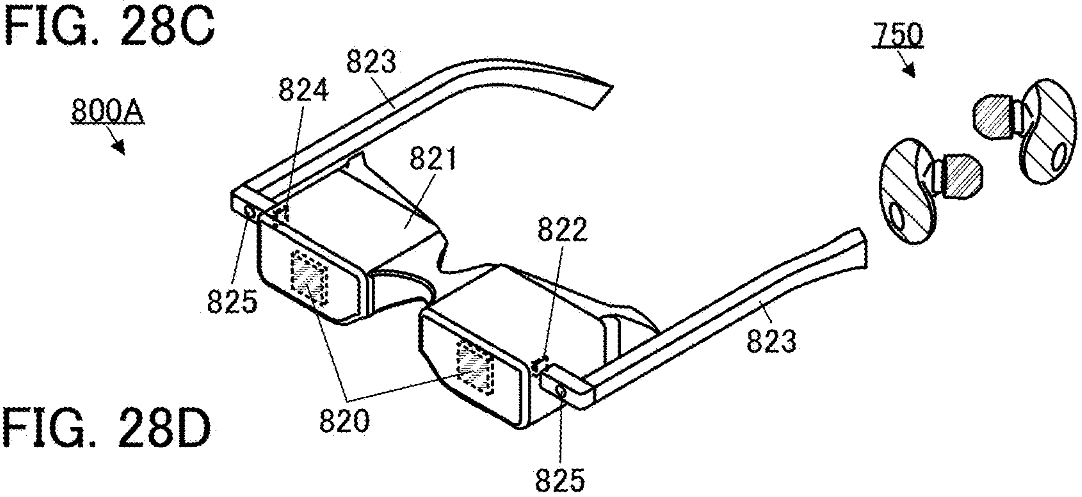
Figure 28D:
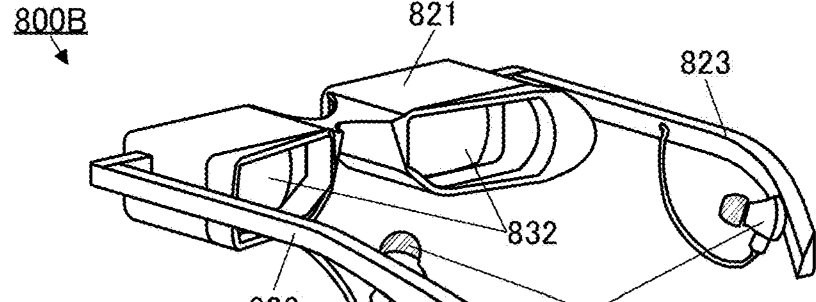

An electronic device 800A illustrated in FIG. 28C and an electronic device 800B illustrated in FIG. 28D each include a pair of display portions 820, a housing 821, a communication portion 822, a pair of wearing portions 823, a control portion 824, a pair of image capturing portions 825, and a pair of lenses 832.

The display apparatus of one embodiment of the present invention can be used in the display portions 820. Thus, the electronic devices are capable of performing ultrahigh-resolution display. Such electronic devices provide a high sense of immersion to the user.

The display portions 820 are provided at positions where the user can see through the lenses 832 inside the housing 821. When the pair of display portions 820 display different images, three-dimensional display using parallax can be performed.

The electronic devices 800A and 800B can be regarded as electronic devices for VR. The user who wears the electronic device 800A or the electronic device 800B can see images displayed on the display portions 820 through the lenses 832.

The electronic devices 800A and 800B preferably include a mechanism for adjusting the lateral positions of the lenses 832 and the display portions 820 so that the lenses 832 and the display portions 820 are positioned optimally in accordance with the positions of the user's eyes. Moreover, the electronic devices 800A and 800B preferably include a mechanism for adjusting focus by changing the distance between the lenses 832 and the display portions 820.

The electronic device 800A or the electronic device 800B can be mounted on the user's head with the wearing portions 823. FIG. 28C and the like show examples where the wearing portion 823 has a shape like a temple (also referred to as a joint) of glasses; however, one embodiment of the present invention is not limited thereto. The wearing portion 823 can have any shape with which the user can wear the electronic device, for example, a shape of a helmet or a band.

The image capturing portion 825 has a function of obtaining information on the external environment. Data obtained by the image capturing portion 825 can be output to the display portion 820. An image sensor can be used for the image capturing portion 825. Moreover, a plurality of cameras may be provided so as to support a plurality of fields of view, such as a telescope field of view and a wide field of view.

Although an example where the image capturing portions 825 are provided is shown here, a range sensor (hereinafter also referred to as a sensing portion) capable of measuring a distance between the user and an object just is provided. In other words, the image capturing portion 825 is one embodiment of the sensing portion. As the sensing portion, an image sensor or a range image sensor such as a light detection and ranging (LiDAR) sensor can be used, for example. By using images obtained by the camera and images obtained by the range image sensor, more information can be obtained and a gesture operation with higher accuracy is possible.

The electronic device 800A may include a vibration mechanism to function as bone-conduction earphones. For example, at least one of the display portion 820, the housing 821, and the wearing portion 823 can include the vibration mechanism. Thus, without additionally requiring an audio device such as headphones, earphones, or a speaker, the user can enjoy video and sound only by wearing the electronic device 800A.

The electronic devices 800A and 800B may each include an input terminal. To the input terminal, a cable for supplying a video signal from a video output device or the like, power for charging the battery provided in the electronic device, and the like can be connected.

The electronic device of one embodiment of the present invention may have a function of performing wireless communication with earphones 750. The earphones 750 include a communication portion (not illustrated) and has a wireless communication function. The earphones 750 can receive information (e.g., audio data) from the electronic device with the wireless communication function. For example, the electronic device 700A in FIG. 28A has a function of transmitting information to the earphones 750 with the wireless communication function. As another example, the electronic device 800A in FIG. 28C has a function of transmitting information to the earphones 750 with the wireless communication function.

The electronic device may include an earphone portion. The electronic device 700B in FIG. 28B includes earphone portions 727. For example, the earphone portion 727 can be connected to the control portion by wire. Part of a wiring that connects the earphone portion 727 and the control portion may be positioned inside the housing 721 or the wearing portion 723.

Similarly, the electronic device 800B in FIG. 28D includes earphone portions 827. For example, the earphone portion 827 can be connected to the control portion 824 by wire. Part of a wiring that connects the earphone portion 827 and the control portion 824 may be positioned inside the housing 821 or the wearing portion 823. Alternatively, the earphone portions 827 and the wearing portions 823 may include magnets. This is preferable because the earphone portions 827 can be fixed to the wearing portions 823 with magnetic force and thus can be easily housed.

The electronic device may include an audio output terminal to which earphones, headphones, or the like can be connected. The electronic device may include one or both of an audio input terminal and an audio input mechanism. As the audio input mechanism, a sound collecting device such as a microphone can be used, for example. The electronic device may have a function of a headset by including the audio input mechanism.

As described above, both the glasses-type device (e.g., the electronic devices 700A and 700B) and the goggles-type device (e.g., the electronic devices 800A and 800B) are preferable as the electronic device of one embodiment of the present invention.

The electronic device of one embodiment of the present invention can transmit information to earphones by wire or wirelessly.

An electronic device 6500 illustrated in FIG. 29A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used in the display portion 6502.

FIG. 29B is a schematic cross-sectional view including an end portion of the housing 6501 on the microphone 6506 side.

A protection member 6510 having a light-transmitting property is provided on the display surface side of the housing 6501. A display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

The display apparatus with flexibility of one embodiment of the present invention can be used for the display panel 6511. Thus, an extremely lightweight electronic device can be achieved. Since the display panel 6511 is extremely thin, the battery 6518 with high capacity can be mounted without an increase in the thickness of the electronic device. Moreover, part of the display panel 6511 is folded back so that a connection portion with the FPC 6515 is provided on the back side of the display portion 6502, whereby an electronic device with a narrow bezel can be achieved.

FIG. 29C illustrates an example of a television device. In a television device 7100, a display portion 7000 is incorporated in a housing 7101. Here, the housing 7101 is supported by a stand 7103.

The display apparatus of one embodiment of the present invention can be used in the display portion 7000.

Operation of the television device 7100 illustrated in FIG. 29C can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be controlled and videos displayed on the display portion 7000 can be controlled.

Note that the television device 7100 includes a receiver, a modem, and the like. A general television broadcast can be received with the receiver. When the television device is connected to a communication network by wire or wirelessly via the modem, one-way (from a transmitter to a receiver) or two-way (between a transmitter and a receiver or between receivers, for example) data communication can be performed.

FIG. 29D illustrates an example of a laptop personal computer. The laptop personal computer 7200 includes a housing 7211, a keyboard 7212, a pointing device 7213, an external connection port 7214, and the like. The display portion 7000 is incorporated in the housing 7211.

The display apparatus of one embodiment of the present invention can be used in the display portion 7000.

FIGS. 29E and 29F illustrate examples of digital signage.

Digital signage 7300 illustrated in FIG. 29E includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 29F illustrates digital signage 7400 attached to a cylindrical pillar 7401. The digital signage 7400 includes the display portion 7000 provided along a curved surface of the pillar 7401.

The display apparatus of one embodiment of the present invention can be used in the display portion 7000 illustrated in each of FIGS. 29E and 29F.

A larger area of the display portion 7000 can increase the amount of information that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIGS. 29E and 29F, it is preferable that the digital signage 7300 or the digital signage 7400 can work with an information terminal 7311 or an information terminal 7411, such as a smartphone that a user has, through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices illustrated in FIGS. 30A to 30G include a housing 9000, a display portion 9001, a speaker 9003, an operation key 9005 (including a power switch or an operation switch), a connection terminal 9006, a sensor 9007 (a sensor having a function of sensing, detecting, or measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, a smell, or infrared rays), a microphone 9008, and the like.

In FIGS. 30A to 30G, the display apparatus of one embodiment of the present invention can be used in the display portion 9001.

The electronic devices illustrated in FIGS. 30A to 30G have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may be provided with a camera or the like and have a function of capturing a still image or a moving image, a function of storing the captured image in a storage medium (an external storage medium or a storage medium incorporated in the camera), a function of displaying the captured image on the display portion, and the like.

The electronic devices in FIGS. 30A to 30G will be described in detail below.

FIG. 30A is a perspective view of a portable information terminal 9101. The portable information terminal 9101 can be used as a smartphone, for example. The portable information terminal 9101 may include the speaker 9003, the connection terminal 9006, the sensor 9007, or the like. The portable information terminal 9101 can display text and image information on its plurality of surfaces. FIG. 30A illustrates an example where three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the radio field intensity. Alternatively, the icon 9050 or the like may be displayed at the position where the information 9051 is displayed.

FIG. 30B is a perspective view of a portable information terminal 9102. The portable information terminal 9102 has a function of displaying information on three or more surfaces of the display portion 9001. Here, information 9052, information 9053, and information 9054 are displayed on different surfaces. For example, the user of the portable information terminal 9102 can check the information 9053 displayed such that it can be seen from above the portable information terminal 9102, with the portable information terminal 9102 put in a breast pocket of his/her clothes. Thus, the user can see the display without taking out the portable information terminal 9102 from the pocket and decide whether to answer the call, for example.

FIG. 30C is a perspective view of a tablet terminal 9103. The tablet terminal 9103 is capable of executing a variety of applications such as mobile phone calls, e-mailing, viewing and editing texts, music reproduction, Internet communication, and a computer game, for example. The tablet terminal 9103 includes the display portion 9001, the camera 9002, the microphone 9008, and the speaker 9003 on the front surface of the housing 9000; the operation keys 9005 as buttons for operation on the left side surface of the housing 9000; and the connection terminal 9006 on the bottom surface of the housing 9000.

FIG. 30D is a perspective view of a watch-type portable information terminal 9200. The portable information terminal 9200 can be used as a Smartwatch (registered trademark), for example. The display surface of the display portion 9001 is curved, and an image can be displayed on the curved display surface. Furthermore, for example, mutual communication between the portable information terminal 9200 and a headset capable of wireless communication can be performed, and thus hands-free calling is possible. With the connection terminal 9006, the portable information terminal 9200 can perform mutual data transmission with another information terminal and charging. Note that the charging operation may be performed by wireless power feeding.

FIGS. 30E to 30G are perspective views of a foldable portable information terminal 9201. FIG. 30E is a perspective view illustrating the portable information terminal 9201 that is opened. FIG. 30G is a perspective view illustrating the portable information terminal 9201 that is folded. FIG. 30F is a perspective view illustrating the portable information terminal 9201 that is shifted from one of the states in FIGS. 30E and 30G to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. The display portion 9001 can be folded with a radius of curvature greater than or equal to 0.1 mm and less than or equal to 150 mm, for example.

This embodiment can be combined with any of the other embodiments or an example as appropriate.

Example

In this example, a semiconductor device was fabricated, and the electrical characteristics of transistors included in the semiconductor device were evaluated.

In this example, Sample A, which is the semiconductor device of one embodiment of the present invention, was fabricated. The description of the semiconductor device 10 illustrated in FIGS. 1A and 1B can be referred to for the structure of Sample A. Furthermore, the description of the manufacturing method of the semiconductor device 10 in <Example of manufacturing method> in Embodiment 1 can be referred to for the manufacturing method of Sample A.

<Sample Fabrication>

Figure 31:
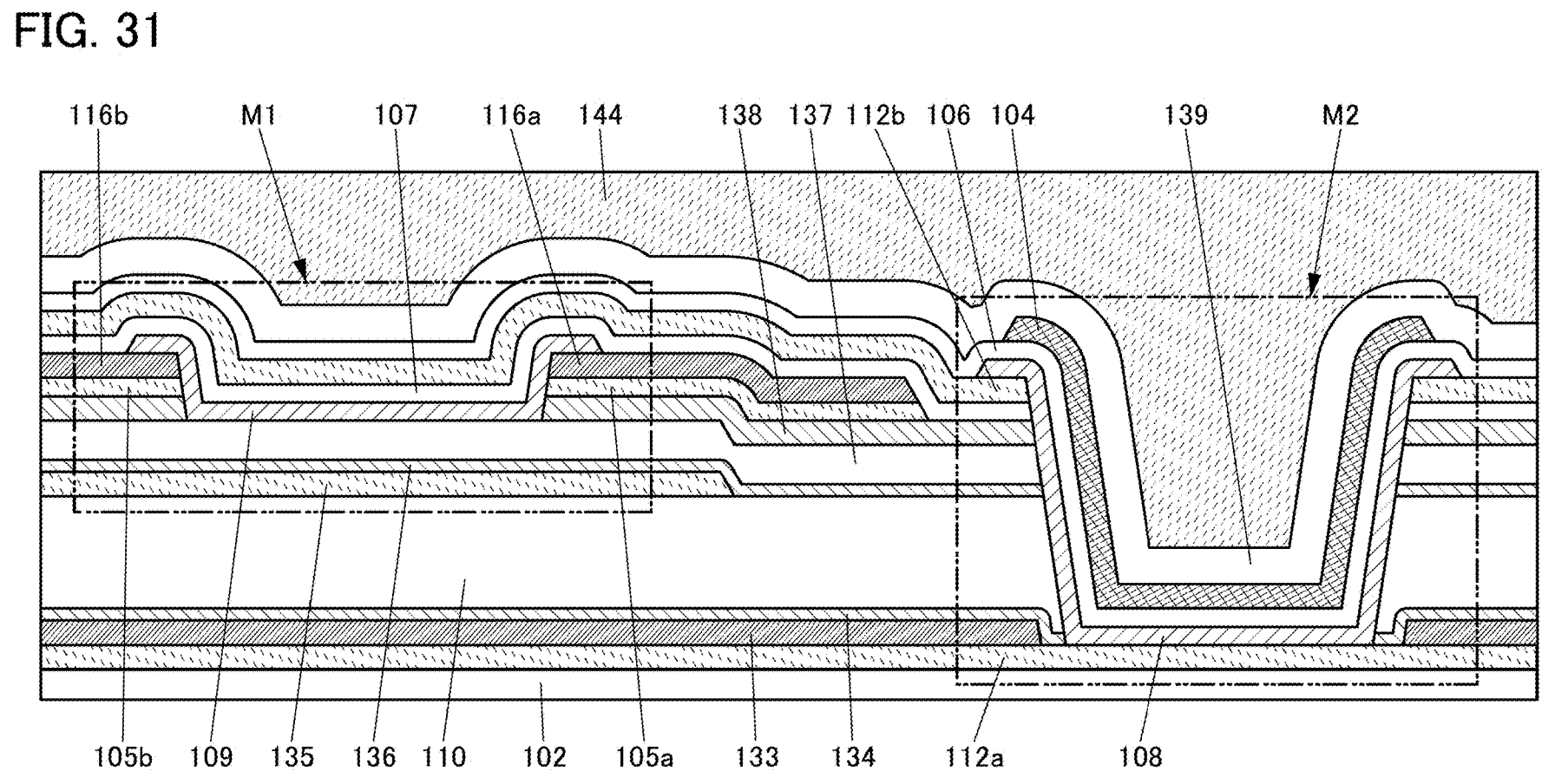

FIG. 31 is a cross-sectional view of Sample A fabricated in this example. Description of the components illustrated in FIG. 31, which are similar to those in the above embodiments, will be omitted.

Sample A fabricated in this example includes a conductive layer 133 over the conductive layer 112*a*. An opening is provided in the conductive layer 133, and the transistor M2 is provided in a region overlapping with the opening. An insulating layer 134 is provided in contact with a top surface and a side surface of the conductive layer 133 and part of the top surface of the conductive layer 112*a*.

The conductive layer 133 is formed of a material whose electric resistance is lower than that of the conductive layer 112*a*. The conductive layer 112*a* in contact with the conductive layer 133 functions as the one of the source electrode and the drain electrode of the transistor M2 and also as a wiring.

Over the insulating layer 110, an island-shaped conductive layer 135 is provided to include a region overlapping with the conductive layer 112*b* which functions as the gate electrode of the transistor M1 and a region overlapping with the semiconductor layer 109 which functions as the semiconductor layer where the channel of the transistor M1 is formed. An insulating layer 136 is provided to cover a top surface and a side surface of the conductive layer 135 and the top surface of the insulating layer 110. An insulating layer 137 is provided over the insulating layer 136, and an insulating layer 138 is provided over the insulating layer 137.

In the transistor M1 included in Sample A, the conductive layer 135 has a function of a second gate electrode (also referred to as a back gate electrode or a bottom gate electrode), and the insulating layers 136 and 137 have a function of a second gate insulating layer.

A conductive layer 105*a* is provided between the insulating layer 138 and the conductive layer 116*a* which functions as the one of the source electrode and the drain electrode of the transistor M1. A conductive layer 105*b* is provided between the insulating layer 138 and the conductive layer 116*b* which functions as the other of the source electrode and the drain electrode of the transistor M1.

It can also be said that, in Sample A, the conductive layers 105*a* and 116*a* have a function of the one of the source electrode and the drain electrode of the transistor M1, and the conductive layers 105*b* and 116*b* have a function of the other of the source electrode and the drain electrode of the transistor M1.

An insulating layer 139 is provided over the transistors M1 and M2 included in Sample A to cover the transistors, and a planarization layer 144 is provided over the insulating layer 139. The insulating layer 139 is provided along top surfaces of the transistors M1 and M2, and the planarization layer 144 is provided to cover the unevenness of the insulating layer 139 so that the top surface becomes substantially flat.

Fabrication conditions of Sample A are specifically described below.

First, a 50-nm-thick In—Sn—Si oxide (ITSO) film was formed over the substrate 102 by a sputtering method, and then processed to obtain the conductive layer 112*a*. As the substrate 102, a glass substrate was used.

Then, a 150-nm-thick tungsten film was formed over the conductive layer 112*a* by a sputtering method, and then processed to obtain the conductive layer 133.

Then, a 30-nm-thick silicon nitride film was formed over the conductive layers 112*a* and 133 by a PECVD method to obtain the insulating layer 134.

Then, a 500-nm-thick silicon oxynitride film was formed over the insulating layer 134 by a PECVD method to obtain the insulating layer 110.

Next, treatment of supplying oxygen to the insulating layer 110 was performed.

For oxygen supply to the insulating layer 110, first, a 5-nm-thick metal oxide film was formed over the insulating layer 110 by a sputtering method using a sputtering target with metal elements in an atomic ratio of In:Ga:Zn=4:2:4.1 in a 100% oxygen atmosphere.

Next, oxygen plasma treatment was performed on the insulating layer 110 through the metal oxide film. An ashing apparatus was used for this treatment. Note that the oxygen ion flow rate set in the treatment was 300 sccm, and the treatment was performed for 120 seconds with the lower electrode of the ashing apparatus heated to 100° C.

Then, the metal oxide film was removed.

Through the above series of steps, the treatment of supplying oxygen to the insulating layer 110 was performed.

First, a 100-nm-thick In—Sn—Si oxide (ITSO) film was formed over the insulating layer 110 by a sputtering method, and then processed to obtain the conductive layer 135.

Then, a 30-nm-thick silicon nitride film was formed over the conductive layer 135 and the insulating layer 110 by a PECVD method to obtain the insulating layer 136.

Then, a 500-nm-thick silicon oxynitride film was formed over the insulating layer 136 by a PECVD method to obtain the insulating layer 137.

Next, treatment of supplying oxygen to the insulating layer 137 was performed. Note that this treatment employed the above method used to supply oxygen to the insulating layer 110.

Then, a 60-nm-thick silicon nitride film was formed and stacked over the insulating layer 137 by a PECVD method to obtain an insulating film to be the insulating layer 138 later.

Then, over the insulating film to be the insulating layer 138 later, a 50-nm-thick In—Sn—Si oxide (ITSO) film was formed by a sputtering method to obtain a conductive film to be the conductive layers 105*a* and 105*b* later.

Then, over the conductive film to be the conductive layers 105*a* and 105*b* later, a 200-nm-thick tungsten film was formed by a sputtering method to obtain a conductive film to be the conductive layers 116*a* and 116*b* later.

Then, the conductive film to be the conductive layers 116*a* and 116*b* later, the conductive film to be the conductive layers 105*a* and 105*b* later, and the insulating film to be the insulating layer 138 later were each processed, whereby the conductive layers 116*a* and 116*b*, the conductive layers 105*a* and 105*b*, and the insulating layer 138 were obtained.

Then, a 50-nm-thick metal oxide film was formed over the insulating layer 137, the conductive layers 116*a*, 116*b*, 105*a*, and 105*b*, and the insulating layer 138. The metal oxide film was formed by a sputtering method using a sputtering target with metal elements in an atomic ratio of In:Ga:Zn=4:2:3. Note that in the formation, the substrate temperature was 130° C. and the oxygen flow rate ratio was 10%.

Then, heat treatment was performed at 350° C. in clean dry air for one hour. An oven apparatus was used for the heat treatment.

Then, the metal oxide film was processed to obtain the semiconductor layer 109.

Then, a 50-nm-thick silicon oxynitride film was formed over the semiconductor layer 109, the conductive layers 116*a*, 116*b*, 105*a*, and 105*b*, and the insulating layer 138 by a PECVD method to obtain the insulating layer 107.

Then, a 100-nm-thick In—Sn—Si oxide (ITSO) film was formed over the insulating layer 107 by a sputtering method to obtain the film to be the conductive layer 112*b* later.

Then, the In—Sn—Si oxide (ITSO) film to be the conductive layer 112*b* later and the insulating layers 107, 138, 137, 136, 110, and 134 were processed, whereby an opening was formed in a region where the transistor M2 was to be formed later. The opening was formed by a dry etching method. In the plan view, the opening is circular.

Then, the In—Sn—Si oxide (ITSO) film to be the conductive layer 112*b* later was processed to obtain the conductive layer 112*b*.

In this manner, the transistor M1 was formed.

Then, a 20-nm-thick metal oxide film was formed to cover the top surface of the transistor M1 and the inner wall of the above-described opening (part of the top surface of the conductive layer 112*a*, the side surface of the insulating layer 134, the side surface of the insulating layer 110, the side surface of the insulating layer 136, the side surface of the insulating layer 137, the side surface of the insulating layer 138, the side surface of the insulating layer 107, and the side surface of the conductive layer 112*b*). The metal oxide film was formed by a sputtering method using a sputtering target with metal elements in an atomic ratio of In:Ga:Zn=4:2:3. Note that in the formation, the substrate temperature was 130° C. and the oxygen flow rate ratio was 10%.

Then, heat treatment was performed at 350° C. in clean dry air for one hour. An oven apparatus was used for the heat treatment.

Then, the metal oxide film was processed to obtain the semiconductor layer 108.

Then, a 100-nm-thick silicon oxynitride film was formed over the semiconductor layer 108, the conductive layer 112*b*, and the insulating layer 107 by a PECVD method to obtain the insulating layer 106.

Then, over the insulating layer 106, a 50-nm-thick titanium film, a 200-nm-thick aluminum film, and a 50-nm-thick titanium film were formed and stacked by a sputtering method, and then processed to obtain the conductive layer 104.

In this manner, the transistor M2 was formed.

Then, a 300-nm-thick silicon nitride oxide film was formed over the conductive layer 104 and the insulating layer 106 by a PECVD method to obtain the insulating layer 139.

Then, heat treatment was performed at 300° C. in clean dry air for one hour. An oven apparatus was used for the heat treatment.

Then, a 1.0 μm-thick acrylic resin film was formed over the insulating layer 139 to obtain the planarization layer 144.

Then, heat treatment was performed at 250° C. in clean dry air for one hour. An oven apparatus was used for the heat treatment.

Then, a 100-nm-thick molybdenum film was formed over the planarization layer 144 by a sputtering method and processed to obtain a measurement PAD (not illustrated) for measurement of electrical characteristics of the transistors M1 and M2 described later.

Then, heat treatment was performed at 200° C. in clean dry air for one hour. An oven apparatus was used for the heat treatment.

Through the above process, Sample A was obtained.

<Cross-Sectional Observation>

Next, the sample was thinned by focused ion beam (FIB) and cross sections were observed with a scanning transmission electron microscope by scanning transmission electron microscopy (STEM).

Figure 32:
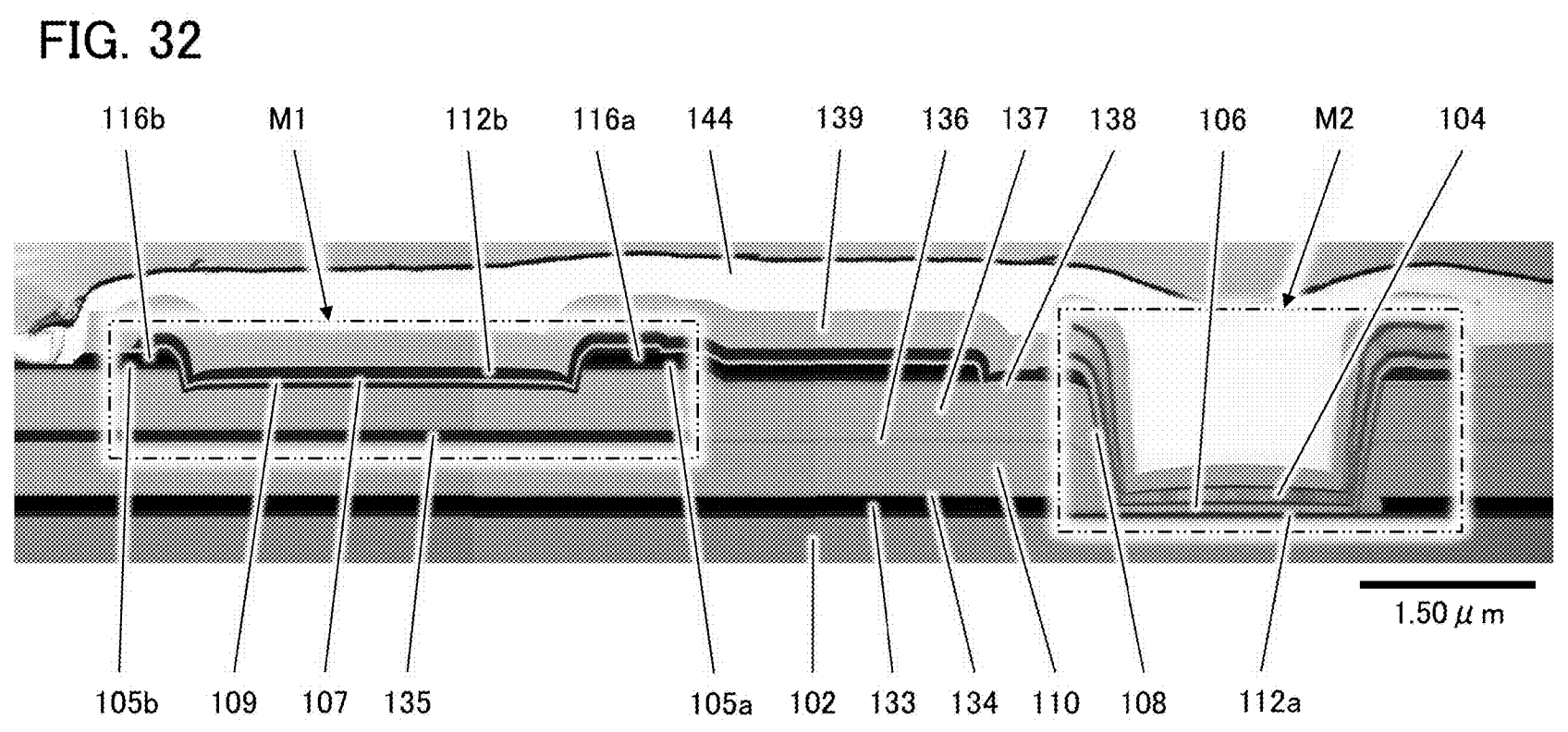

A STEM image of a cross section of Sample A is shown in FIG. 32. FIG. 32 is an image of transmitted electrons (TE) at a magnification of 20000 times.

As shown in FIG. 32, it can be seen that Sample A has a shape corresponding to the shape in the cross-sectional view in FIG. 31 as planned.

<Id-Vg Characteristics>

Next, Id-Vg characteristics of the transistors M1 and M2 in Sample A fabricated above were measured.

The Id-Vg characteristics of the transistors were measured under the following conditions. A voltage applied to the gate electrode (hereinafter also referred to as gate voltage (Vg)) was changed from −10 V to +10 V in increments of 0.25 V. A voltage applied to the source electrode (hereinafter also referred to as source voltage (Vs)) was 0 V (common), and a voltage applied to the drain electrode (hereinafter also referred to as drain voltage (Vd)) was 0.1 V and 5.1 V.

The transistor M1 with a channel length of 3.0 μm and a channel width of 3.0 μm was used for the measurement. The transistor M2, in which the width (diameter) of the opening 141 in FIG. 1A is 2.0 μm (with a channel width of 6.3 μm and a channel length of 1.17 μm), was used for the measurement. The numbers of transistors M1 and transistors M2 subjected to the measurement were each 17.

Figure 33A:
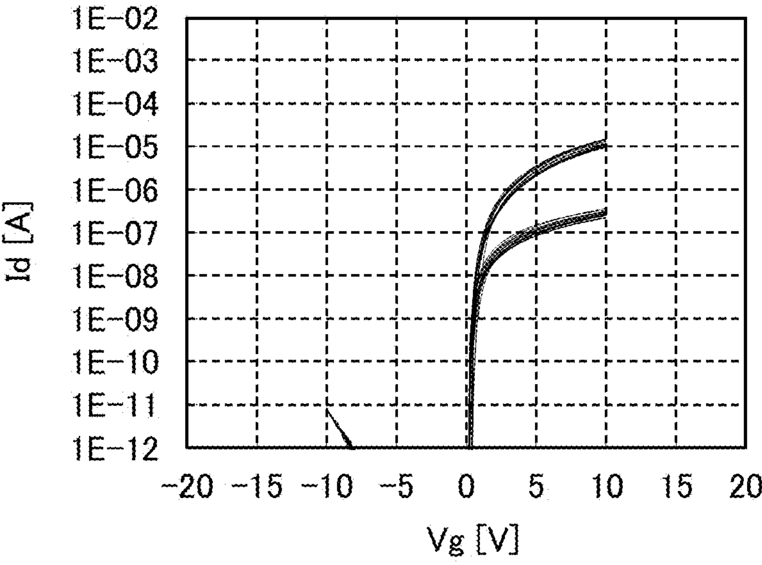
FIGS. 33A and 33B show Id-Vg characteristics of transistors.
Figure 33B:
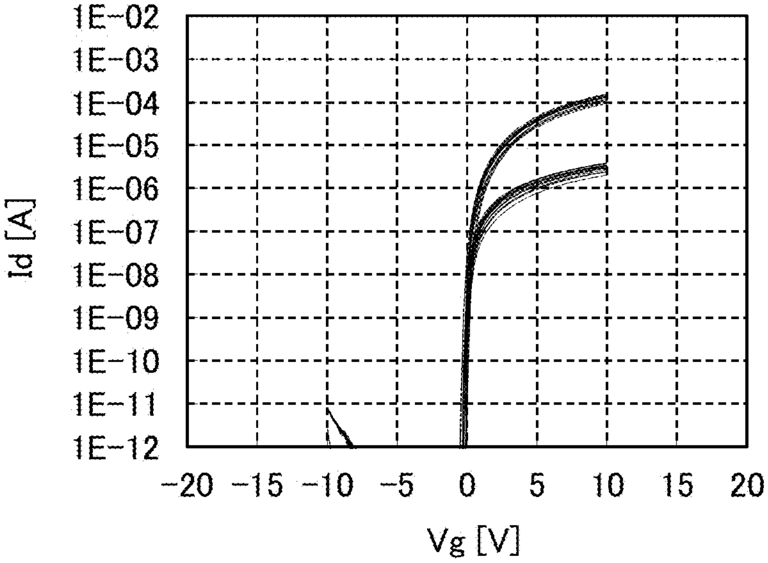

FIGS. 33A and 33B show Id-Vg characteristics of the transistors M1 and M2, respectively. In FIGS. 33A and 33B, the horizontal axis represents the gate voltage (Vg) and the vertical axis represents the drain current (Id). FIGS. 33A and 33B each show superimposed Id-Vg characteristics of the 17 transistors.

FIGS. 33A and 33B reveal that the transistors M1 and M2 each have switching characteristics with a high on/off ratio. It is also confirmed that the on-state current of the transistor M2 is higher than that of the transistor M1.

At least part of the structure, the method, and the like described in this example can be implemented in appropriate combination with any of the embodiments described in this specification.

This application is based on Japanese Patent Application Serial No. 2022-057853 filed with Japan Patent Office on Mar. 31, 2022, the entire contents of which are hereby incorporated by reference.

What is claimed is:

1. A semiconductor device comprising:
a first transistor;
a second transistor; and
a first insulating layer,
wherein the first transistor comprises a first semiconductor layer, a second insulating layer, a first conductive layer, a second conductive layer, and a third conductive layer,
wherein the second transistor comprises a second semiconductor layer, a third insulating layer, a fourth conductive layer, a fifth conductive layer, and a sixth conductive layer,
wherein the first insulating layer comprises a region in contact with a side surface of the first semiconductor layer and a first top surface of the first conductive layer,
wherein the first insulating layer comprises an opening reaching the first conductive layer,
wherein the first semiconductor layer is in direct contact with a second top surface of the first conductive layer, an inner wall of the opening, and the second conductive layer,
wherein the second conductive layer is positioned over the first insulating layer,
wherein the third conductive layer is positioned over the first semiconductor layer and comprises a region overlapping with the inner wall of the opening with the second insulating layer positioned between the third conductive layer and the first semiconductor layer,
wherein the second semiconductor layer is positioned over the first insulating layer, and in contact with a side surface and a top surface of a side end portion of the fourth conductive layer and a side surface and a top surface of a side end portion of the fifth conductive layer, the side end portions facing each other,
wherein the sixth conductive layer is positioned over the second semiconductor layer with the third insulating layer positioned between the sixth conductive layer and the second semiconductor layer, and
wherein the first transistor is electrically connected to the second transistor.

2. The semiconductor device according to claim 1,
wherein the first semiconductor layer and the second semiconductor layer each comprise an oxide semiconductor.

3. The semiconductor device according to claim 1,
wherein the second conductive layer and the sixth conductive layer share one conductive layer.

4. The semiconductor device according to claim 1,
wherein the third conductive layer and the fourth conductive layer share one conductive layer.

5. The semiconductor device according to claim 1,
wherein the second conductive layer and the fourth conductive layer share one conductive layer.

6. A semiconductor device comprising:
a first transistor;
a second transistor; and
a first insulating layer,
wherein the first transistor comprises a first semiconductor layer, a second insulating layer, a first conductive layer, a second conductive layer, and a third conductive layer,
wherein the second transistor comprises a second semiconductor layer, a third insulating layer, a fourth conductive layer, a fifth conductive layer, and a sixth conductive layer,
wherein the first insulating layer comprises a region in contact with a side surface of the first semiconductor layer and a top surface of the sixth conductive layer,
wherein the first insulating layer comprises an opening reaching the first conductive layer,
wherein the first semiconductor layer is in direct contact with a top surface of the first conductive layer, an inner wall of the opening, and the second conductive layer,
wherein the second conductive layer is positioned over the first insulating layer,
wherein the third conductive layer is positioned over the first semiconductor layer and comprises a region overlapping with the inner wall of the opening with the second insulating layer positioned between the third conductive layer and the first semiconductor layer,
wherein the second semiconductor layer is positioned below the first insulating layer, and in contact with a side surface and a top surface of a side end portion of the fourth conductive layer and a side surface and a top surface of a side end portion of the fifth conductive layer, the side end portions facing each other,
wherein the sixth conductive layer is positioned over the second semiconductor layer with the third insulating layer positioned between the sixth conductive layer and the second semiconductor layer, and
wherein the first transistor is electrically connected to the second transistor.

7. The semiconductor device according to claim 6,
wherein the first semiconductor layer and the second semiconductor layer each comprise an oxide semiconductor.

8. The semiconductor device according to claim 6,
wherein the first conductive layer and the sixth conductive layer share one conductive layer.

9. The semiconductor device according to claim 6,
wherein the first conductive layer and the fourth conductive layer share one conductive layer.

10. The semiconductor device according to claim 2,
wherein the second conductive layer and the sixth conductive layer share one conductive layer.

11. The semiconductor device according to claim 2,
wherein the third conductive layer and the fourth conductive layer share one conductive layer.

12. The semiconductor device according to claim 2,
wherein the second conductive layer and the fourth conductive layer share one conductive layer.

13. The semiconductor device according to claim 7,
wherein the first conductive layer and the sixth conductive layer share one conductive layer.

14. The semiconductor device according to claim 7,
wherein the first conductive layer and the fourth conductive layer share one conductive layer.

15. A semiconductor device comprising:
a first transistor;
a second transistor; and
a first insulating layer,
a second insulating layer over the first insulating layer;
wherein the first transistor comprises a first semiconductor layer, a third insulating layer, a first conductive layer, a second conductive layer, and a third conductive layer, wherein the second transistor comprises a second semiconductor layer, the second insulating layer, and the second conductive layer, wherein the first insulating layer comprises a region in contact with a side surface of the first semiconductor layer and a first top surface of the first conductive layer, wherein the first insulating layer, the second insulating layer, and the second conductive layer comprise an opening reaching the first conductive layer, wherein the first semiconductor layer is in direct contact with a second top surface of the first conductive layer, an inner wall of the opening, and the second conductive layer, wherein the second conductive layer is positioned over the first insulating layer and the second insulating layer, wherein the third conductive layer is positioned over the first semiconductor layer and comprises a region overlapping with the inner wall of the opening with the third insulating layer positioned between the third conductive layer and the first semiconductor layer, wherein the second semiconductor layer is positioned over the first insulating layer, and wherein the second conductive layer is positioned over the second semiconductor layer with the second insulating layer positioned between the second conductive layer and the second semiconductor layer.

16. The semiconductor device according to claim 15, further comprising a fourth conductive layer and a fifth conductive layer in contact with the second semiconductor layer.

* * * * *